(12) United States Patent
Vellanki et al.

(10) Patent No.: US 12,203,168 B2
(45) Date of Patent: Jan. 21, 2025

(54) METAL DEPOSITION

(71) Applicant: Lam Research Corporation, Fremont, CA (US)

(72) Inventors: Ravi Vellanki, San Jose, CA (US); Eric H. Lenz, Livermore, CA (US); Vinayakaraddy Gulabal, Yadgir (IN); Sanjay Gopinath, Fremont, CA (US); Michal Danek, Cupertino, CA (US); Prodyut Majumder, Milpitas, CA (US); Novy Tjokro, Union City, CA (US); Yen-Chang Chen, Taipei (TW); Shruti Vivek Thombare, Sunnyvale, CA (US); Gorun Butail, Fremont, CA (US); Patrick A. van Cleemput, Duvall, WA (US)

(73) Assignee: Lam Research Corporation, Fremont, CA (US)

( * ) Notice: Subject to any disclaimer, the term of this patent is extended or adjusted under 35 U.S.C. 154(b) by 423 days.

(21) Appl. No.: 17/638,599

(22) PCT Filed: Aug. 19, 2020

(86) PCT No.: PCT/US2020/070434
§ 371 (c)(1),
(2) Date: Feb. 25, 2022

(87) PCT Pub. No.: WO2021/042114
PCT Pub. Date: Mar. 4, 2021

(65) Prior Publication Data
US 2022/0290300 A1    Sep. 15, 2022

Related U.S. Application Data

(60) Provisional application No. 62/892,935, filed on Aug. 28, 2019.

(51) Int. Cl.
C23C 16/455    (2006.01)
C23C 16/52    (2006.01)

(52) U.S. Cl.
CPC .. *C23C 16/45565* (2013.01); *C23C 16/45544* (2013.01); *C23C 16/45591* (2013.01); *C23C 16/52* (2013.01)

(58) Field of Classification Search
None
See application file for complete search history.

(56) References Cited

U.S. PATENT DOCUMENTS 3,215,508 A    11/1965    Piester
4,577,203 A    3/1986    Kawamura
(Continued)

FOREIGN PATENT DOCUMENTS

CN    1445822 A    10/2003
CN    1802722 A    7/2006
(Continued)

OTHER PUBLICATIONS

Chinese First Office Action dated Apr. 10, 2018 issued in Application No. CN 201610361563.2.
(Continued)

*Primary Examiner* — Jethro M. Pence
(74) *Attorney, Agent, or Firm* — Weaver Austin Villeneuve & Sampson LLP

(57) ABSTRACT

Various showerheads and methods are provided. A showerhead may include a faceplate partially defined by a front surface and a back surface, a back plate having a gas inlet, a first conical frustum surface, and a second conical frustum surface, a plenum volume fluidically connected to the gas inlet and at least partially defined by the gas inlet, the back surface of the faceplate, the first conical frustum surface, and the second conical frustum surface, and a baffle plate posi-
(Continued)

tioned within the plenum volume, and having a plurality of baffle plate through-holes extending through the baffle plate. The second conical frustum surface may be positioned radially outwards from the first conical frustum surface with respect to a center axis of the showerhead, and the second conical frustum surface may be positioned along the center axis farther from the gas inlet than the first conical frustum surface.

20 Claims, 24 Drawing Sheets

(56) References Cited

U.S. PATENT DOCUMENTS

| | | |
|---|---|---|
| 4,890,780 A | 1/1990 | Mimata et al. |
| 4,960,488 A | 10/1990 | Law et al. |
| 4,993,485 A | 2/1991 | Gorman |
| 5,106,453 A | 4/1992 | Benko et al. |
| 5,186,756 A | 2/1993 | Benko et al. |
| 5,212,116 A | 5/1993 | Yu |
| 5,232,508 A | 8/1993 | Arena et al. |
| 5,268,034 A | 12/1993 | Vukelic |
| 5,286,519 A | 2/1994 | Vukelic |
| 5,366,557 A | 11/1994 | Yu |
| 5,376,213 A | 12/1994 | Ueda et al. |
| 5,446,824 A | 8/1995 | Moslehi |
| 5,452,396 A | 9/1995 | Sopori |
| 5,453,124 A | 9/1995 | Moslehi et al. |
| 5,468,298 A | 11/1995 | Lei et al. |
| 5,502,005 A | 3/1996 | Mikagi |
| 5,581,874 A | 12/1996 | Aoki et al. |
| 5,589,002 A | 12/1996 | Su |
| 5,614,026 A | 3/1997 | Williams |
| 5,643,394 A | 7/1997 | Maydan et al. |
| 5,653,479 A | 8/1997 | Henderson |
| 5,670,218 A | 9/1997 | Baek |
| 5,741,363 A | 4/1998 | Van Buskirk et al. |
| 5,766,364 A | 6/1998 | Ishida et al. |
| 5,806,980 A | 9/1998 | Berrian |
| 5,834,068 A | 11/1998 | Chern et al. |
| 5,882,411 A | 3/1999 | Zhao et al. |
| 5,948,704 A | 9/1999 | Benjamin et al. |
| 5,950,925 A | 9/1999 | Fukunaga et al. |
| 5,958,140 A | 9/1999 | Arami et al. |
| 5,992,453 A | 11/1999 | Zimmer |
| 5,996,528 A | 12/1999 | Berrian et al. |
| 6,010,748 A | 1/2000 | Van Buskirk et al. |
| 6,022,413 A | 2/2000 | Shinozaki et al. |
| 6,022,586 A | 2/2000 | Hashimoto et al. |
| 6,025,013 A | 2/2000 | Heming et al. |
| 6,054,013 A | 4/2000 | Collins et al. |
| 6,059,885 A | 5/2000 | Ohashi et al. |
| 6,103,609 A | 8/2000 | Lee et al. |
| 6,112,697 A | 9/2000 | Sharan et al. |
| 6,190,732 B1 | 2/2001 | Omstead et al. |
| 6,205,869 B1 | 3/2001 | Schadt et al. |
| 6,237,528 B1 | 5/2001 | Szapucki et al. |
| 6,245,192 B1 | 6/2001 | Dhindsa et al. |
| 6,289,842 B1 | 9/2001 | Tompa |
| 6,302,965 B1 | 10/2001 | Umotoy et al. |
| 6,306,216 B1 | 10/2001 | Kim et al. |
| 6,359,160 B1 | 3/2002 | Sun et al. |
| 6,364,949 B1 | 4/2002 | Or et al. |
| 6,379,056 B1 | 4/2002 | Ueda |
| 6,415,736 B1 | 7/2002 | Hao et al. |
| 6,444,039 B1 | 9/2002 | Nguyen |
| 6,453,992 B1 | 9/2002 | Kim |
| 6,499,425 B1 | 12/2002 | Sandhu et al. |
| 6,537,420 B2 | 3/2003 | Rose |
| 6,565,661 B1 | 5/2003 | Nguyen |
| 6,616,767 B2 | 9/2003 | Zhao et al. |
| 6,635,117 B1 | 10/2003 | Kinnard et al. |
| 6,635,965 B1 | 10/2003 | Lee et al. |
| 6,716,287 B1 | 4/2004 | Santiago et al. |
| 6,793,733 B2 | 9/2004 | Janakiraman et al. |
| 6,821,347 B2 | 11/2004 | Carpenter et al. |
| 6,844,258 B1 | 1/2005 | Fair et al. |
| 6,883,733 B1 | 4/2005 | Lind |
| 6,921,556 B2 | 7/2005 | Shimizu et al. |
| 6,958,174 B1 | 10/2005 | Klaus et al. |
| 6,983,892 B2 | 1/2006 | Noorbakhsh et al. |
| 7,005,372 B2 | 2/2006 | Levy et al. |
| 7,141,494 B2 | 11/2006 | Lee et al. |
| 7,217,326 B2 | 5/2007 | Lee |
| 7,262,125 B2 | 8/2007 | Wongsenakhum et al. |
| 7,270,713 B2 * | 9/2007 | Blonigan ........ C23C 16/45591 |
| | | 156/345.43 |
| 7,296,534 B2 | 11/2007 | Fink |
| 7,387,685 B2 * | 6/2008 | Carpenter ........ C23C 16/45565 |
| | | 156/345.33 |
| 7,462,243 B2 * | 12/2008 | Laflamme, Jr .... H01L 21/67069 |
| | | 156/345.33 |
| D593,640 S | 6/2009 | Schoenherr et al. |
| 7,560,581 B2 | 7/2009 | Gordon et al. |
| 7,585,386 B2 | 9/2009 | Okumura et al. |
| 7,589,017 B2 | 9/2009 | Chan et al. |
| 7,682,946 B2 | 3/2010 | Ma et al. |
| 7,691,749 B2 | 4/2010 | Levy et al. |
| 7,712,434 B2 | 5/2010 | Dhindsa et al. |
| 7,737,035 B1 | 6/2010 | Lind et al. |
| 7,772,114 B2 | 8/2010 | Chan et al. |
| 7,850,779 B2 * | 12/2010 | Ma .................. C23C 16/45553 |
| | | 156/345.33 |
| 7,918,938 B2 | 4/2011 | Provencher et al. |
| 7,955,972 B2 | 6/2011 | Chan et al. |
| 7,993,457 B1 | 8/2011 | Krotov et al. |
| 8,053,365 B2 | 11/2011 | Humayun et al. |
| 8,058,170 B2 | 11/2011 | Chandrashekar et al. |
| 8,137,467 B2 | 3/2012 | Meinhold et al. |
| 8,187,679 B2 | 5/2012 | Dickey et al. |
| 8,278,216 B1 | 10/2012 | Alers et al. |
| 8,443,756 B2 | 5/2013 | Fischer et al. |
| 8,562,785 B2 | 10/2013 | Kang et al. |
| 8,673,080 B2 | 3/2014 | Meinhold et al. |
| 8,721,791 B2 * | 5/2014 | Tiner .................... B05B 1/005 |
| | | 156/345.33 |
| 8,728,956 B2 | 5/2014 | LaVoie et al. |
| 8,980,006 B2 | 3/2015 | Huh et al. |
| 9,017,481 B1 | 4/2015 | Pettinger et al. |
| 9,032,906 B2 * | 5/2015 | Ma .................... H01J 37/32522 |
| | | 118/724 |
| 9,034,142 B2 | 5/2015 | Bartlett et al. |
| 9,082,826 B2 | 7/2015 | Chandrashekar et al. |
| 9,121,097 B2 | 9/2015 | Mohn et al. |
| 9,144,147 B2 * | 9/2015 | Yang ................ H01J 37/32449 |
| 9,236,297 B2 | 1/2016 | Chen et al. |
| 9,314,854 B2 | 4/2016 | Huang et al. |
| 9,441,296 B2 | 9/2016 | Sabri et al. |
| 9,449,795 B2 | 9/2016 | Sabri et al. |
| 9,476,120 B2 | 10/2016 | Meinhold et al. |
| 9,502,218 B2 * | 11/2016 | Chen ................ H01J 37/32449 |
| 9,583,385 B2 | 2/2017 | Lee et al. |
| 9,595,470 B2 | 3/2017 | Bamnolker et al. |
| 9,613,818 B2 | 4/2017 | Ba et al. |
| 9,653,353 B2 | 5/2017 | Chandrashekar et al. |
| 9,741,545 B2 * | 8/2017 | Chen ...................... C23C 16/517 |
| 9,758,868 B1 | 9/2017 | Breiling et al. |
| 9,793,096 B2 | 10/2017 | Kang et al. |
| 9,892,908 B2 | 2/2018 | Pettinger et al. |
| 9,978,605 B2 | 5/2018 | Bamnolker et al. |
| 10,022,689 B2 | 7/2018 | Shareef et al. |
| 10,023,959 B2 | 7/2018 | Sung et al. |
| 10,056,233 B2 * | 8/2018 | Chen ................ H01L 21/67069 |
| 10,087,524 B2 * | 10/2018 | Tiner ................ C23C 16/45565 |
| 10,094,021 B2 | 10/2018 | Lansalot-Matras et al. |
| 10,121,671 B2 | 11/2018 | Fu et al. |
| 10,221,484 B2 | 3/2019 | Meinhold et al. |
| 10,253,412 B2 | 4/2019 | Thomas et al. |
| 10,266,947 B2 | 4/2019 | Madsen et al. |
| 10,283,404 B2 | 5/2019 | Na et al. |
| 10,358,722 B2 | 7/2019 | Wiltse et al. |
| 10,378,107 B2 | 8/2019 | Chandrasekharan et al. |

(56) References Cited

U.S. PATENT DOCUMENTS

| | | |
|---|---|---|
| 10,400,333 B2 | 9/2019 | Sabri et al. |
| 10,403,474 B2 | 9/2019 | Phillips et al. |
| 10,458,019 B2 * | 10/2019 | Wang ................. C23C 16/45572 |
| 10,494,717 B2 | 12/2019 | Sung et al. |
| 10,510,590 B2 | 12/2019 | Thombare et al. |
| 10,557,198 B2 * | 2/2020 | Lee .................. C23C 16/45565 |
| 10,573,522 B2 | 2/2020 | Jandl et al. |
| 10,584,415 B2 | 3/2020 | Meinhold et al. |
| 10,741,365 B2 | 8/2020 | Chandrasekharan et al. |
| 10,777,453 B2 | 9/2020 | Thombare et al. |
| 10,858,737 B2 * | 12/2020 | White ................ C23C 16/4401 |
| 10,975,467 B2 * | 4/2021 | She .................... C23C 16/4412 |
| 11,164,737 B2 * | 11/2021 | Hawrylchak ..... H01L 21/67109 |
| 11,276,585 B2 * | 3/2022 | Lee ........................... F16K 1/34 |
| 11,384,432 B2 * | 7/2022 | Rasheed ............. C23C 16/4412 |
| 11,715,667 B2 * | 8/2023 | Cui .................... H01L 21/4871 |
| | | 438/656 |
| 2001/0027026 A1 | 10/2001 | Dhindsa et al. |
| 2001/0035127 A1 | 11/2001 | Metzner et al. |
| 2002/0017243 A1 | 2/2002 | Pyo |
| 2002/0024140 A1 | 2/2002 | Nakajima et al. |
| 2002/0069969 A1 | 6/2002 | Rose |
| 2002/0123230 A1 | 9/2002 | Hubacek |
| 2002/0134507 A1 | 9/2002 | DeDontney et al. |
| 2002/0144783 A1 | 10/2002 | Tran et al. |
| 2002/0144785 A1 | 10/2002 | Srivastava et al. |
| 2002/0179012 A1 | 12/2002 | Takatsu et al. |
| 2003/0010452 A1 | 1/2003 | Park et al. |
| 2003/0019428 A1 | 1/2003 | Ku et al. |
| 2003/0051665 A1 | 3/2003 | Zhao et al. |
| 2003/0054099 A1 | 3/2003 | Jurgensen et al. |
| 2003/0066607 A1 | 4/2003 | White et al. |
| 2003/0082296 A1 | 5/2003 | Elers et al. |
| 2003/0106490 A1 | 6/2003 | Jallepally et al. |
| 2003/0168001 A1 | 9/2003 | Sneh |
| 2003/0170388 A1 | 9/2003 | Shinriki et al. |
| 2003/0194825 A1 | 10/2003 | Law et al. |
| 2003/0205328 A1 | 11/2003 | Kinnard et al. |
| 2003/0209193 A1 | 11/2003 | Van Wijck |
| 2004/0003777 A1 | 1/2004 | Carpenter et al. |
| 2004/0005731 A1 | 1/2004 | Jurgensen et al. |
| 2004/0023461 A1 | 2/2004 | Ahn et al. |
| 2004/0050325 A1 | 3/2004 | Samoilov et al. |
| 2004/0050326 A1 | 3/2004 | Thilderkvist et al. |
| 2004/0050496 A1 | 3/2004 | Iwai et al. |
| 2004/0134611 A1 | 7/2004 | Kato et al. |
| 2004/0149215 A1 | 8/2004 | Shao et al. |
| 2004/0200412 A1 | 10/2004 | Frijlink |
| 2004/0200413 A1 | 10/2004 | Lee |
| 2004/0202786 A1 | 10/2004 | Wongsenakhum et al. |
| 2004/0216665 A1 | 11/2004 | Soininen et al. |
| 2004/0231799 A1 | 11/2004 | Lee et al. |
| 2004/0235299 A1 | 11/2004 | Srivastava et al. |
| 2004/0238123 A1 | 12/2004 | Becknell et al. |
| 2005/0000423 A1 | 1/2005 | Kasai et al. |
| 2005/0000442 A1 | 1/2005 | Hayashi et al. |
| 2005/0011447 A1 | 1/2005 | Fink |
| 2005/0017100 A1 | 1/2005 | Watanabe et al. |
| 2005/0022739 A1 * | 2/2005 | Carpenter ......... C23C 16/45565 |
| | | 427/248.1 |
| 2005/0022748 A1 | 2/2005 | Gabriel et al. |
| 2005/0031786 A1 | 2/2005 | Lee et al. |
| 2005/0145338 A1 | 7/2005 | Park et al. |
| 2005/0173404 A1 | 8/2005 | Benjamin et al. |
| 2005/0173569 A1 | 8/2005 | Noorbakhsh et al. |
| 2005/0181617 A1 | 8/2005 | Bosch |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0241765 A1 | 11/2005 | Dhindsa et al. |
| 2005/0241766 A1 | 11/2005 | Dhindsa et al. |
| 2005/0242061 A1 | 11/2005 | Fukuda |
| 2005/0277296 A1 | 12/2005 | Adetutu et al. |
| 2005/0282384 A1 | 12/2005 | Nawafune et al. |
| 2005/0284372 A1 | 12/2005 | Murugesh et al. |
| 2006/0005767 A1 | 1/2006 | Tsai et al. |
| 2006/0046470 A1 | 3/2006 | Becknell et al. |
| 2006/0046521 A1 | 3/2006 | Vaartstra et al. |
| 2006/0102950 A1 | 5/2006 | Takebuchi et al. |
| 2006/0112876 A1 | 6/2006 | Choi et al. |
| 2006/0137607 A1 | 6/2006 | Seo et al. |
| 2007/0044716 A1 | 3/2007 | Tetsuka et al. |
| 2007/0066060 A1 | 3/2007 | Wang |
| 2007/0077712 A1 | 4/2007 | Joo et al. |
| 2007/0116872 A1 | 5/2007 | Li et al. |
| 2007/0116873 A1 | 5/2007 | Li et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0145021 A1 | 6/2007 | Wang et al. |
| 2007/0157683 A1 | 7/2007 | Li |
| 2007/0212484 A1 | 9/2007 | Li |
| 2007/0246163 A1 | 10/2007 | Paterson et al. |
| 2007/0248515 A1 | 10/2007 | Tompa et al. |
| 2007/0275569 A1 | 11/2007 | Moghadam et al. |
| 2007/0286967 A1 | 12/2007 | Ide et al. |
| 2008/0006208 A1 | 1/2008 | Ueno et al. |
| 2008/0014352 A1 | 1/2008 | Xi et al. |
| 2008/0016684 A1 | 1/2008 | Olechnowicz et al. |
| 2008/0053614 A1 | 3/2008 | Sago et al. |
| 2008/0081124 A1 | 4/2008 | Sano et al. |
| 2008/0085226 A1 | 4/2008 | Fondurulia et al. |
| 2008/0093341 A1 | 4/2008 | Turlot et al. |
| 2008/0099145 A1 | 5/2008 | Keller |
| 2008/0124926 A1 | 5/2008 | Chan et al. |
| 2008/0141941 A1 | 6/2008 | Augustino et al. |
| 2008/0227291 A1 | 9/2008 | Lai et al. |
| 2008/0241379 A1 | 10/2008 | Suzuki et al. |
| 2008/0241517 A1 | 10/2008 | Kenworthy et al. |
| 2008/0242085 A1 | 10/2008 | Fischer et al. |
| 2008/0254623 A1 | 10/2008 | Chan et al. |
| 2008/0268642 A1 | 10/2008 | Yanagita et al. |
| 2008/0308228 A1 | 12/2008 | Stevenson et al. |
| 2008/0317972 A1 | 12/2008 | Hendriks et al. |
| 2009/0000743 A1 | 1/2009 | Iizuka |
| 2009/0004848 A1 | 1/2009 | Kim et al. |
| 2009/0017227 A1 | 1/2009 | Fu et al. |
| 2009/0053893 A1 | 2/2009 | Khandelwal et al. |
| 2009/0081878 A1 | 3/2009 | Dhindsa |
| 2009/0095218 A1 | 4/2009 | Meinhold et al. |
| 2009/0095219 A1 | 4/2009 | Meinhold et al. |
| 2009/0095220 A1 | 4/2009 | Meinhold et al. |
| 2009/0095621 A1 | 4/2009 | Kao et al. |
| 2009/0211085 A1 | 8/2009 | Kennedy et al. |
| 2009/0239368 A1 | 9/2009 | Park et al. |
| 2009/0260571 A1 | 10/2009 | Ostrowski et al. |
| 2009/0305509 A1 | 12/2009 | Stevenson et al. |
| 2010/0107927 A1 | 5/2010 | Stewart et al. |
| 2010/0163187 A1 | 7/2010 | Yokogawa et al. |
| 2010/0167527 A1 | 7/2010 | Wu et al. |
| 2010/0167551 A1 | 7/2010 | DeDontney |
| 2010/0184298 A1 | 7/2010 | Dhindsa |
| 2010/0206376 A1 | 8/2010 | You et al. |
| 2010/0213541 A1 | 8/2010 | Jeon et al. |
| 2010/0230387 A1 | 9/2010 | Okesaku et al. |
| 2010/0261354 A1 | 10/2010 | Bettencourt et al. |
| 2010/0263588 A1 | 10/2010 | Zhiyin |
| 2010/0272895 A1 | 10/2010 | Tsuda |
| 2010/0276084 A1 | 11/2010 | Yao |
| 2010/0279008 A1 | 11/2010 | Takagi |
| 2010/0288439 A1 | 11/2010 | Ishibashi et al. |
| 2010/0320607 A1 | 12/2010 | Suzuki |
| 2011/0011338 A1 | 1/2011 | Chuc et al. |
| 2011/0020546 A1 | 1/2011 | Hamalainen et al. |
| 2011/0021024 A1 | 1/2011 | Calvo-Munoz et al. |
| 2011/0048642 A1 | 3/2011 | Mihara et al. |
| 2011/0052833 A1 | 3/2011 | Hanawa et al. |
| 2011/0076401 A1 | 3/2011 | Chao et al. |
| 2011/0146571 A1 | 6/2011 | Bartlett et al. |
| 2011/0159690 A1 | 6/2011 | Chandrashekar et al. |
| 2011/0256645 A1 | 10/2011 | Tam et al. |
| 2011/0256726 A1 | 10/2011 | LaVoie et al. |

(56) References Cited

U.S. PATENT DOCUMENTS

| | | |
|---|---|---|
| 2011/0287184 A1 | 11/2011 | Shenai-Khatkhate et al. |
| 2011/0300716 A1 | 12/2011 | Park et al. |
| 2012/0045589 A1 | 2/2012 | Ivanov et al. |
| 2012/0077349 A1 | 3/2012 | Li et al. |
| 2012/0090691 A1 | 4/2012 | Baluja et al. |
| 2012/0156877 A1 | 6/2012 | Yap et al. |
| 2012/0156880 A1 | 6/2012 | Panagopoulos |
| 2012/0174866 A1 | 7/2012 | Huh et al. |
| 2012/0187305 A1 | 7/2012 | Elam et al. |
| 2012/0222815 A1 | 9/2012 | Sabri et al. |
| 2012/0227665 A1 | 9/2012 | Ozgun et al. |
| 2012/0264051 A1 | 10/2012 | Angelov et al. |
| 2012/0269968 A1 | 10/2012 | Rayner, Jr. |
| 2012/0305190 A1 | 12/2012 | Kang et al. |
| 2012/0309204 A1 | 12/2012 | Kang et al. |
| 2013/0034967 A1 | 2/2013 | Bettencourt et al. |
| 2013/0220975 A1 | 8/2013 | Dhindsa |
| 2013/0299605 A1 | 11/2013 | Ehrlich et al. |
| 2013/0302980 A1 | 11/2013 | Chandrashekar et al. |
| 2013/0306758 A1 | 11/2013 | Park et al. |
| 2013/0341433 A1 | 12/2013 | Roy et al. |
| 2014/0061324 A1 | 3/2014 | Mohn et al. |
| 2014/0090599 A1 | 4/2014 | Saitou |
| 2014/0097270 A1 | 4/2014 | Liang et al. |
| 2014/0103145 A1 | 4/2014 | White et al. |
| 2014/0103806 A1 | 4/2014 | Kellogg et al. |
| 2014/0106083 A1 | 4/2014 | Wu et al. |
| 2014/0147589 A1 | 5/2014 | Khandelwal et al. |
| 2014/0158792 A1 | 6/2014 | Meinhold et al. |
| 2014/0179114 A1 | 6/2014 | Van Schravendijk |
| 2014/0235069 A1 | 8/2014 | Breiling et al. |
| 2014/0238608 A1 | 8/2014 | Sabri et al. |
| 2014/0299681 A1 | 10/2014 | Kashyap et al. |
| 2014/0306027 A1 | 10/2014 | Xu et al. |
| 2015/0004798 A1 | 1/2015 | Chandrasekharan et al. |
| 2015/0007770 A1 | 1/2015 | Chandrasekharan et al. |
| 2015/0011095 A1 | 1/2015 | Chandrasekharan et al. |
| 2015/0011096 A1 | 1/2015 | Chandrasekharan et al. |
| 2015/0179461 A1 | 6/2015 | Bamnolker et al. |
| 2015/0187568 A1 | 7/2015 | Pettinger et al. |
| 2015/0214009 A1* | 7/2015 | Glukhoy ......... H01J 37/32091 239/132.3 |
| 2015/0218701 A1 | 8/2015 | Bartlett et al. |
| 2015/0240361 A1 | 8/2015 | Madrigal et al. |
| 2015/0315706 A1 | 11/2015 | Chandrasekharan et al. |
| 2015/0348840 A1 | 12/2015 | Bamnolker et al. |
| 2015/0354064 A1 | 12/2015 | Kolics et al. |
| 2015/0377481 A1 | 12/2015 | Smith et al. |
| 2016/0040289 A1 | 2/2016 | Gatineau et al. |
| 2016/0077435 A1 | 3/2016 | Ban et al. |
| 2016/0079036 A1 | 3/2016 | Kang et al. |
| 2016/0109800 A1 | 4/2016 | Bae et al. |
| 2016/0118345 A1 | 4/2016 | Chen et al. |
| 2016/0172211 A1 | 6/2016 | Demos et al. |
| 2016/0181272 A1 | 6/2016 | Rabkin et al. |
| 2016/0296981 A1 | 10/2016 | Baluja et al. |
| 2016/0340782 A1 | 11/2016 | Chandrasekharan et al. |
| 2016/0343595 A1 | 11/2016 | Lind et al. |
| 2016/0348242 A1 | 12/2016 | Sung et al. |
| 2016/0348244 A1 | 12/2016 | Sabri et al. |
| 2016/0351444 A1 | 12/2016 | Schloss et al. |
| 2017/0009344 A1 | 1/2017 | Meinhold et al. |
| 2017/0021317 A1 | 1/2017 | Shareef et al. |
| 2017/0062224 A1 | 3/2017 | Fu et al. |
| 2017/0069527 A1 | 3/2017 | Haukka et al. |
| 2017/0117155 A1 | 4/2017 | Bamnolker et al. |
| 2017/0125548 A1 | 5/2017 | Hung et al. |
| 2017/0167024 A1 | 6/2017 | Wiltse et al. |
| 2017/0229341 A1 | 8/2017 | Chang et al. |
| 2017/0260627 A1 | 9/2017 | Breiling et al. |
| 2017/0268107 A1 | 9/2017 | Lansalot-Matras et al. |
| 2017/0301515 A1 | 10/2017 | Madsen et al. |
| 2018/0012733 A1 | 1/2018 | Phillips et al. |
| 2018/0019165 A1 | 1/2018 | Baum et al. |
| 2018/0053660 A1 | 2/2018 | Jandl et al. |
| 2018/0057940 A1 | 3/2018 | Madsen et al. |
| 2018/0068833 A1 | 3/2018 | Kang et al. |
| 2018/0130652 A1 | 5/2018 | Pettinger et al. |
| 2018/0142345 A1 | 5/2018 | Meng et al. |
| 2018/0142352 A1 | 5/2018 | Shah et al. |
| 2018/0197758 A1 | 7/2018 | Parkhe |
| 2018/0261503 A1 | 9/2018 | Meng et al. |
| 2018/0294144 A1* | 10/2018 | Aubuchon ......... C23C 16/5096 |
| 2018/0294187 A1 | 10/2018 | Thombare et al. |
| 2018/0340256 A1 | 11/2018 | Sung et al. |
| 2018/0355484 A1 | 12/2018 | Lansalot-Matras et al. |
| 2019/0003050 A1 | 1/2019 | Dezelah et al. |
| 2019/0019725 A1 | 1/2019 | Chandrashekar et al. |
| 2019/0067003 A1 | 2/2019 | Zope et al. |
| 2019/0067094 A1 | 2/2019 | Zope et al. |
| 2019/0161853 A1 | 5/2019 | Aoyama et al. |
| 2019/0211451 A1 | 7/2019 | Madsen et al. |
| 2019/0256467 A1 | 8/2019 | Anthis et al. |
| 2019/0256977 A1 | 8/2019 | Meinhold et al. |
| 2019/0352777 A1 | 11/2019 | Shankar et al. |
| 2020/0075403 A1 | 3/2020 | Thombare et al. |
| 2020/0087789 A1 | 3/2020 | Mustafa et al. |
| 2020/0144066 A1 | 5/2020 | Jandl et al. |
| 2020/0312638 A1 | 10/2020 | Leonard, III et al. |
| 2020/0365456 A1 | 11/2020 | Thombare et al. |
| 2020/0402846 A1 | 12/2020 | Collins et al. |
| 2021/0214846 A1* | 7/2021 | Nandwana ......... C23C 16/4583 |
| 2021/0238736 A1 | 8/2021 | Butail et al. |
| 2021/0265134 A1 | 8/2021 | Singh et al. |
| 2021/0404064 A1 | 12/2021 | Dip |
| 2022/0013365 A1 | 1/2022 | Van Cleemput et al. |
| 2022/0051873 A1 | 2/2022 | Kim et al. |
| 2022/0282377 A1 | 9/2022 | Luo et al. |
| 2022/0316066 A1* | 10/2022 | Santiago ......... H01L 21/67259 |
| 2023/0008986 A1* | 1/2023 | Iyengar ......... C23C 16/4412 |
| 2023/0044064 A1 | 2/2023 | Luo et al. |
| 2023/0268179 A1* | 8/2023 | Tomczak ......... C23C 16/45536 438/694 |
| 2023/0374660 A1* | 11/2023 | Singh ......... C23C 16/06 |
| 2024/0222115 A1* | 7/2024 | Niskanen ......... H01L 21/02521 |

FOREIGN PATENT DOCUMENTS

| | | |
|---|---|---|
| CN | 2893917 Y | 4/2007 |
| CN | 101003895 A | 7/2007 |
| CN | 101101887 A | 1/2008 |
| CN | 100487857 C | 5/2009 |
| CN | 101448977 A | 6/2009 |
| CN | 201343570 Y | 11/2009 |
| CN | 101755325 A | 6/2010 |
| CN | 101916715 A | 12/2010 |
| CN | 102102194 A | 6/2011 |
| CN | 102132383 A | 7/2011 |
| CN | 202025711 U | 11/2011 |
| CN | 103403843 A | 11/2013 |
| CN | 103521956 A | 1/2014 |
| CN | 103890911 A | 6/2014 |
| CN | 104278254 A | 1/2015 |
| CN | 106167895 A | 11/2016 |
| CN | 106191814 B | 10/2018 |
| CN | 109983566 A | 7/2019 |
| EP | 0462730 A1 | 12/1991 |
| EP | 1568797 A2 | 8/2005 |
| EP | 1728894 A1 | 12/2006 |
| JP | S6187319 A | 5/1986 |
| JP | H0745542 A | 2/1995 |
| JP | H07240404 A | 9/1995 |
| JP | H1050678 A | 2/1998 |
| JP | 2000183029 A | 6/2000 |
| JP | 2000290777 A | 10/2000 |
| JP | 2001185491 A | 7/2001 |
| JP | 2001284360 A | 10/2001 |
| JP | 2001525495 A | 12/2001 |
| JP | 2002033311 A | 1/2002 |
| JP | 2002503765 A | 2/2002 |
| JP | 2002069650 A | 3/2002 |
| JP | 2003504842 A | 2/2003 |
| JP | 2003203908 A | 7/2003 |
| JP | 2004115837 A | 4/2004 |

(56) References Cited

FOREIGN PATENT DOCUMENTS

| | | |
|---|---|---|
| JP | 2004356587 A | 12/2004 |
| JP | 2005150416 A | 6/2005 |
| JP | 2007059567 A | 3/2007 |
| JP | 2008047869 A | 2/2008 |
| JP | 2008205219 A | 9/2008 |
| JP | 2008211183 A | 9/2008 |
| JP | 2009004713 A | 1/2009 |
| JP | 2010150575 A | 7/2010 |
| JP | 2010153680 A | 7/2010 |
| JP | 5468735 B2 | 4/2014 |
| JP | 2014070249 A | 4/2014 |
| JP | 2014074190 A | 4/2014 |
| JP | 2014509783 A | 4/2014 |
| JP | 2014078685 A | 5/2014 |
| JP | 2014143101 A | 8/2014 |
| JP | 2015002349 A | 1/2015 |
| JP | 2016098406 A | 5/2016 |
| JP | 2016219803 A | 12/2016 |
| KR | 20000071576 A | 11/2000 |
| KR | 20010098812 A | 11/2001 |
| KR | 100319468 B1 | 4/2002 |
| KR | 20060017806 A | 2/2006 |
| KR | 100587628 B1 | 6/2006 |
| KR | 20060100961 A | 9/2006 |
| KR | 100667714 B1 | 1/2007 |
| KR | 20070002218 A | 1/2007 |
| KR | 20090003703 U | 4/2009 |
| KR | 20090041488 A | 4/2009 |
| KR | 20100058446 A | 6/2010 |
| KR | 20100093347 A | 8/2010 |
| KR | 20100134215 A | 12/2010 |
| KR | 20110028989 A | 3/2011 |
| KR | 200454281 Y1 | 6/2011 |
| KR | 20110138730 A | 12/2011 |
| KR | 20110139079 A | 12/2011 |
| KR | 20140000653 A | 1/2014 |
| KR | 20140011364 A | 1/2014 |
| KR | 20140038902 A | 3/2014 |
| KR | 20140042699 A | 4/2014 |
| KR | 20140145095 A | 12/2014 |
| KR | 20150063562 A | 6/2015 |
| KR | 20150108780 A | 9/2015 |
| KR | 20160098986 A | 8/2016 |
| KR | 101745074 B1 | 6/2017 |
| KR | 20200060579 A | 6/2020 |
| KR | 102333103 B1 | 11/2021 |
| KR | 102357417 B1 | 1/2022 |
| KR | 20220049926 A | 4/2022 |
| SG | 152163 A1 | 5/2009 |
| TW | 300319 B | 3/1997 |
| TW | 200610033 A | 3/2006 |
| TW | 200902751 A | 1/2009 |
| TW | 200923126 A | 6/2009 |
| TW | 200924049 A | 6/2009 |
| TW | M361710 U | 7/2009 |
| TW | 201411761 A | 3/2014 |
| TW | 201502310 A | 1/2015 |
| TW | 201509537 A | 3/2015 |
| WO | WO-0042236 A2 | 7/2000 |
| WO | WO-2004107413 A2 | 12/2004 |
| WO | WO-2005103323 A1 | 11/2005 |
| WO | WO-2006022997 A2 | 3/2006 |
| WO | WO-2006036865 A2 | 4/2006 |
| WO | WO-2007060143 A1 | 5/2007 |
| WO | WO-2007142690 A2 | 12/2007 |
| WO | WO-2008042032 A1 | 4/2008 |
| WO | WO-2009055244 A1 | 4/2009 |
| WO | WO-2009089794 A1 | 7/2009 |
| WO | WO-2012047591 A1 | 4/2012 |
| WO | WO-2012122054 A2 | 9/2012 |
| WO | WO-2012166362 A1 | 12/2012 |
| WO | WO-2015023404 A1 | 2/2015 |
| WO | WO-2016191432 A1 | 12/2016 |
| WO | WO-2018191183 A1 | 10/2018 |
| WO | WO-2019022978 A1 | 1/2019 |
| WO | WO-2020028587 A1 | 2/2020 |
| WO | WO-2020159708 A1 | 8/2020 |
| WO | WO-2021127287 A1 | 6/2021 |
| WO | WO-2022060615 A1 | 3/2022 |

OTHER PUBLICATIONS

Chinese First Office Action, dated Apr. 19, 2017, issued in Application No. CN 201510221479.6.
Chinese First Office Action dated Jan. 4, 2021 issued in Application No. CN 201710700258.6.
Chinese First Office Action dated Jun. 18, 2020 issued in Application No. CN 201811101686.8.
Chinese First Office Action, dated May 17, 2018, issued in Application No. CN 201610345779.X.
Chinese Office Action, dated May 12, 2009, issued in Application No. CN 200820135478.5.
Chinese Second Office Action dated Apr. 10, 2019, issued in Application No. CN 201610345779.X.
Chinese Second Office Action, dated Aug. 29, 2014, issued in Application No. CN 201010602102.2.
Chinese Second Office Action dated Feb. 22, 2021 issued in Application No. CN 201811101806.8.
Chinese Second Office Action dated Jun. 17, 2021 issued in Application No. CN 201710700258.6.
Chinese Second Office Action, dated Nov. 16, 2017, issued in Application No. CN 201510221479.6.
Chinese Third Office Action dated Aug. 2, 2021 issued in Application No. CN 201811101686.8.
Chinese Third Office Action, dated May 15, 2018, issued in Application No. CN 201510221479.6.
Chiu, H. et al., "Deposition of Molybdenum Carbonitride Thin Films from Mo(NBu$^t$)$_2$(NHBu$^t$)$_2$", J. Mater. Res, Jul. 1994, vol. 9, No. 7, pp. 1622-1624.
Co-pending U.S. Appl. No. 17/589,416, filed Jan. 31, 2022.
Co-pending U.S. pending U.S. Appl. No. 17/763,529, filed Mar. 24, 2022.
Final Office Action dated May 23, 2019 issued in U.S. Appl. No. 15/948,143.
Final Office Action dated Sep. 2, 2021 issued in U.S. Appl. No. 16/947,286.
International Preliminary Report on Patentability dated Mar. 10, 2022, in Application No. PCT/US2020/070434.
International Preliminary Report on Patentability dated Mar. 3, 2022, in Application No. PCT/US2020/070390.
International Preliminary Report on Patentability dated Mar. 3, 2022, in Application No. PCT/US2020/070437.
International Search Report and Written Opinion dated Feb. 3, 2021, in Application No. PCT/US2020/055596.
International Preliminary Report on Patentability dated Aug. 12, 2021, issued in Application No. PCT/US2020/015241.
International Preliminary Report on Patentability dated Feb. 4, 2021 in Application No. PCT/US2019/043514.
International Preliminary Report on Patentability dated Jun. 3, 2021 in Application No. PCT/US2019/062067.
International Preliminary Report on Patentability dated Jun. 4, 2020 in Application No. PCT/US2018/061803.
International Preliminary Report on Patentability dated Mar. 17, 2022 in PCT Application No. PCT/US2020/048951.
International Preliminary Report on Patentability dated Nov. 12, 2020 in Application No. PCT/US2019/030712.
International Preliminary Report on Patentability dated Oct. 24, 2019 in Application No. PCT/US2018/026746.
International Preliminary Report on Patentability dated Sep. 23, 2021 issued in Application No. PCT/US2020/021543.
International Search Report and Written Opinion dated Aug. 19, 2019 in Application No. PCT/US2019/030712.
International Search Report and Written Opinion dated Dec. 4, 2020, in PCT Application No. PCT/US2020/048951.
International Search Report and Written Opinion dated Dec. 15, 2020, in Application No. PCT/US2020/070437.

(56) References Cited

OTHER PUBLICATIONS

International Search Report and Written Opinion dated Feb. 4, 2021, in PCT Application No. PCT/US2020/070390.
International Search Report and Written Opinion dated Jul. 1, 2020 in Application No. PCT/US2020/021543.
International Search Report and Written Opinion dated Jul. 27, 2018 in Application No. PCT/US2018/026746.
International Search Report and Written Opinion dated Jun. 3, 2020, issued in Application No. PCT/US2020/015241.
International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Japanese First Office Action, dated Aug. 18, 2020, issued in Application No. JP 2016-098409.
Japanese Office Action, dated Mar. 19, 2019, issued in Application No. JP 2015-090931.
Johnson, R.W., Hultqvist, A., Bent, S.F., "A brief review of atomic layer deposition: from fundamentals to applications", Materials today, (Jun. 1, 2014), 17(5):236-46.
JP Office Action dated Apr. 19, 2022 in Application No. JP20200504286 with English translation.
Korean Decision for Grant dated Aug. 25, 2021, issued in Application No. KR 10-2015-0062683.
Korean Decision for Grant dated Oct. 25, 2021, issued in Application No. KR 10-2016-0061452.
Korean First Office Action dated Apr. 26, 2021, issued in Application No. KR 10-2016-0061452.
Korean First Office Action, dated Dec. 12, 2016, issued in Application No. KR 2010-0129965.
Korean First Office Action, dated Mar. 21, 2021, issued in Application No. KR 10-2015-0062683.
Korean Office Action, dated Dec. 31, 2010, issued in Application No. KR 2008-0013796.
Korean Second Office Action dated Aug. 25, 2021, issued in Application No. KR 10-2016-0061452.
KR Office Action dated Feb. 7, 2022, in Application No. KR1020210164496 with English translation.
KR Office Action dated Feb. 21, 2022, in Application No. KR10-2017-0102113 with English Translation.
Kurek et al. "Recent advances using guanidinate ligands for chemical vapour deposition (CVD) and atomic layer deposition (ALD) applications," Australian Journal of Chemistry, vol. 67, Jun. 2014, pp. 989-996.
Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.
Majumder et al. "Investigation on the diffusion barrier properties of sputtered Mo/W—N thin films in Cu interconnects," Applied Physics Letters, vol. 91 (2007), pp. 162108-1-162108-3.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Novellus, XL*, High Vacuum Angle Valve, Air Operated, Lam Research, DOC-3076a, Document Control Released Oct. 25, 2012, 5 pages.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Otsuka et al. A novel molybdenum thiolato compound, tetrakis(tertbutylthiolato molybdenum(IV),preparation and crystal and molecular structure Journal of American chemistry society, 1981, pp. 3011-3014.
PCT International Preliminary Report on Patentability and Written Opinion dated Apr. 7, 2009, issued in PCT/US2007/015979.
PCT International Report on Patentability dated Sep. 19, 2013 issued in PCT/US2012/027596.
PCT International Search Report and Written Opinion dated Jan. 10, 2008, issued in PCT/US2007/015979.
PCT International Search Report and Written Opinion dated Sep. 27, 2012 issued in PCT/US2012/027596.
Ranade, P. et al., "Work Function Engineering of Molybdenum Gate Electrodes by Nitrogen Implantation", Electrochemical and Solid-State Letters, 2001, vol. 4, No. 11, pp. G85-G87.
SG Search and Examination Report, dated May 3, 2010, issued in Application No. SG 2008/07575-6.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
Singapore Notice of Eligibility for Grant dated Jan. 20, 2021, issued in SG 10201604054P.
Singapore Search and Examination Report, dated Mar. 5, 2012, issued in Application No. SG 201009408-4.
Specification of U.S. Appl. No. 62/425,704 (Electronically filed Nov. 23, 2016).
Taiwan First Office Action dated Feb. 27, 2019, issued in Application No. TW 104114093.
Taiwan Office Action, dated Mar. 26, 2015, issued in Application No. TW 099144608.
Taiwan Office Action, dated May 17, 2016, issued in Application No. TW104138639.
Taiwanese First Office Action dated Aug. 7, 2019 issued in Application No. TW 105116200.
Taiwanese Notice of Allowance dated Aug. 21, 2020, issued in TW 105115413.
TW Office Action dated Oct. 18, 2021, in application No. TW107112210 with English translation.
U.S. Applicant Initiated Interview Summary, dated Nov. 1, 2017, issued in U.S. Appl. No. 14/668,511.
U.S. Corrected Notice of Allowance dated Feb. 16, 2022, in U.S. Appl. No. 16/724,231.
U.S. Examiner's Answer, dated Dec. 21, 2011, issued in U.S. Appl. No. 12/181,927.
U.S. Final Office Action, dated Apr. 8, 2013, issued in U.S. Appl. No. 12/642,497.
U.S. Final Office Action, dated Feb. 7, 2018, issued in U.S. Appl. No. 14/668,511.

(56) References Cited

OTHER PUBLICATIONS

U.S. Final Office Action, dated Jan. 30, 2012, issued in U.S. Appl. No. 12/148,267.
U.S. Final Office Action dated Jan. 31, 2022 in U.S. Appl. No. 16/764,812.
U.S. Final Office Action, dated Jul. 20, 2017, issued in U.S. Appl. No. 14/687,134.
US Final Office Action, dated Jul. 21, 2011, issued in U.S. Appl. No. 11/542,959.
US Final Office Action, dated Mar. 21, 2011, issued in U.S. Appl. No. 11/974,945.
US Final Office Action, dated Mar. 21, 2011, issued in U.S. Appl. No. 11/974,966.
U.S. Final Office Action, dated Mar. 28, 2011, issued in U.S. Appl. No. 12/181,927.
US Final Office Action dated Mar. 29, 2021 issued in U.S. Appl. No. 16/724,231.
U.S. Final Office Action dated May 18, 2018, issued in U.S. Appl. No. 14/716,823.
U.S. Final Office Action, dated Nov. 6, 2013, issued in U.S. Appl. No. 12/642,497.
U.S. Final Office Action dated Oct. 18, 2018 issued in U.S. Appl. No. 14/850,816.
US Final Office Action, dated Oct. 28, 2010, issued in U.S. Appl. No. 11/542,959.
U.S. Miscellaneous Communication, dated Jul. 11, 2016, issued in U.S. Appl. No. 14/169,325.
U.S. Non Final Office Action dated Mar. 21, 2022, in U.S. Appl. No. 17/250,452.
U.S. Non-Final Office Action dated Dec. 15, 2021 in U.S. Appl. No. 17/250,014.
U.S. Non-Final Office Action dated Nov. 19, 2021, in U.S. Appl. No. 17/250,452.
U.S. Notice of Allowance dated Apr. 13, 2020 issued in U.S. Appl. No. 14/668,511.
U.S. Notice of Allowance dated Feb. 2, 2022 in U.S. Appl. No. 16/724,231.
U.S. Notice of Allowance, dated Jan. 15, 2015, issued in U.S. Appl. No. 12/642,497.
U.S. Notice of Allowance, dated Jan. 6, 2012, issued in U.S. Appl. No. 11/974,966.
US Notice of Allowance dated Jul. 30, 2019 issued in U.S. Appl. No. 16/035,491.
U.S. Notice of Allowance dated Jun. 18, 2019 issued in U.S. Appl. No. 14/668,511.
U.S. Notice of Allowance, dated Jun. 22, 2016, issued in U.S. Appl. No. 14/169,325.
U.S. Notice of Allowance dated Mar. 21, 2019 issued in U.S. Appl. No. 14/850,816.
US Notice of allowance dated Mar. 22, 2019 issued in U.S. Appl. No. 16/035,491.
US Notice of Allowance dated Mar. 8, 2018, issued in U.S. Appl. No. 15/163,594.
U.S. Notice of Allowance dated Oct. 15, 2019, issued in U.S. Appl. No. 16/291,822.
U.S. Notice of Allowance dated Oct. 19, 2018, issued in U.S. Appl. No. 15/275,060.
U.S. Notice of Allowance, dated Oct. 25, 2013, issued in U.S. Appl. No. 12/181,927.
US Notice of allowance dated Sep. 29, 2021 issued in U.S. Appl. No. 16/724,231.
US Office Action, dated Apr. 21, 2010, issued in U.S. Appl. No. 11/542,959.
U.S. Office Action, dated Apr. 4, 2018, issued in U.S. Appl. No. 14/850,816.
U.S. Office Action, dated Aug. 17, 2011, issued in U.S. Appl. No. 12/148,267.
US Office Action, dated Feb. 16, 2011, issued in U.S. Appl. No. 11/542,959.
U.S. Office Action, dated Jul. 12, 2013, issued in U.S. Appl. No. 12/642,497.
U.S. Office Action, dated Jul. 27, 2017, issued in U.S. Appl. No. 14/668,511.
U.S. Office Action dated Jun. 15, 2018, issued in U.S. Appl. No. 15/275,060.
U.S. Office Action, dated Mar. 11, 2016, issued in U.S. Appl. No. 14/169,325.
U.S. Office Action, dated May 3, 2017, issued in U.S. Appl. No. 14/687,134.
US Office Action dated Nov. 28, 2018, issued in U.S. Appl. No. 16/035,491.
U.S. Office Action dated Nov. 29, 2018 issued in U.S. Appl. No. 14/668,511.
U.S. Office Action, dated Nov. 8, 2012, issued in U.S. Appl. No. 12/642,497.
U.S. Office Action dated Oct. 3, 2019 issued in U.S. Appl. No. 14/668,511.
U.S. Office Action, dated Sep. 14, 2017, issued in U.S. Appl. No. 14/716,823.
U.S. Office Action, dated Sep. 17, 2010, issued in U.S. Appl. No. 11/974,945.
U.S. Office Action, dated Sep. 17, 2010, issued in U.S. Appl. No. 11/974,966.
U.S. Office Action, dated Sep. 17, 2010, issued in U.S. Appl. No. 12/181,927.
U.S. Office Action, dated Sep. 2, 2011, issued in U.S. Appl. No. 11/974,966.
US Office Action dated Sep. 22, 2020 issued in U.S. Appl. No. 16/724,231.
U.S. Office Action, dated Sep. 24, 2014, issued in U.S. Appl. No. 12/642,497.
U.S. Office Action Interview Summary dated Jul. 18, 2018, issued in U.S. Appl. No. 14/716,823.
U.S. Office Action Interview Summary, dated May 23, 2018, issued in U.S. Appl. No. 14/668,511.
US Office Action Restriction/Election dated Sep. 9, 2021 issued in U.S. Appl. No. 17/250,014.
U.S. Appl. No. 17/310,293, inventors Collins et al., filed Jul. 27, 2021.
U.S. Appl. No. 17/436,944, inventors Blakeney et al., filed Sep. 7, 2021.
U.S. Appl. No. 17/639,846, inventors NA Jeong-Seok et al., filed Mar. 2, 2022.
U.S. Appl. No. 17/753,042, filed Feb. 16, 2022.
U.S. Appl. No. 17/753,083, filed Feb. 17, 2022.
U.S. Patent Board Decision on Appeal dated Aug. 19, 2013 issued in U.S. Appl. No. 12/181,927.
CN Office Action dated Dec. 28, 2023 in CN Application No. 202080075633.2, with English Translation.
CN Office Action dated Nov. 30, 2023 in CN Application No. 202080059762.2 with English translation.
International Preliminary Report on Patentability and written opinion dated Jul. 21, 2022 in Application WO2020US64372.
International Search Report and Written Opinion dated Jan. 2, 2024 in PCT Application No. PCT/US2023/074154.
International Search Report and Written Opinion dated Jan. 16, 2024 in PCT Application No. PCT/US2023/033446.
International Search Report and Written Opinion dated Mar. 29, 2021 issued in Application No. PCT/US2020/064372.
International Search Report and Written Opinion dated Sep. 20, 2023 in PCT Application No. PCT/US2023/021927.
JP Office Action dated Aug. 27, 2024 in JP Application No. 2022-541607 with English translation.
JP Office Action dated Jun. 7, 2022, in Application No. JP2021-071508 with English translation.
JP Office Action dated Oct. 13, 2022, in Application No. JP2021-071508 with English translation.
KR Office Action dated Aug. 23, 2024 in KR Application No. 10-2023-0119513, with English Translation.
KR Office Action dated Aug. 26, 2022 in Application No. KR20210164496 with English translation.

(56) References Cited

OTHER PUBLICATIONS

KR Office Action dated Feb. 23, 2023, in Application No. KR10-2021-0164496 with English translation.
KR Office Action dated Jan. 17, 2024 in KR Application No. 10-2023-0119513, with English Translation.
KR Office Action dated Jan. 18, 2024 in KR Application No. 10-2023-0151477, with English Translation.
KR Office Action dated Jan. 30, 2024 in KR Application No. 10-2023-0124456, with English Translation.
KR Office Action dated Jul. 29, 2024 in KR Application No. 10-2023-0151477, with English Translation.
KR Office Action dated Jun. 19, 2023, in application No. KR20210164496 with English translation.
KR Office Action dated May 30, 2023 in Application No. KR10-2022-0011054 with English translation.
KR Office Action dated Nov. 9, 2022 in Application No. KR10-2022-0011054 with English translation.
KR Prior Art Search Report dated Nov. 13, 2023 in Application No. KR 10-2023-0151477, with English translation.
KR Prior-Art Search Report dated Sep. 15, 2023, in application No. KR 10-2023-0119513.
SG Search Report and Written Opinion dated Jul. 30, 2024 in SG Application No. 10202102836Y.
SG Supplementary Examination Report dated Dec. 4, 2023 in SG Application No. 10201602599X.
U.S. Appl. No. 17/758,341, inventors Luo et al., filed Jul. 1, 2022.
KR Notice of Allowances dated Oct. 29, 2024 in KR Application No. 10-2023-0124456 with English Translation.
TW Office Action dated Oct. 14, 2024 in TW Application No. 110100013 with English translation.
U.S. Non-Final Office Action dated Nov. 19, 2024 in U.S. Appl. No. 17/753,083.

* cited by examiner

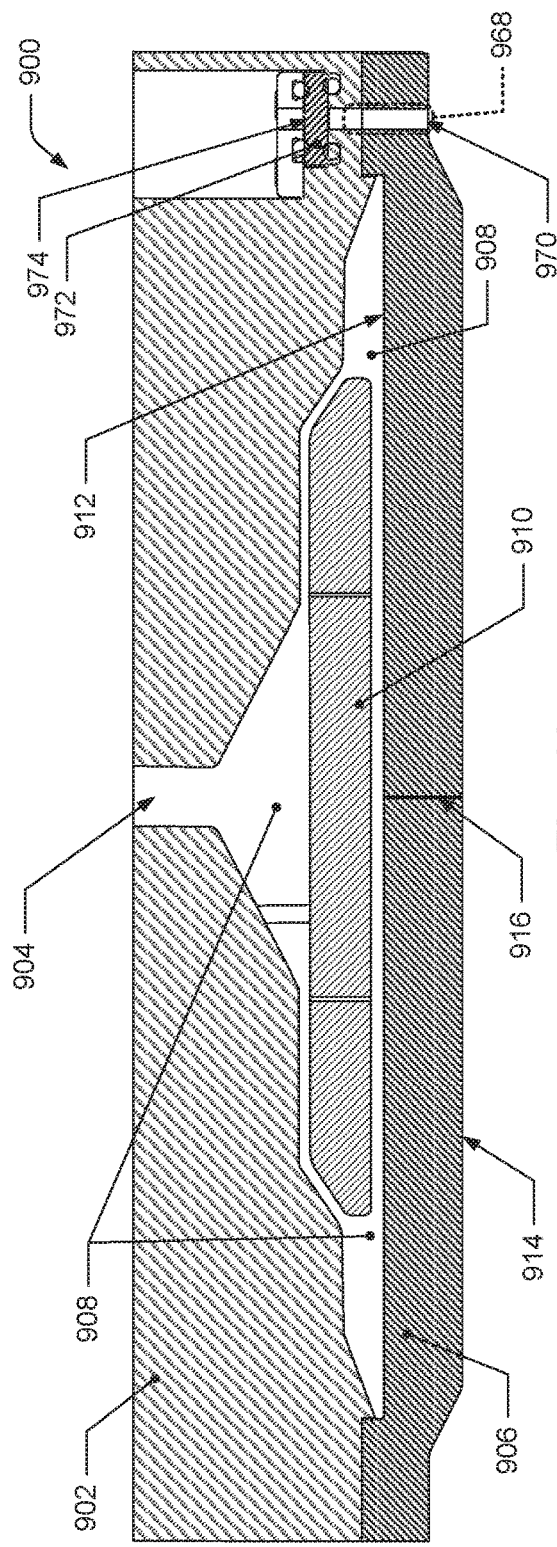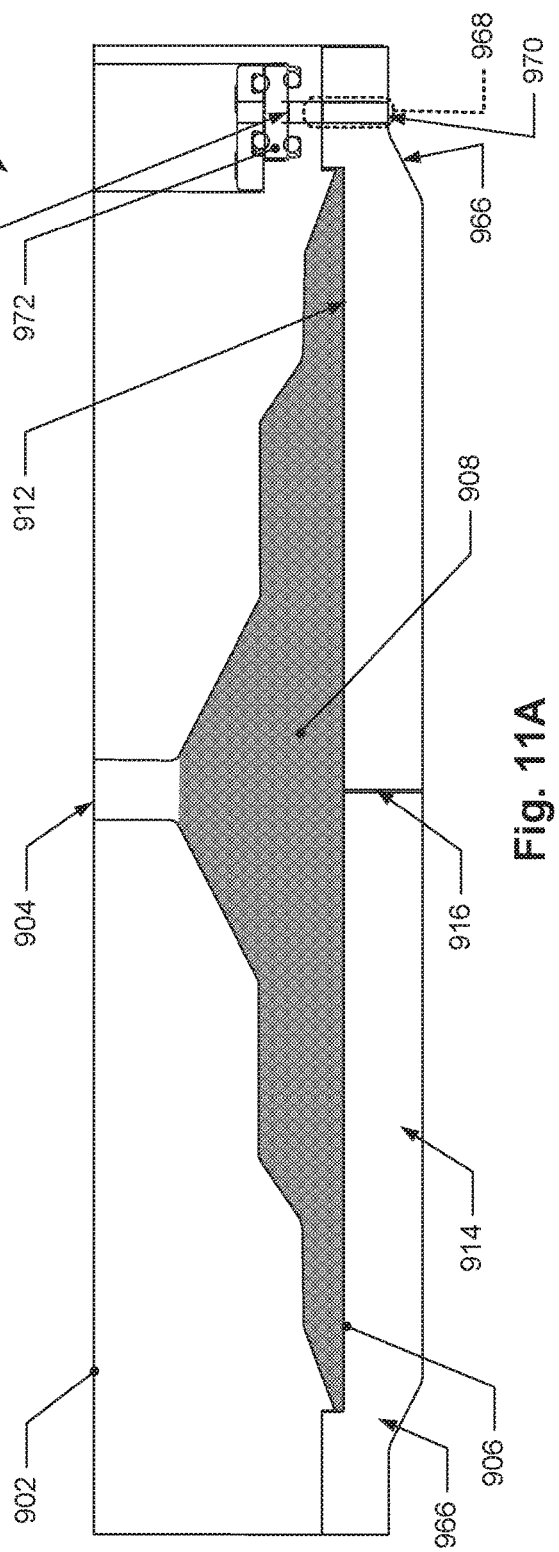

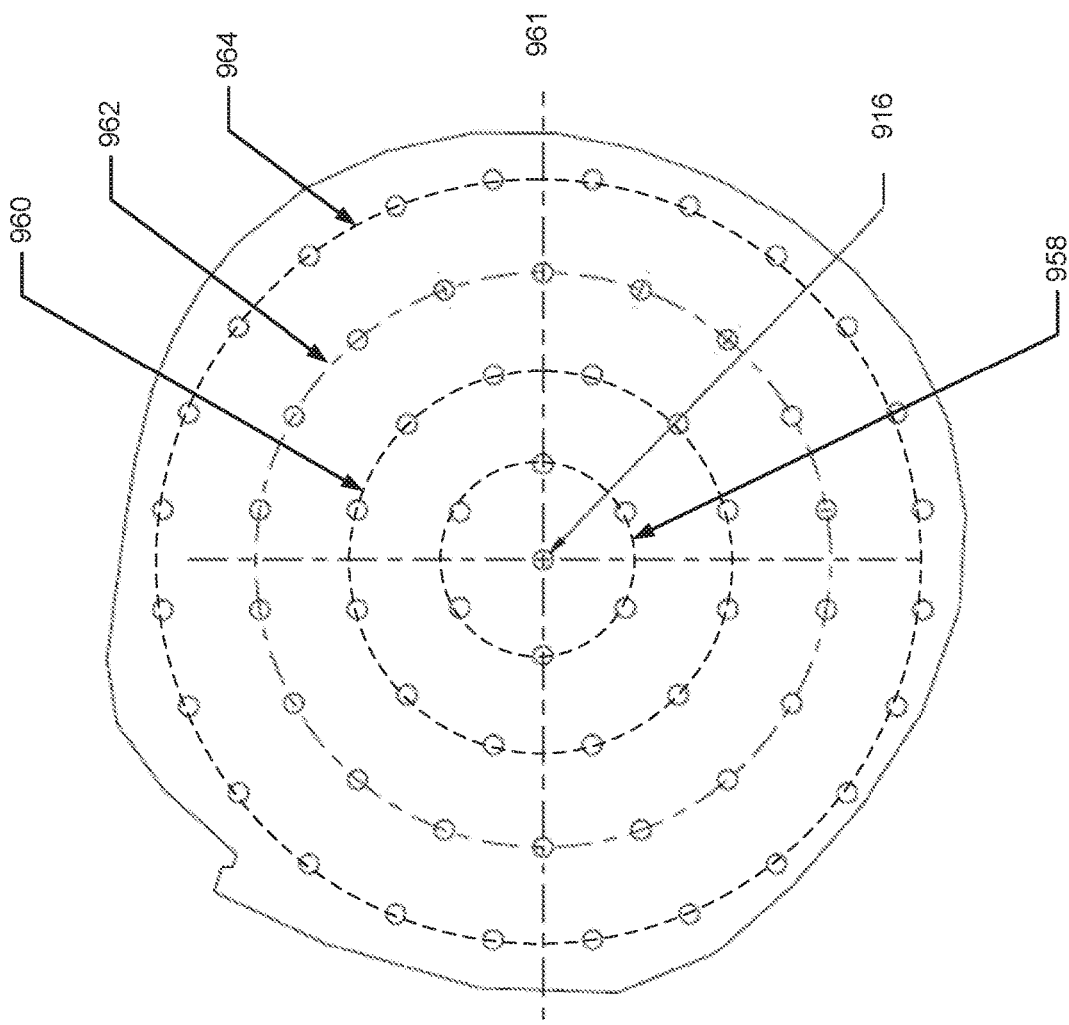

METAL DEPOSITION

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Tungsten (W) film deposition using chemical vapor deposition (CVD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. Tungsten films may also be used in various memory applications, including in formation of buried wordline (bWL) architectures for dynamic random access memory (DRAM), word lines for 3D NAND, and logic applications. However, the continued decrease in feature size and film thickness brings various challenges including high resistivity for thinner films. Other metals such as molybdenum (Mo) are being evaluated as low resistivity replacements for W.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some embodiments, a showerhead may be provided. The showerhead may include a faceplate partially defined by a front surface and a back surface, and having a plurality of faceplate through-holes extending through the faceplate from the front surface to the back surface, a back plate having a gas inlet, a first conical frustum surface, and a second conical frustum surface, a plenum volume fluidically connected to the gas inlet and at least partially defined by the gas inlet, the back surface of the faceplate, the first conical frustum surface, and the second conical frustum surface, and a baffle plate positioned within the plenum volume, partially defined by a top surface and a bottom surface, and having a plurality of baffle plate through-holes extending through the baffle plate from the top surface to the bottom surface. The second conical frustum surface may be positioned radially outwards from the first conical frustum surface with respect to a center axis of the showerhead, the second conical frustum surface may be positioned along the center axis farther from the gas inlet than the first conical frustum surface, the first conical frustum surface may be at a first angle with respect to the center axis, and the second conical frustum surface may be at a second angle with respect to the center axis.

In some embodiments, an inner circumference of the second conical frustum surface may be positioned radially outwards from an outer circumference of the first conical frustum surface with respect to the center axis.

In some embodiments, the first angle may be larger than the second angle.

In some such embodiments, the first angle is between about 50° and about 90° and the second angle is between about 45° and about 85°.

In some embodiments, the back plate may further include a third surface that spans between the first conical frustum surface and the second conical frustum surface.

In some such embodiments, the third surface may include a planar portion that is perpendicular to the center axis.

In some embodiments, the back plate may further include a third conical frustum surface that is positioned radially outwards from the second conical frustum surface with respect to the center axis such that the second conical frustum surface is radially interposed between the first conical frustum surface and the third conical frustum surface, and the third conical frustum surface may be positioned at a third angle with respect to the center axis.

In some such embodiments, the third angle may be greater than the first angle and the second angle.

In some embodiments, an outer edge of the baffle plate may be positioned radially outwards from the first conical frustum surface with respect to the center axis.

In some such embodiments, the outer edge of the baffle plate may be positioned radially interposed, with respect to the center axis, between an inner circumference of the second conical frustum surface and an outer circumference of the second conical frustum surface.

In some embodiments, the baffle plate may be positioned along the center axis such that the first conical frustum surface is closer to the gas inlet than the baffle plate.

In some such embodiments, the top surface of the baffle plate may face the gas inlet and the bottom surface of the baffle plate may face the faceplate, and the baffle plate may be further positioned along the center axis such that the top surface of the baffle plate is interposed along the center axis between an inner circumference of the second conical frustum surface and an outer circumference of the second conical frustum surface.

In some further such embodiments, the baffle plate may be further positioned along the center axis such that the bottom surface of the baffle plate is farther from the gas inlet than the outer circumference of the second conical frustum surface.

In some embodiments, the baffle plate may further include a baffle plate conical frustum surface that faces the back plate.

In some such embodiments, the baffle plate conical frustum surface may be offset from the center axis by a fourth angle that is complimentary to the second angle.

In some embodiments, the plurality of baffle plate through-holes may have outer diameters that increase as the radial positioning increases with respect to the center axis.

In some such embodiments, a first number of baffle plate through-holes may be positioned in a first section of the baffle plate and have a first outer diameter, a second number of baffle plate through-holes may be positioned in a second section of the baffle plate and have a second outer diameter that is greater than the first outer diameter, and the second section may be radially offset outwards from the first section with respect to the center axis.

In some further such embodiments, the first outer diameter may be between about 0.3 mm and about 0.65 mm, and the second outer diameter is between about 0.5 mm and 0.75 mm.

In some further such embodiments, a third number of baffle plate through-holes may be positioned in a third section of the baffle plate and have a third outer diameter that is greater than the second outer diameter, and the third section may be radially offset outwards from the second section with respect to the center axis.

In some embodiments, the third outer diameter is between about 0.7 mm and about 1.1 mm.

In some embodiments, an inner circumference of first conical frustum surface may partially define the gas inlet.

In some embodiments, the faceplate may further include a faceplate conical frustum surface that is positioned radially outwards with respect to the center axis from the front surface of the faceplate and is offset from the center axis by a fifth angle that is greater than 90°.

In some embodiments, the showerhead may further include a port that includes a first end and an opening at a second end, and that extends through the faceplate, and the opening may be in the faceplate and radially outwards from front surface, and a window positioned adjacent to the first end of the port.

In some such embodiments, the showerhead may further include a sensor positioned adjacent to the window such that the window is interposed between the first end and the sensor.

In some further such embodiments, the sensor may be configured to determine one or more of: a distance of an object outside of the opening, a temperature outside of the opening, and a gas species outside of the opening.

In some such embodiments, the window may be made of a material that comprises sapphire.

In some such embodiments, the showerhead may further include three ports and three windows. Each window may be positioned adjacent to the first end of one corresponding port, and the three ports may be substantially equally spaced around the center axis.

In some embodiments, the faceplate through-holes may all the same outer diameter.

In some such embodiments, the outer diameter of each of the faceplate through-holes may be between about 0.03 inches and 0.05 inches.

In some embodiments, a method may be provided. The method may include introducing sequential doses of reactant gases to a process chamber through a showerhead to deposit a film by an atomic layer deposition process on a substrate. The showerhead may include a faceplate partially defined by a front surface and a back surface, and having a plurality of faceplate through-holes extending through the faceplate from the front surface to the back surface, a back plate having a gas inlet, a first conical frustum surface, and a second conical frustum surface, a plenum volume fluidically connected to the gas inlet and at least partially defined by the gas inlet, the back surface of the faceplate, the first conical frustum surface, and the second conical frustum surface, and a baffle plate positioned within the plenum volume, partially defined by a top surface and a bottom surface, and having a plurality of baffle plate through-holes extending through the baffle plate from the top surface to the bottom surface. The second conical frustum surface may be positioned radially outwards from the first conical frustum surface with respect to a center axis of the showerhead, the second conical frustum surface may be positioned along the center axis farther from the gas inlet than the first conical frustum surface, the first conical frustum surface may be at a first angle with respect to the center axis, and the second conical frustum surface may be at a second angle with respect to the center axis.

In some embodiments, a method may be provided. The method may include exposing a structure to multiple deposition cycles to fill features of the structure with a bulk conductive layer in features of the structure, and each deposition cycle may include sequentially delivering a dose of hydrogen ($H_2$) and a dose of a metal-containing precursor co-flowed with nitrogen ($N_2$).

In some embodiments, the structure may be a partially fabricated three-dimension (3-D) NAND structure comprising sidewalls and a plurality of openings in the sidewalls leading to a plurality of the features having a plurality of interior regions fluidically accessible through the openings.

In some embodiments, the metal-containing precursor may be a metal halide.

In some embodiments, the metal-containing precursor may be a metal oxyhalide.

In some embodiments, the metal-containing precursor may be a tungsten-containing precursor.

In some such embodiments, the tungsten-containing precursor may be tungsten hexafluoride ($WF_6$), tungsten hexachloride ($WCl_6$), tungsten pentachloride ($WCl_5$), tungsten tetrachloride ($WCl_4$), tungsten dichloride ($WCl_2$), tungsten oxytetrachloride ($WOCl_4$) or tungsten dichloride dioxide ($WO_2Cl_2$).

In some embodiments, the metal-containing precursor may be a molybdenum-containing precursor.

In some such embodiments, the molybdenum-containing precursor may be molybdenum pentachloride ($MoCl_5$), molybdenum hexafluoride ($MoF_6$), molybdenum dichloride dioxide ($MoO_2Cl_2$), molybdenum oxytetrachloride ($MoOCl_4$), and molybdenum oxytetrachloride ($MoOF_4$).

In some embodiments, the method may further include a NH3 soak prior to the multiple deposition cycles.

In some embodiments, the multiple deposition cycles may include introducing at least one of the dose of hydrogen ($H_2$) and the dose of a metal-containing precursor co-flowed with nitrogen ($N_2$) via a showerhead provided in any of the above embodiments.

In some embodiments, a method may be provided. The method may include providing a structure to be filled with a metal, and exposing the structure to multiple deposition cycles. Each deposition cycle may include sequentially delivering a dose of hydrogen ($H_2$) and a dose of a metal-containing precursor co-flowed with nitrogen ($N_2$).

BRIEF DESCRIPTION OF THE DRAWINGS

The various implementations disclosed herein are illustrated by way of example, and not by way of limitation, in the figures of the accompanying drawings, in which like reference numerals refer to similar elements.

FIG. 10 depicts a cross-sectional side view of the showerhead of FIG. 9.

FIG. 11A depicts the cross-sectional view of FIG. 10.

FIG. 15B depicts a partial magnified section of the middle of the faceplate of FIG. 15A.

FIG. 15C depicts specifications for some faceplate through-holes.

DETAILED DESCRIPTION

Figure 1A:
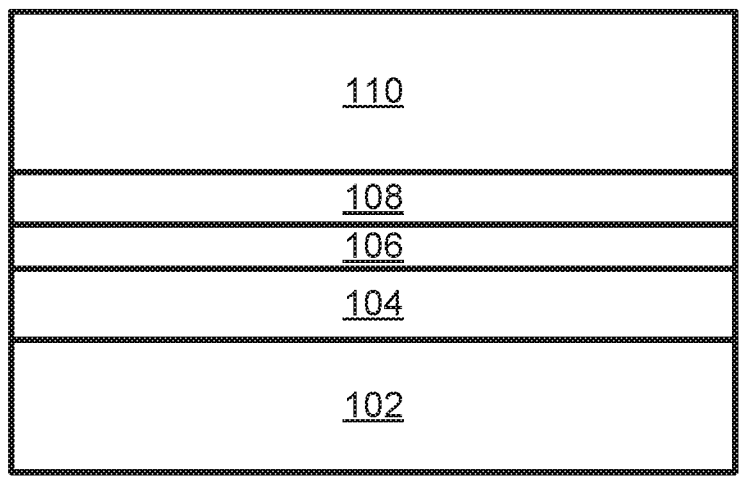
FIGS. 1A and 1B are schematic examples of material stacks that may be formed using the methods and apparatus described herein.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Tungsten (W) fill of features is often used in semiconductor device fabrication to form electrical contacts. In conventional methods of depositing tungsten films, a nucleation tungsten layer is first deposited into a via or contact. In general, a nucleation layer is a thin conformal layer that serves to facilitate the subsequent formation of a bulk material thereon. The tungsten nucleation layer may be deposited to conformally coat the sidewalls and bottom of the feature. Conforming to the underlying feature bottom and sidewalls can be critical to support high quality deposition. Nucleation layers are often deposited using atomic layer deposition (ALD) or pulsed nucleation layer (PNL) methods.

In an ALD or PNL technique, pulses of reactant are sequentially injected and purged from the reaction chamber, typically by a pulse of a purge gas between reactants. A first reactant can be adsorbed onto the substrate, available to react with the next reactant. The process is repeated in a cyclical fashion until the desired thickness is achieved. In the context of the disclosed embodiments, chemical vapor deposition (CVD) embodies processes in which reactants are together introduced to a reactor for a vapor-phase or surface reaction. PNL and ALD processes are distinct from CVD processes and vice versa.

After the tungsten nucleation layer is deposited, bulk tungsten may be deposited by a CVD process by reducing tungsten hexafluoride ($WF_6$) using a reducing agent such as hydrogen ($H_2$). Bulk tungsten is different from a tungsten nucleation layer. Bulk tungsten as used herein refers to tungsten used to fill most or all of a feature, such as at least about 50% of the feature. Unlike a nucleation layer, which is a thin conformal film that serves to facilitate the subsequent formation of a bulk material thereon, bulk tungsten is used to carry current. It may be characterized by larger grain size and lower resistivity as compared to a nucleation film. In various embodiments, bulk tungsten is tungsten deposited to a thickness of at least 50 Å. Similarly, deposition of molybdenum may involve first depositing a nucleation layer followed by a lower resistivity bulk layer.

There are various challenges in conductive fill as devices scale to smaller technology nodes and more complex patterning structures are used. One challenge is conformal deposition in these structures such that there is an even distribution of material throughout the structure. Distribution of a material within a feature or structure may be characterized by its step coverage. For the purposes of this description, "step coverage" is defined as a ratio of two thicknesses. For example, step coverage can be the thickness of the material inside the feature divided by the thickness of the material near the opening. For purposes of this document, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening.

Another challenge is reducing the fluorine concentration or content in the deposited film, which can be an issue when using fluorine-containing metal precursors. As compared to larger features, a smaller feature having the same fluorine concentration in the film as a larger feature affects the performance of the device more substantially. For example, the smaller the feature, the thinner the films are deposited. As a result, fluorine in the deposited film is more likely to diffuse through the thinner films, thereby potentially causing device failure. For structures such as 3D NAND structures, roughness including sidewall roughness is also a challenge.

Another challenge for feature fill as well as other deposition and non-deposition processes is uniformity. Non-uniform processing across a wafer or other substrate can lead to integration challenges and device failure.

Provided herein are methods and apparatus of filling structures with conductive films. The methods involve using an atomic layer deposition (ALD) process to deposit a bulk layer using hydrogen ($H_2$) as a reducing agent. The ALD process involves sequential doses of a metal-containing precursor and $H_2$ with nitrogen ($N_2$) flowed with the metal-containing precursor. Apparatuses configured to perform the methods are also provided.

According to various embodiments, one or more advantages may be realized. In some embodiments, flowing $N_2$ with the metal-containing precursor allows good fill to be obtained at higher deposition temperatures, which allows lower stress films to be deposited. The use of nitrogen may also provide smooth morphology of the deposited films. In some embodiments, this allows bulk metal films to be deposited directly on oxide surfaces without an intervening nucleation layer.

Also provided are low volume showerheads that may be used in apparatuses for deposition and other substrate processing. In some embodiments, the showerhead includes a plenum volume partially defined by a plurality of conical frustum surfaces of a back plate, and a baffle plate having through-holes that is positioned inside the plenum volume. These features may result in one or more of reduced internal volume of the showerhead, more uniform flow within the showerhead, and reduced particle generation within the showerhead. According to various embodiments, one or more advantages may be realized. In some embodiments, the reactant consumption and purge time is reduced. In some embodiments, uniform flow within the showerhead improves uniformity of the deposited films.

FIGS. 1A-8 describe methods and apparatuses for filling structures with conductive films. FIGS. 9-17D describe low volume showerheads for substrate processing. In some embodiments, the methods are implemented using the low volume showerheads.

Figure 1B:
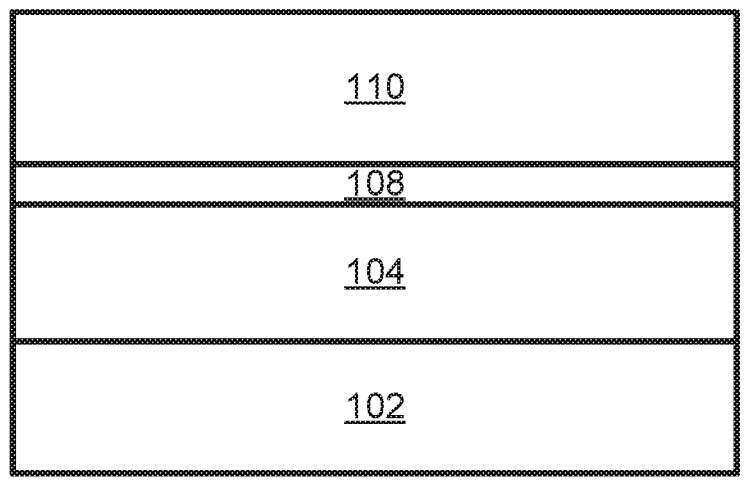

First, turning to conductive film deposition, FIGS. 1A and 1B are schematic examples of material stacks that may be formed using the methods and apparatus described herein. FIGS. 1A and 1B illustrate the order of materials in a particular stack and may be used with any appropriate architecture and application, as described further below with respect to FIGS. 2, 3A, and 3B. In the example of FIG. 1A, a substrate 102 has a nucleation layer 108 deposited thereon. The substrate 102 may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like.

In FIG. 1A, a dielectric layer 104 is on the substrate 102. The dielectric layer 104 may be deposited directly on a semiconductor (e.g., Si) surface of the substrate 102, or there may be any number of intervening layers. Examples of dielectric layers include doped and undoped silicon oxide, silicon nitride, and aluminum oxide layers, with specific examples including doped or undoped layers $SiO_2$ and $Al_2O_3$. Also, in FIG. 1A, a diffusion barrier layer 106 is disposed between the nucleation layer 108 and the dielectric layer 104. Examples of diffusion barrier layers including titanium nitride (TiN), titanium/titanium nitride (Ti/TiN), tungsten nitride (WN), and tungsten carbon nitride (WCN). A metal layer 110 is deposited on the nucleation layer 108 and is the main conductor (also referred to as a bulk conductor or bulk layer) of the structure with the nucleation layer 108 providing a template for metal growth. Examples of metal layers include tungsten (W) and molybdenum (Mo) layers. The nucleation layer 108 may include the same or a different metal than the metal layer 110.

FIG. 1B shows another example of a material stack. In this example, the stack includes the substrate 102, dielectric layer 104, with the nucleation layer 108 deposited directly on the dielectric layer 104, without an intervening diffusion barrier layer. As in the example of FIG. 1A, a metal layer 110 is deposited on the nucleation layer 108 and is the main conductor of the structure.

While FIGS. 1A and 1B show examples of metallization stacks, the methods and resulting stacks are not so limited. For example, in some embodiments, the nucleation layer 108 may be omitted with the main conductor deposited directly on the underlying layer. In some embodiments, the nucleation layer may be deposited directly on a Si or other semiconductor substrate as a template for metal growth. The methods described herein are performed on a substrate that may be housed in a chamber.

Figure 2:
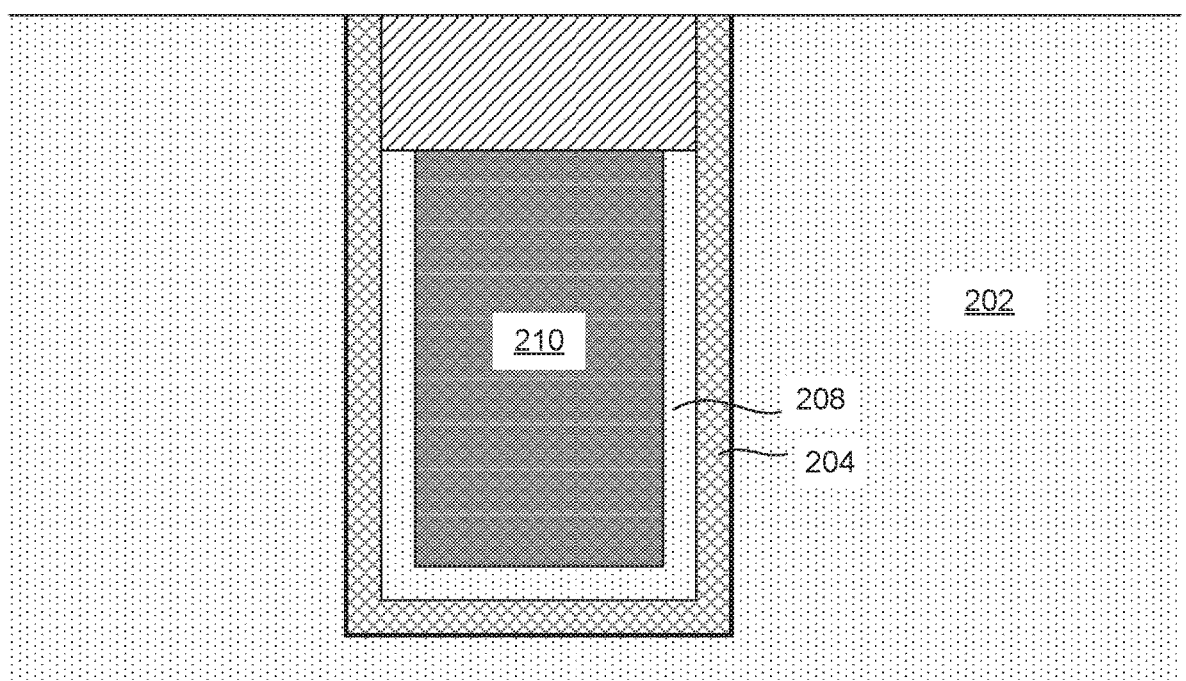
FIG. 2 depicts a schematic example of a dynamic random access memory (DRAM) architecture including a buried wordline (bWL) in a silicon substrate.
Figure 3A:
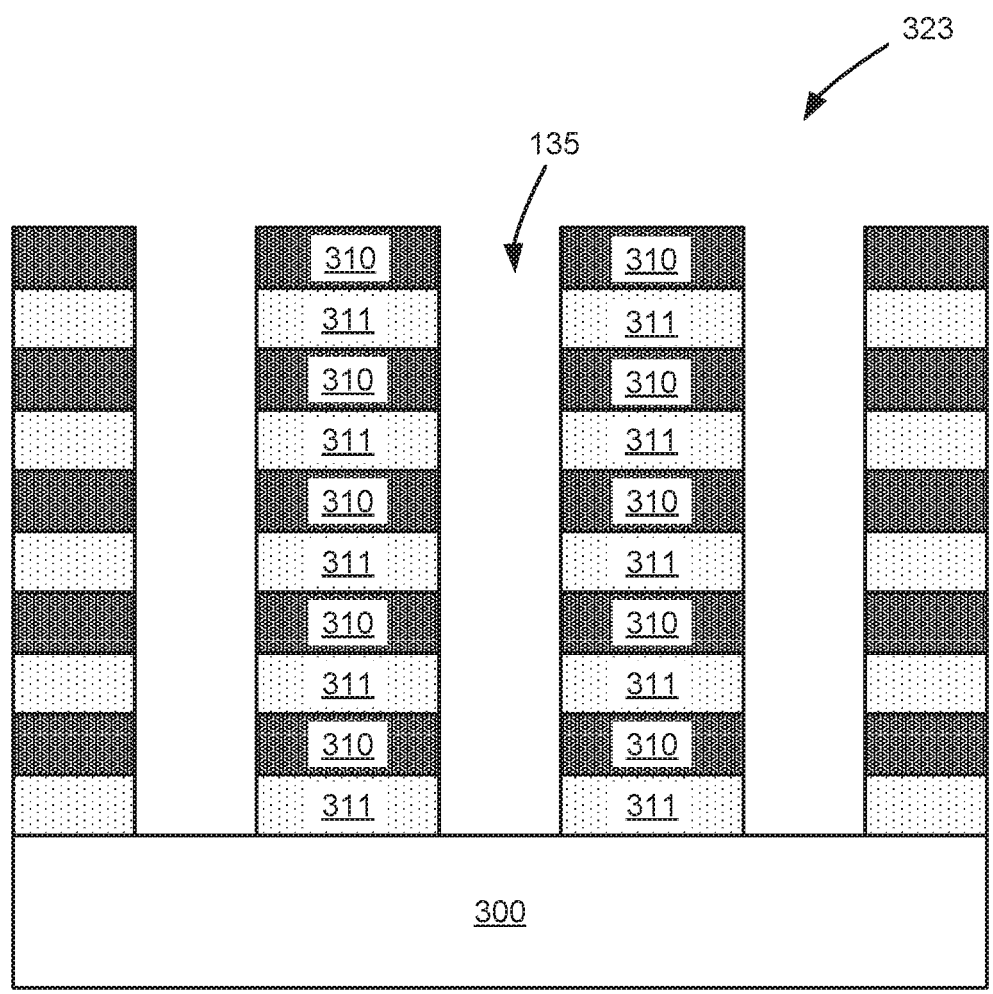
FIG. 3A depicts a schematic example of wordlines 310 in a 3D NAND structure formed on a substrate.
Figure 3B:
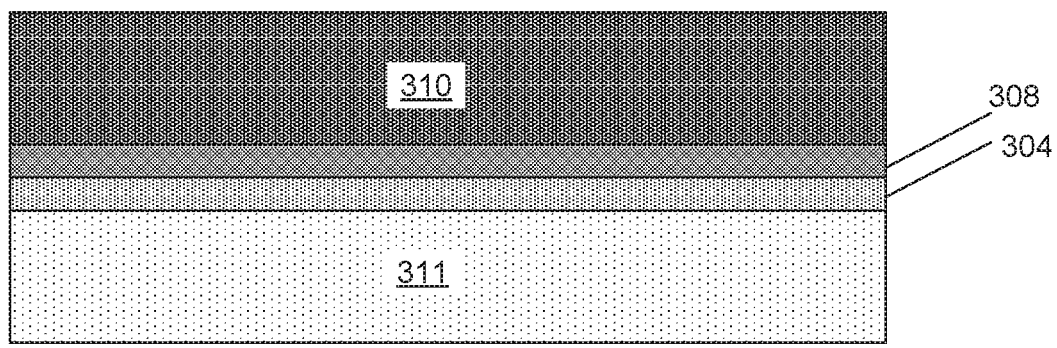
FIG. 3B depicts a detail of the interface between a wordline and an oxide layer.

The material stacks described above and further below may be implemented in a variety of structures. FIGS. 2, 3A, and 3B provide examples of structures in which the stacks may be employed. FIG. 2 depicts a schematic example of a DRAM architecture including a buried wordline (bWL) 210 in a silicon substrate 202. The bWL 210 is formed in a trench etched in the silicon substrate 202. Lining the trench is a conformal nucleation layer 208 and an insulating layer 204 that is disposed between the conformal nucleation layer 208 and the silicon substrate 202. In the example of FIG. 2, the insulating layer 204 may be a gate oxide layer, formed from a high-k dielectric material such as a silicon oxide or silicon nitride material. In some embodiments, a conformal barrier layer such as TiN or a tungsten-containing layer may be interposed between the nucleation layer 208 and the insulating layer 204.

FIG. 3A depicts a schematic example of wordlines 310 in a 3D NAND structure 323 formed on a substrate 300. The wordlines 310 are separated by oxide layers 311. In FIG. 3B, a detail of the interface between a wordline 310 and oxide layer 311 is shown including a layer of aluminum oxide ($Al_2O_3$) 304 and a nucleation layer 308 is shown. In some embodiments, the nucleation layer 308 may be deposited directly on the oxide layer 311 or on a TiN or other barrier layer as described herein. The nucleation layers may be between about 10 Å and 100 Å, or 10 Å and 50 Å, for example, for deposition of a wordline 310 of between about 10 nm and 100 nm thick.

Figure 3C:
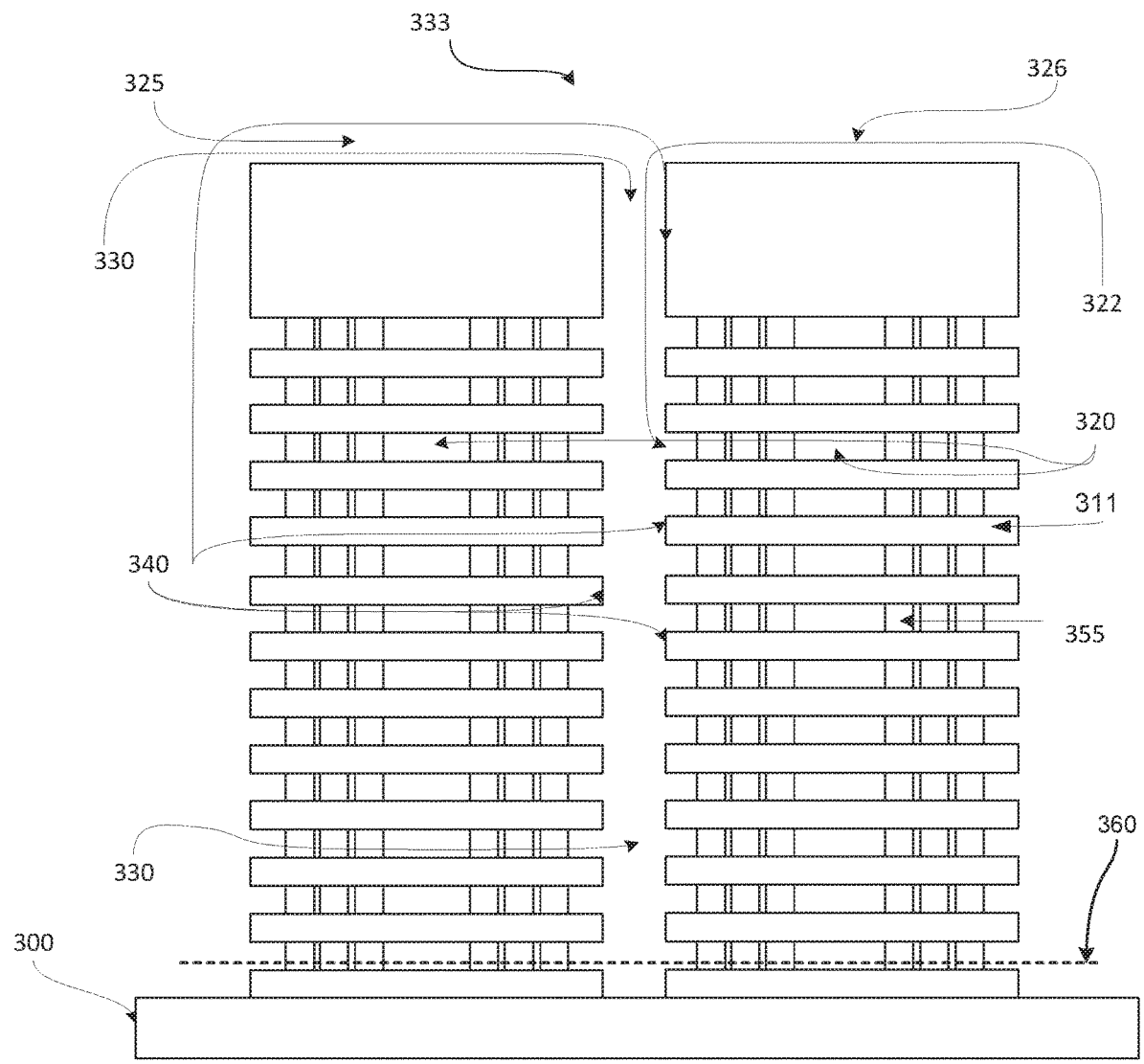
FIG. 3C depicts a cross-sectional side view of a partially fabricated 3-D NAND structure.

FIG. 3C presents a cross-sectional side view of a partially fabricated 3-D NAND structure 333 and illustrates challenges of metal fill. The structure 330 is formed on a semiconductor substrate 300 and includes 3D NAND stacks (left 325 and right 326), central vertical structure 330, and a plurality of stacked wordline features 320 with openings 322 on opposite sidewalls 340 of central vertical structure 330. Note that FIG. 3C displays two stacks 325 and 326 of the exhibited partially fabricated 3-D NAND structure 333, which together form the trench-like central vertical structure 330, however, in certain embodiments, there may be more than two stacks arranged in sequence and running spatially parallel to one another, the gap between each adjacent pair of stacks forming a central vertical structure 330, like that explicitly illustrated in FIG. 3C. In the example of FIG. 3C, the wordline features 320 are fluidically accessible from the central vertical structure 330 through the openings 322. Although not explicitly indicated in the figure, the horizontal features 320 present in both the 3-D NAND stacks 325 and 326 shown in FIG. 3C (i.e., the left 3-D NAND stack 325 and the right 3-D NAND stack 326) are also accessible from the other sides of the stacks (far left and far right, respectively) through similar vertical structures formed by additional 3-D NAND stacks (to the far left and far right, but not shown). In other words, each 3-D NAND stack 325, 326 contains a stack of wordline features that are fluidically accessible from both sides of the 3-D NAND stack through a central vertical structure 330.

The wordline features in a 3-D NAND stack may be formed by depositing an alternating stack of silicon oxide and silicon nitride layers, and then selectively removing the nitride layers leaving a stack of oxide layers 311 having gaps between them. These gaps are the wordline features 320. Any number of wordlines may be vertically stacked in such a 3-D NAND structure so long as there is a technique for forming them available, as well as a technique available to successfully accomplish substantially void-free fills of the vertical features. Thus, for example, a 3D-NAND stack may include between 2 and 256 horizontal wordline features, or between 8 and 128 horizontal wordline features, or between 16 and 64 horizontal wordline features, and so forth (the listed ranges understood to include the recited end points).

Figure 3D:
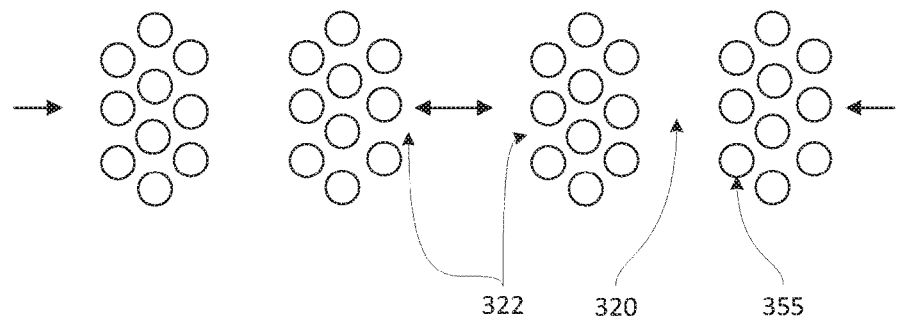
FIG. 3D depicts a cross-sectional top-down view of the same 3-D NAND structure shown in FIG. 3C.

FIG. 3D presents a cross-sectional top-down view of the same 3-D NAND structure shown in FIG. 3C with the cross-section taken through the horizontal section 360 as indicated by the dashed horizontal line in FIG. 3C. The cross-section of FIG. 3C illustrates several rows of pillars 355, which are run vertically from the base of semiconductor substrate 300 to the top of the 3-D NAND stacks. In some embodiments, these pillars 355 are formed from a polysilicon material and are structurally and functionally significant to the 3-D NAND structure 333. In some embodiments, such polysilicon pillars may serve as gate electrodes for stacked memory cells formed within the pillars. The top-view of FIG. 3D illustrates that the pillars 355 form constrictions in the openings 322 to wordline features 320—i.e. fluidic accessibility of wordline features 320 from the central vertical structure 330 via openings 322 (as indicated by the arrows in FIG. 3D) is inhibited by pillars 355. In some embodiments, the size of the horizontal gap between adjacent polysilicon pillars is between about 1 and 20 nm. This reduction in fluidic accessibility increases the difficulty of uniformly filling wordline features 320 with conductive material.

Figure 4A:
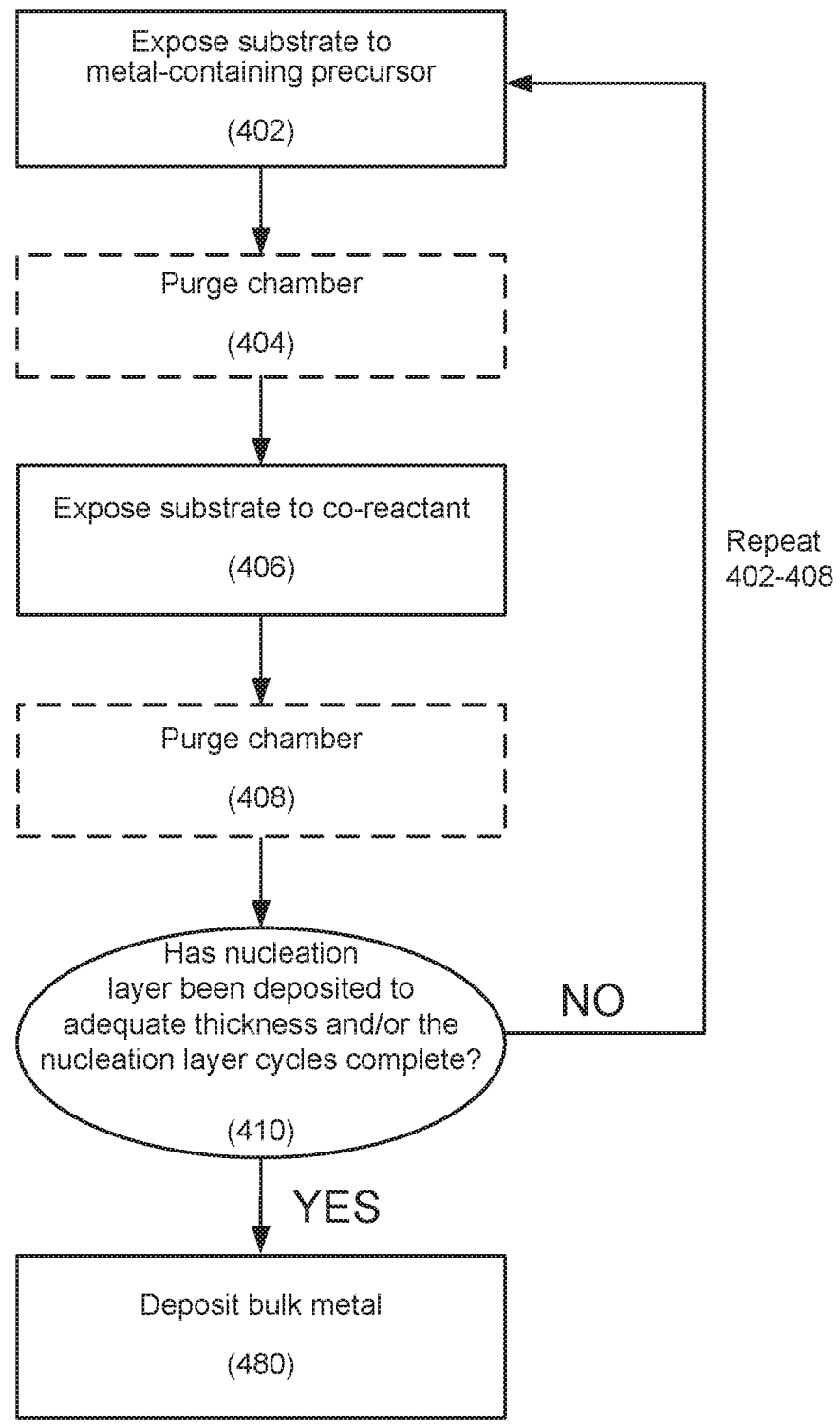
FIGS. 4A-4C depict techniques that may be performed to fill a 3D NAND structure with metal.
Figure 4B:
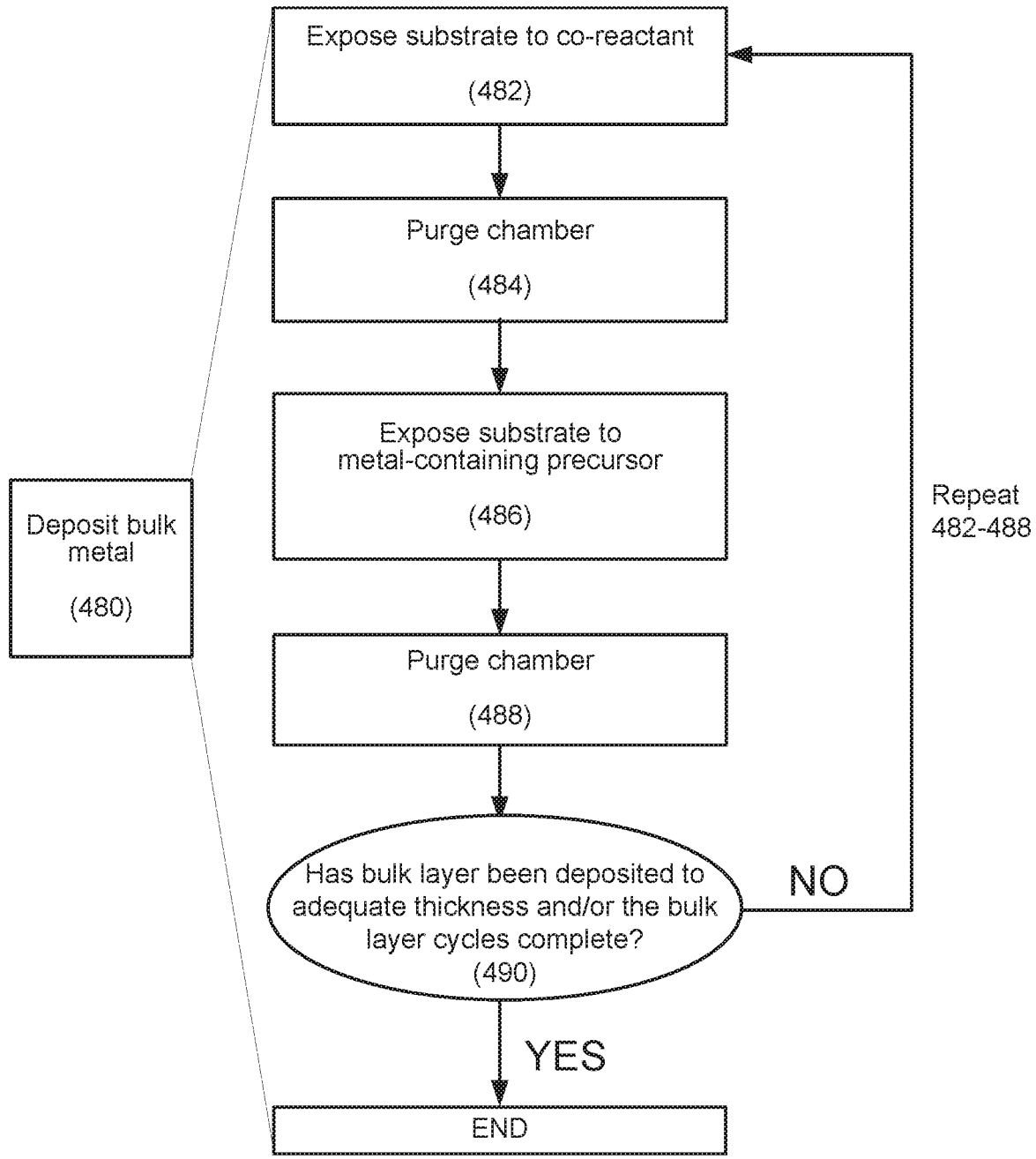
Figure 4C:
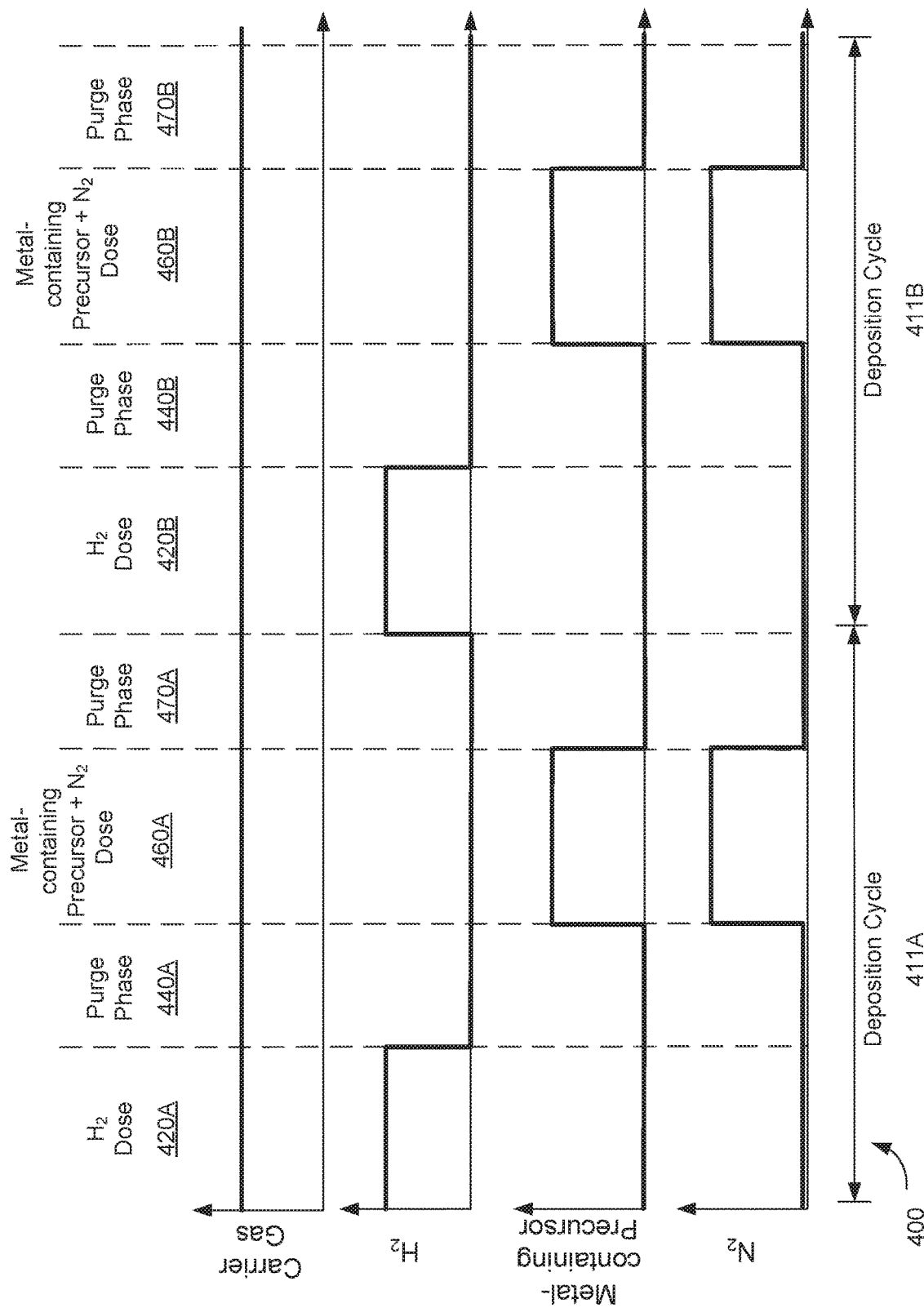

FIGS. 4A-4C describe methods that may be performed to fill a 3D NAND structure with metal. Turning first to FIG. 4A, operations 402-410 of FIG. 4A are performed to deposit a nucleation layer by ALD. In some embodiments described herein, operations 402-410 are performed at lower pressure than the subsequent bulk deposition in operation 480. For example, operations 402-410 may be performed at a low pressure less than about 10 Torr for tungsten deposition. In some examples, operations 402-410 are performed at a pressure of about 10 Torr, or a pressure of about 3 Torr for tungsten deposition. Deposition of molybdenum nucleation layers may use higher pressures, e.g., 10-60 Torr. Pressures on the lower end of this range may be used to mitigate fluorine incorporation.

In some implementations, performing operations 402-410 at a low pressure reduces fluorine concentration in the deposited film due to a lower partial pressure of a fluorine-containing precursor (if used) in the chamber when the film is deposited, such that less fluorine is incorporated into the film.

In operation 402, the substrate is exposed to a metal-containing precursor. This operation may be referred to as a "pulse" or a "dose," which may be used interchangeably herein. The metal-containing precursor contains a metal that will be the main component of the nucleation layer, and in many embodiments (though not necessarily), the subsequently deposited bulk layer.

Examples of nucleation layers include tungsten-containing nucleation layers and molybdenum-containing nucleation layers, which use tungsten-containing precursors and molybdenum-containing precursors, respectively. Examples of tungsten-containing precursors include tungsten halides and tungsten oxyhalides. Examples of tungsten halides include tungsten hexafluoride ($WF_6$), tungsten chlorides ($WCl_x$) including tungsten hexachloride ($WCl_6$), tungsten pentachloride ($WCl_5$), tungsten tetrachloride ($WCl_4$), tungsten dichloride ($WCl_2$), and tungsten oxychlorides ($WO_xCl_y$) such as tungsten oxytetrachloride ($WOCl_4$) and tungsten dichloride dioxide ($WO_2Cl_2$). Further examples include tungsten hexacarbonyl $W(CO)_6$ and organo-tungsten precursors such as MDNOW (methylcyclopentadienyl-dicarbonylnitrosyl-tungsten) and EDNOW (ethylcyclopentadienyl-dicarbonylnitrosyl-tungsten).

Examples of molybdenum-containing precursors include molybdenum halides and molybdenum oxyhalides. Examples of molybdenum halides include molybdenum pentachloride ($MoCl_5$) and molybdenum hexafluoride ($MoF_6$). Examples of molybdenum oxyhalides include molybdenum dichloride dioxide ($MoO_2Cl_2$), molybdenum oxytetrachloride ($MoOCl_4$), and molybdenum oxytetrachloride ($MoOF_4$).

The metal-containing precursor may include a combination of these compounds. In some embodiments, a carrier gas, such as nitrogen ($N_2$), argon (Ar), helium (He), or other inert gases, may be flowed during operation 402.

Operation 402 may be performed for any suitable duration and at any suitable temperature. In some examples, operation 402 may be performed for a duration between about 0.25 seconds and about 30 seconds, about 0.25 seconds to about 5 seconds, or about 0.5 seconds to about 3 seconds. This operation may be performed in some embodiments for a duration sufficient to saturate the active sites on the surface of the substrate.

In operation 404, the chamber is optionally purged to remove excess precursor that did not adsorb to the surface of the substrate. A purge may be conducted by flowing an inert gas at a fixed pressure thereby reducing the pressure of the chamber and re-pressurizing the chamber before initiating another gas exposure.

In operation 406, the substrate is exposed to a co-reactant to deposit a nucleation layer. In some embodiments, the co-reactant is a reducing agent such as hydrogen ($H_2$), borane, silane, or germane. Example boranes include borane ($BH_3$), diborane ($B_2H_6$), triborane, alkyl boranes, aminoboranes, carboboranes, and haloborane. Example silanes include silane ($SiH_4$), disilane ($Si_2H_6$), trisilane ($Si_3H_8$), alkyl silanes, aminosilanes, carbosilanes, and halosilane. Germanes include $Ge_nH_{n+4}$, $Ge_nH_{n+6}$, $Ge_nH_{n+8}$, and $Ge_nH_m$, where n is an integer from 1 to 10, and n is a different integer than m. Other germanes may also be used, e.g., alkyl germanes, aminogermanes, carbogermanes, and halogermanes. In general, halogermanes may not have significant reducing potential but there may be process conditions and precursors suitable for film formation using halogermanes.

In some embodiments, an amorphous nucleation layer may be deposited using a metal halide or metal oxyhalide precursor and a nitrogen-containing reducing agent such as ammonia ($NH_3$). Such nucleation layers are described in U.S. Provisional Patent Application No. 62/797,860 filed Jan. 28, 2019 and may be characterized as metal oxynitride or metal nitride nucleation layers. The metal oxynitride or metal nitride nucleation layers may be converted to metal layers in subsequent processing including during deposition of a bulk layer.

Operation 406 may be performed for any suitable duration. Example durations include between about 0.25 seconds and about 30 seconds, about 0.25 seconds to about 5 seconds, or about 0.5 seconds to about 3 seconds. In some embodiments, this operation may be sufficient to react with the adsorbed layer of metal-containing precursor on the surface of the substrate. Operation 406 may be performed for a duration outside of these example ranges. In some embodiments, a carrier gas may be used, such as, for example, argon (Ar), helium (He), or nitrogen ($N_2$).

After operation 408, there may be an optional purge step to purge excess co-reactant still in gas phase that did not react with the metal-containing precursor on the surface of the feature. A purge may be conducted by flowing an inert gas at a fixed pressure thereby reducing the pressure of the chamber and re-pressurizing the chamber before initiating another gas exposure.

Each repetition of operations 402-408 may be referred to as an ALD "cycle." It will be appreciated that the order of operations 402 and 406 may be reversed, such that co-reactant is introduced first in a particular cycle with purges optionally separating the metal-containing precursor and co-reactant doses. In operation 410, it is determined whether the nucleation layer has been deposited to an adequate thickness or to a preset number of cycles. If not, operations 402-408 are repeated.

After the nucleation layer is deposited to an adequate thickness, in operation 480, bulk metal is deposited as described below. In various embodiments, operation 280 may be performed at a pressure greater than the pressure during operations 202-210. For example, operation 280 may be performed at a pressure greater than or equal to about 10 Torr, for example about 10 Torr, or about 40 Torr, for a tungsten bulk layer. In some embodiments, the pressure during both the nucleation layer and bulk layer deposition may be about 5-20 Torr, or 10 Torr. In other embodiments, the same pressure may be used and/or a lower pressure may be used in operation 280. For molybdenum deposition, the pressure may be about 10-60 Torr in some embodiments, or 30-60 Torr.

FIG. 4B provides a process flow diagram for operations that may be performed during operation 480. Note that operations of FIG. 4B may be performed without performing operations of FIG. 4A. That is, in some embodiments, the method of FIG. 4B may be performed without first depositing a nucleation layer. FIG. 4C provides a timing sequence diagram depicting examples cycles of ALD in a process 400.

In FIG. 4B, in operation 482, the substrate is exposed to a co-reactant. In some embodiments, this is a reducing agent, such as $H_2$, which may be pulsed without flowing another reactant. While the co-reactant pulse is described as being the first pulse in the cycle defined by operations 482-488, in some embodiments, the order of operations 482 and 486 may be reversed such that the metal-containing precursor may be first. Operation 482 may involve adsorption of $H_2$ molecules on the surface and/or reaction with metal-containing precursor molecules to form a monolayer of sub-monolayer of film.

In some embodiments, a carrier gas may be flowed. The carrier gas may be any of those described above with respect to operation 404 in FIG. 4A. Operation 482 may be performed for any suitable duration. In some examples, Example durations include between about 0.25 seconds and about 30 seconds, about 0.25 seconds to about 5 seconds, or about 0.5 seconds to about 3 seconds.

Returning to FIG. 4B, in operation 484, the chamber is purged. This purge operation may remove excess co-reactant that remained in gas phase. As described above, a purge may conducted by flowing an inert gas at a fixed pressure thereby reducing the pressure of the chamber and re-pressurizing the chamber before initiating another gas exposure. The chamber may be purged for any suitable duration, for example, for a duration between about 0.1 seconds and about 3 seconds.

In operation 486, the substrate is exposed to a metal-containing precursor. This may form a sub-monolayer or monolayer of film on the substrate. In various embodiments, the metal-containing precursor is flowed to the chamber during this operation for a duration between about 0.1 seconds and about 3 seconds, or about 0.5 seconds. In some embodiments, the metal-containing precursor may be diverted to fill the gas line and line change before dosing.

Examples of metal precursors include tungsten hexafluoride ($WF_6$), tungsten chlorides ($WCl_x$) including tungsten hexachloride ($WCl_6$), tungsten pentachloride ($WCl_5$), tungsten tetrachloride ($WCl_4$), tungsten dichloride ($WCl_2$), and tungsten oxychlorides ($WO_xCl_y$) such as tungsten oxytetrachloride ($WOCl_4$) and tungsten dichloride dioxide ($WO_2Cl_2$). Further examples include tungsten hexacarbonyl $W(CO)_6$ and organo-tungsten precursors such as MDNOW (methylcyclopentadienyl-dicarbonylnitrosyl-tungsten) and EDNOW (ethylcyclopentadienyl-dicarbonylnitrosyl-tungsten). Further examples include molybdenum-containing precursors such as molybdenum halides and molybdenum oxyhalides. Examples of molybdenum halides include molybdenum pentachloride ($MoCl_5$) and molybdenum hexachloride ($MoCl_6$). Examples of molybdenum oxyhalides include molybdenum dichloride dioxide ($MoO_2Cl_2$) and molybdenum oxytetrachloride ($MoOCl_4$).

In operation 488 of FIG. 4B, the chamber is purged to remove reacted byproducts and gas phase metal-containing precursor from the chamber. In some embodiments, the purge duration is between about 0.1 seconds and about 2 seconds.

In operation 490 of FIG. 4B, it is determined whether bulk metal has been deposited to an adequate thickness or a preset number of cycles is complete. If not, operations 482-488 are repeated until a desired thickness is deposited. In some embodiments, operations 482-488 are repeated until a feature is filled.

The metal-containing precursor used in operation 480 may be the same or different than the one used for nucleation layer deposition. If different, it may contain the same or a different metal, e.g., a tungsten bulk layer may be deposited on a tungsten nucleation layer in some embodiments or on a molybdenum nucleation layer in some embodiments.

The methods involve co-flowing nitrogen ($N_2$) with the metal-containing precursor in ALD cycles, e.g., operation 402 in FIG. 4A and/or 486 in FIG. 4B. FIG. 4C provides a timing sequence diagram depicting examples cycles of ALD using $H_2$ reducing agent and a metal-containing precursor in a process 400. The timing sequence diagram is similar to that in FIG. 4B and includes co-flowing $N_2$ during the metal-precursor dose. In particular, FIG. 4C shows H$_2$ dose 420A in deposition cycle 411A which may correspond with operation 482 of FIG. 4B. During a H$_2$ dose 420A, a carrier gas may be flowed, the H$_2$ reducing agent is pulsed, and metal-containing precursor and N$_2$ flows are turned off. This may be followed by purge phase 440A. The deposition cycle 411A further includes a metal-containing precursor+N$_2$ doses 460A and a purge phase 470A. As shown in FIG. 4C, during purge phase 440A and 470A, the carrier gas is flowed with the other flows turned off. These operations are repeated as shown at 420B, 440B, 460B, and 470B, in the subsequent deposition cycle.

The magnitude of each dose in FIG. 4C is roughly the same for illustrative purposes. The Ar or other carrier gas can have the highest flow rate.

While the carrier gas is depicted as constant throughout the process, it may be independently provided with the H$_2$ flow and/or the metal-containing precursor-N$_2$ co-flows. For example, H$_2$ (or other co-reactant) may be provided in doses 420A and 420B with no carrier gas flow.

In some embodiments, N$_2$ may be flowed during the H$_2$ dose phases 420A and 420B and/or during the purge phase 440A and 440B in addition to the during the metal-containing precursor doses.

Figure 5:
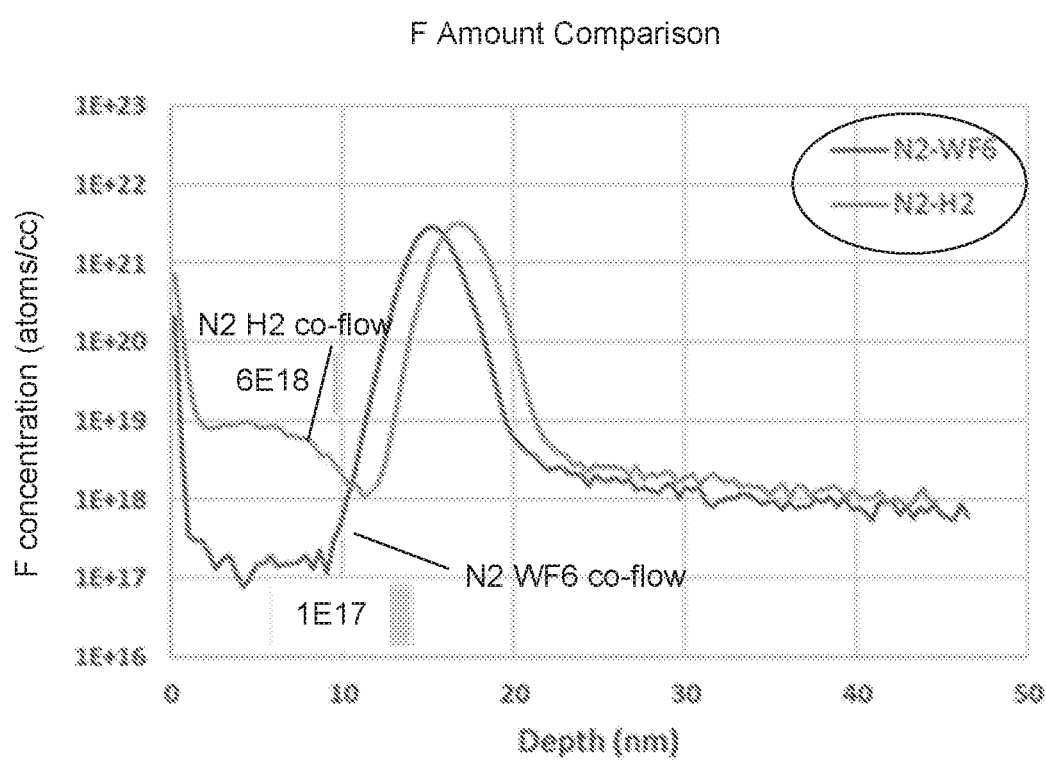
FIG. 5 depicts a comparison of fluorine concentration in atoms/cc for a deposited tungsten film.

In some embodiments, the metal-containing precursor is a fluorine-containing precursor, such as WF$_6$. By co-flowing N$_2$ with the fluorine-containing precursor, the fluorine concentration in the metal layer is reduced. FIG. 5 shows a comparison of F concentration in atoms/cc for a tungsten film deposited by the following processes:

N2 H2 co-flow: N$_2$+H$_2$/purge/WF$_6$/purge
N2 WF6 co-flow: H$_2$/purge/N$_2$+WF$_6$/purge In particular, the concentration at 1-10 nm shows the F content in the deposited film, and is over an order of magnitude lower for the N2 WF6 co-flow process as for the N2 H2 co flow process ($1\times10^{17}$ vs $6\times10^{18}$).

In addition, lower resistivity is achieved, with the resistivity improved by about 10% over the N2 H2 co-flow for a 200 Å film.

In some embodiments, consumption of the metal-containing precursor is reduced. Metal-containing precursor consumption in the N2 WF6 co-flow process described above was 17% less than the N2 H2 co-flow.

In some embodiments, deposition rate and throughput is improved. Deposition rate for the N2 WF6 co-flow was 30% higher than for the N2 H2 co-flow despite the amount of WF6 being constant for both processes (300 sccm). In some embodiments, roughness is significantly reduced by co-flowing N$_2$ with the metal-containing precursor.

ALD deposition of a bulk layer may lead to high stress films. This can be mitigated by using high temperatures, however, high temperatures can lead to poor fill. In some embodiments, low stress films may be deposited by the methods described herein by co-flowing N$_2$ with the metal-containing precursor. Temperature during ALD of tungsten may be between 200° C. and 550° C., e.g., between 300° C. and 450° C. Temperature during ALD of molybdenum may be between 450° C. and 800° C., e.g., between 600° C. and 750° C.

In some embodiments, the deposition may be preceded by a nitrogen-containing soak, and in particular, a NH3 soak.
Experimental A high temperature ALD process was used to deposit Mo in a liner-free 3D NAND structure. Mo was deposited on Al$_2$O$_3$.

| Ped Temp (° C.) | NH3 soak | N2 co-flow | Growth Rate (Angstroms/cycle) | Nucleation Delay (cycles |
|---|---|---|---|---|
| 650 | No | No | 0.74 | 41 |
| 650 | No | Yes | 0.63 | 21 |
| 650 | Yes | No | 0.66 | 23 |
| 650 | Yes | Yes | 0.58 | 0 |

The lowest roughness was observed for the NH3/N2 co-flow process, with the highest roughness observed for the no soak/no co-flow process.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. In some embodiments, atomic layer deposition (ALD) may be performed at a first station that is one of two, five, or even more deposition stations positioned within a single deposition chamber. Thus, for example, hydrogen (H$_2$) and tungsten hexafluoride (WF$_6$) or other metal-containing precursor may be introduced in alternating pulses to the surface of the semiconductor substrate, at the first station, using an individual gas supply system that creates a localized atmosphere at the substrate surface. Another station may be used for tungsten bulk layer deposition. Two or more stations may be used to deposit tungsten in parallel processing. Alternatively a wafer may be indexed to have operations performed over two or more stations sequentially.

Figure 6:
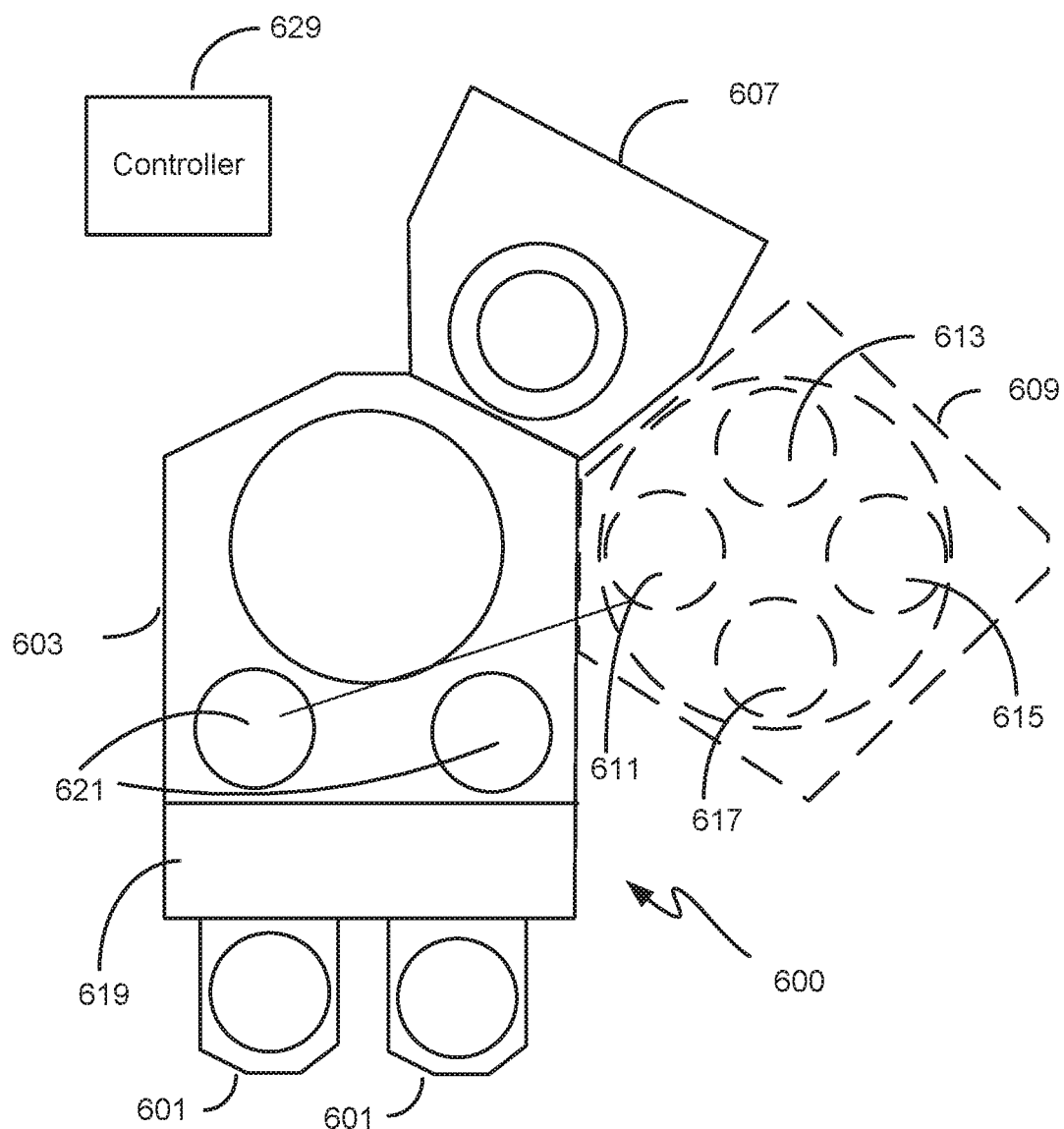
FIG. 6 depicts a schematic of a process system suitable for conducting deposition processes in accordance with embodiments.

FIG. 6 is a schematic of a process system suitable for conducting deposition processes in accordance with embodiments. The system 600 includes a transfer module 603. The transfer module 603 provides a clean, pressurized environment to minimize risk of contamination of substrates being processed as they are moved between various reactor modules. Mounted on the transfer module 603 is a multi-station reactor 609 capable of performing ALD and CVD according to various embodiments. Multi-station reactor 609 may include multiple stations 611, 613, 615, and 617 that may sequentially perform operations in accordance with disclosed embodiments. For example, multi-station reactor 609 may be configured such that station 611 performs a nucleation layer deposition using a metal halide or metal oxyhalide and station 613 performs an ALD bulk deposition operation according to various embodiments.

Figure 7:
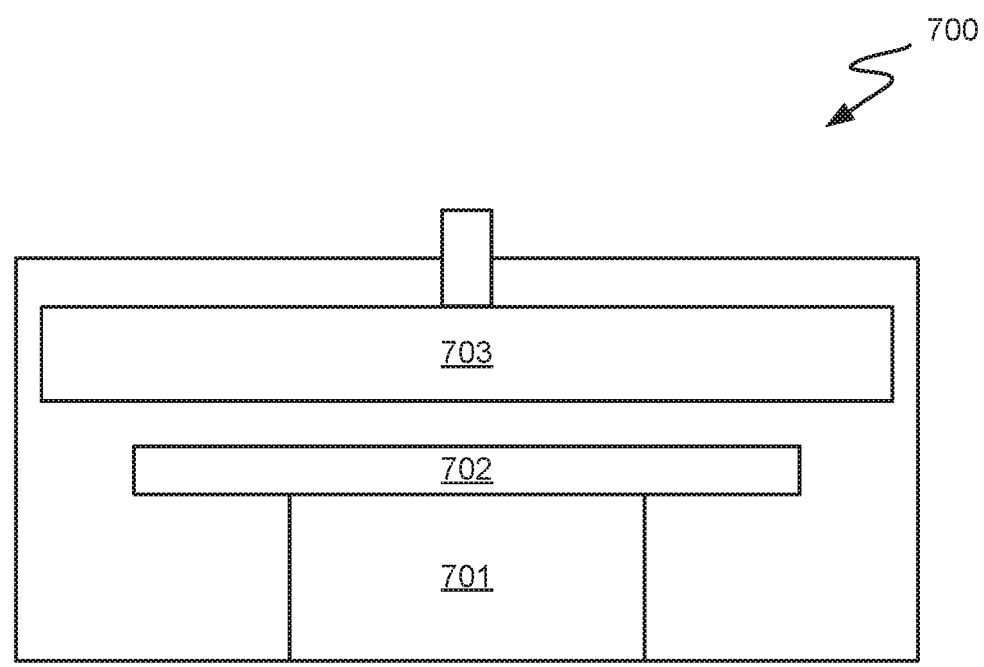
FIG. 7 depicts an example deposition station.

Stations may include a heated pedestal or substrate support, one or more gas inlets or showerhead or dispersion plate. An example of a deposition station 700 is depicted in FIG. 7, including substrate support 702 and showerhead 703. A heater may be provided in pedestal portion 701.

Returning to FIG. 6, also mounted on the transfer module 503 may be one or more single or multi-station modules 607 capable of performing plasma or chemical (non-plasma) pre-cleans, other deposition operations, or etch operations. The module may also be used for various treatments to, for example, prepare a substrate for a deposition process. The system 600 also includes one or more wafer source modules 601, where wafers are stored before and after processing. An atmospheric robot (not shown) in the atmospheric transfer chamber 619 may first remove wafers from the source modules 601 to loadlocks 621. A wafer transfer device (generally a robot arm unit) in the transfer module 603 moves the wafers from loadlocks 621 to and among the modules mounted on the transfer module 603.

In various embodiments, a system controller 629 is employed to control process conditions during deposition. The controller 629 will typically include one or more memory devices and one or more processors. A processor may include a CPU or computer, analog and/or digital input/output connections, stepper motor controller boards, etc.

The controller 629 may control all of the activities of the deposition apparatus. The system controller 629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 629 may be employed in some embodiments.

Typically there will be a user interface associated with the controller 629. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 629. The signals for controlling the process are output on the analog and digital output connections of the deposition apparatus 600.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 629, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 629, in some implementations, may be a part of or coupled to a computer that is integrated with, coupled to the system, otherwise networked to the system, or a combination thereof. For example, the controller 629 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 629 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

Figure 8:
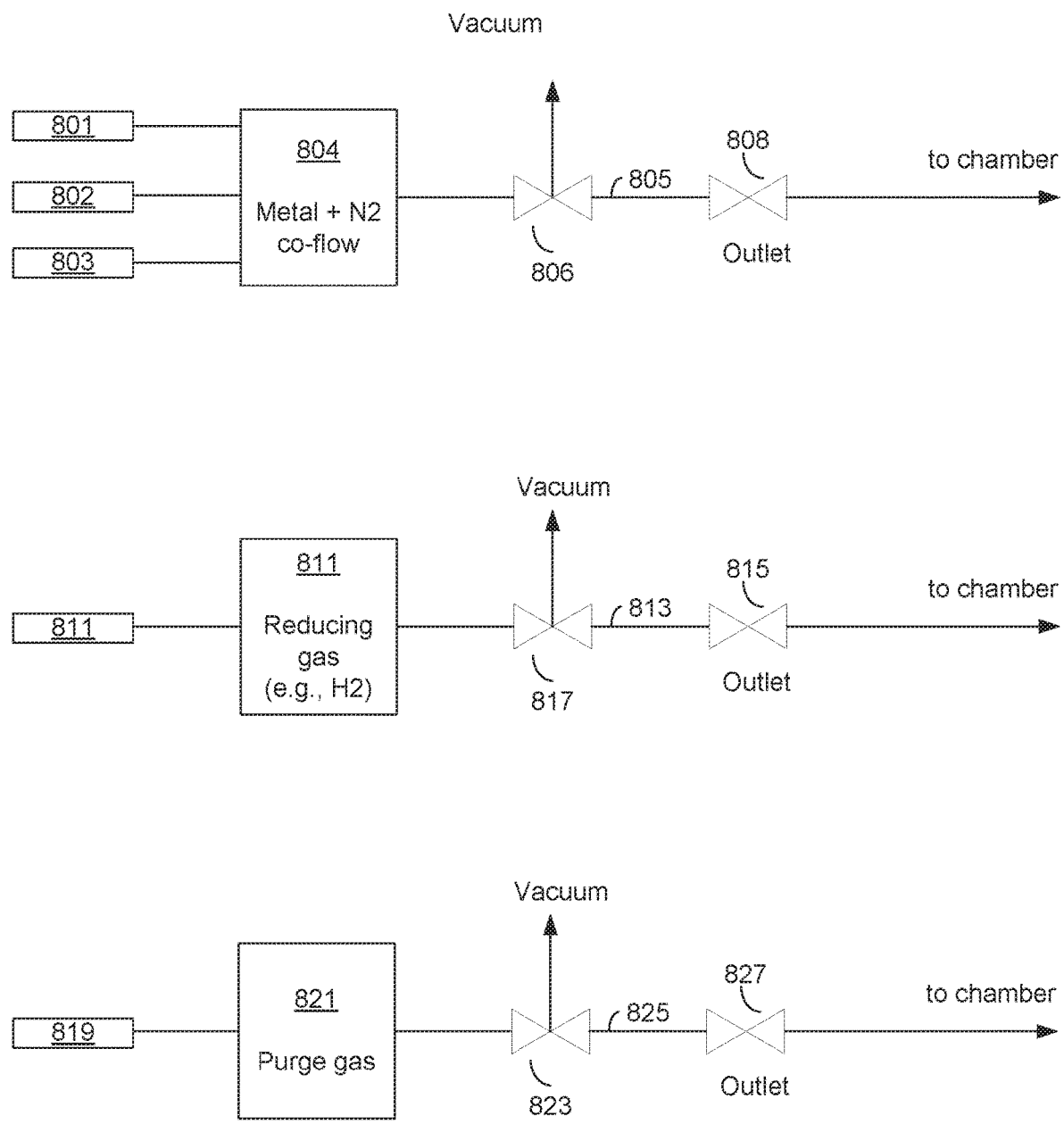
FIG. 8 depicts an example gas manifold system schematic.

The apparatus may include a gas manifold system, which provides line charges to the various gas distribution lines as shown schematically in FIG. 8. Manifold 804 has inputs from a source 801 of a metal-containing precursor gas, a source 802 of nitrogen ($N_2$), and a source 803 of argon (Ar) or other carrier gas. Manifold 811 has an input 809 from a source of hydrogen ($H_2$) or other reducing gas (not shown). As described above, there may or may not be an input from a carrier gas to manifold 811. Manifold 821 has an input from a source of inert purge gas 819. The manifolds 804, 811 and 821 provide the metal-containing precursor gas and $N_2$ co-flow gas, co-reactant gas, and purge gas to the deposition chamber through valved distribution lines, 805, 813 and 825 respectively. The various valves may be opened or closed to provide a line charge, i.e., to pressurize the distribution lines. For example, to pressurize distribution line 805, valve 806 is closed to vacuum and valve 808 is closed. After a suitable increment of time, valve 808 is opened and the co-flow gas is delivered to the chamber. After a suitable time for delivery of the gas, valve 808 is closed. The chamber can then be purged to a vacuum by opening of valve 806 to vacuum.

Similar processes can be used to deliver the reducing gas and the purge gas. To introduce the reducing gas, for example, distribution line 813 is charged by closing valve 815 and closing valve 817 to vacuum. Opening of valve 815 allows for delivery of the reducing gas to the chamber. Similarly, to introduce the purge gas, distribution line 825 is charged by closing valve 827 and closing valve 823 to vacuum. Opening of valve 827 allows for delivery of the argon or other inert purge gas to the chamber. The amount of time allowed for line charges changes the amount and timing of the initial delivery of the gas.

FIG. 8 also shows vacuum pumps in which valves 806, 817 and 823, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

Note that the processes described above may require precise timing of valves and mass flow controllers (MFCs) supplying pulses of reagent to the semiconductor substrate during deposition. In one way to make this possible, valve and MFC commands are delivered to embedded digital input-output controllers (IOC) in discrete packets of information containing instructions for all time-critical commands for all or a part of a deposition sequence. The ALTUS systems of Lam Research provide at least one IOC sequence. The IOCs can be physically located at various points in the apparatus; e.g., within the process module or on a stand-alone power rack standing some distance away from the process module. There may be multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, ALD to run at station 1-2 with all timing controlled for all the hardware components needed to deposit a ALD nucleation layer at those stations. A second sequence might be running concurrently to deposit a bulk metal using the timing sequence described above at other deposition stations in the same module. The relative timing of the devices controlling the delivery of reagents to stations 3-4 is important within that group of devices, but the relative timing of the ALD process at stations 1-2 can be offset from the relative timing of stations 3-4. An IOC translates the information in a packetized sequence and delivers digital or analog command signals directly to MFC or pneumatic solenoid banks controlling the valves.

A pulse of metal-containing precursor gas may be generated as follows. Initially, the system diverts $WF_6$ to a vacuum pump for a period of time while the MFC or other flow-controlling device stabilizes. This may be done for a period of between about 0.5 to 5 seconds in one example. Next, the system pressurizes the tungsten gas delivery manifold by closing both the divert outlet 606 and the outlet 608 to the deposition chamber. This may be done for a period of between about 0.1 and 5 seconds, for example, to create an initial burst of reagent when the outlet to the deposition chamber is opened. This is accomplished by opening outlet valve 808 for between about 0.1 and 10 seconds in one example. Thereafter, the tungsten-containing gas is purged from the deposition chamber using a suitable purge gas. The pulsed flow of other reagents may be done in a similar manner.

As indicated above, in some embodiments, the apparatus described herein may include a low-volume showerhead. In semiconductor processing equipment, a showerhead is often used to distribute process gases across a semiconductor substrate. A showerhead may include a plenum volume that is bounded by a back plate and a faceplate with a plurality of gas distribution holes that lead to the outside of the showerhead. The faceplate faces a substrate reaction area within a semiconductor processing chamber or other reaction chamber, and substrates are placed beneath the faceplate within the semiconductor processing chamber, such as on a pedestal that supports the wafer.

Reactants used in deposition processes may be expensive and reducing their consumption reduces costs associated with processing each wafer. Various processing steps may also have minimum completion times and reducing some of these times, such as the time for purging a showerhead between process steps in an ALD deposition cycle as described above, may increase throughput. Increasing flow uniformity in delivery of reactants in the vapor phase may improve the uniformity of deposited films. This particularly during the dosing and, if performed, plasma operations. However, increasing purge flow uniformity within the showerhead may also improve film uniformity by more effectively purging the showerhead and removing unwanted gases (including those that may react) in the showerhead.

The low-volume showerhead may include external geometry that is configured to reduce the gap between the showerhead and the pedestal (hereinafter referred to as "the gap" or "the showerhead-pedestal gap"). Reducing this gap reduces gas consumption and improves uniformity of deposited films. Some pedestals may position a substrate within a cavity that is partially defined by a substrate support surface, on which the substrate is positioned, and an outer wall that extends around and above the substrate support surface. This external geometry of the showerhead may enable a portion of the showerhead to be positioned within this pedestal cavity. In some embodiments, the external geometry may include sizing an outer diameter of a front surface of the showerhead that faces a wafer and includes through-holes for distributing gas onto the wafer smaller than an inner diameter of the pedestal outer wall; the external geometry may also include an outer conical frustum surface, e.g., a chamfer, that extends around the showerhead front surface and provides clearance between the showerhead and the outer wall to further enable the front surface to be positioned within the pedestal cavity.

In some embodiments, the showerhead may be configured to have one or more sensors to measure aspects of the chamber. The showerhead may have a port with an opening in the faceplate, and a window positioned adjacent to, or at one end of, the port and a sensor positioned adjacent to the window that can detect aspects outside the showerhead through the window, port, and opening. For example, the port may be positioned over the pedestal and a sensor having a laser may be positioned within the showerhead such that the laser can emit a beam through the window, port, and opening onto the pedestal in order to measure the distance between the showerhead and the pedestal. In some instances, the pedestal may be configured to move in numerous directions, including the vertical, horizontal (e.g., both x and y directions), as well as angular rotation about one or more axes, and tilt movement about a point. The pedestal may be adjusted based on measurements provided by the sensors of the showerhead in order to align the pedestal and showerhead, including making the pedestal support surface parallel, or closer to parallel, with the front surface of the showerhead.

The showerhead described herein may be considered a low volume showerhead such that it has an internal plenum volume that is equal to or less than 250 milliliters, including about 214 milliliters. In comparison, most traditional showerheads have a total internal volume greater than 500 milliliters.

In general, there are two main types of showerheads: a chandelier type and a flush mount type. A chandelier type showerhead has a stem attached to the top of the chamber on one end and a faceplate or a back plate on the other end. A part of the stem may protrude from the chamber top for connecting gas lines and RF power. A flush mount showerhead type is integrated into the top of a chamber and typically does not have a stem. While the depicted drawings generally refer to flush mount type showerheads, it should be understood that the present disclosure can apply to chandelier type showerheads as well. Further, while the showerheads described herein may be implemented to perform thermal or plasma-enhanced ALD processes, they also may implemented in other processing techniques where reactant consumption and processing uniformity are of concern. These including chemical vapor deposition (CVD), plasma-enhanced CVD, and etching including atomic layer etching (ALE) processes.

Figure 9:
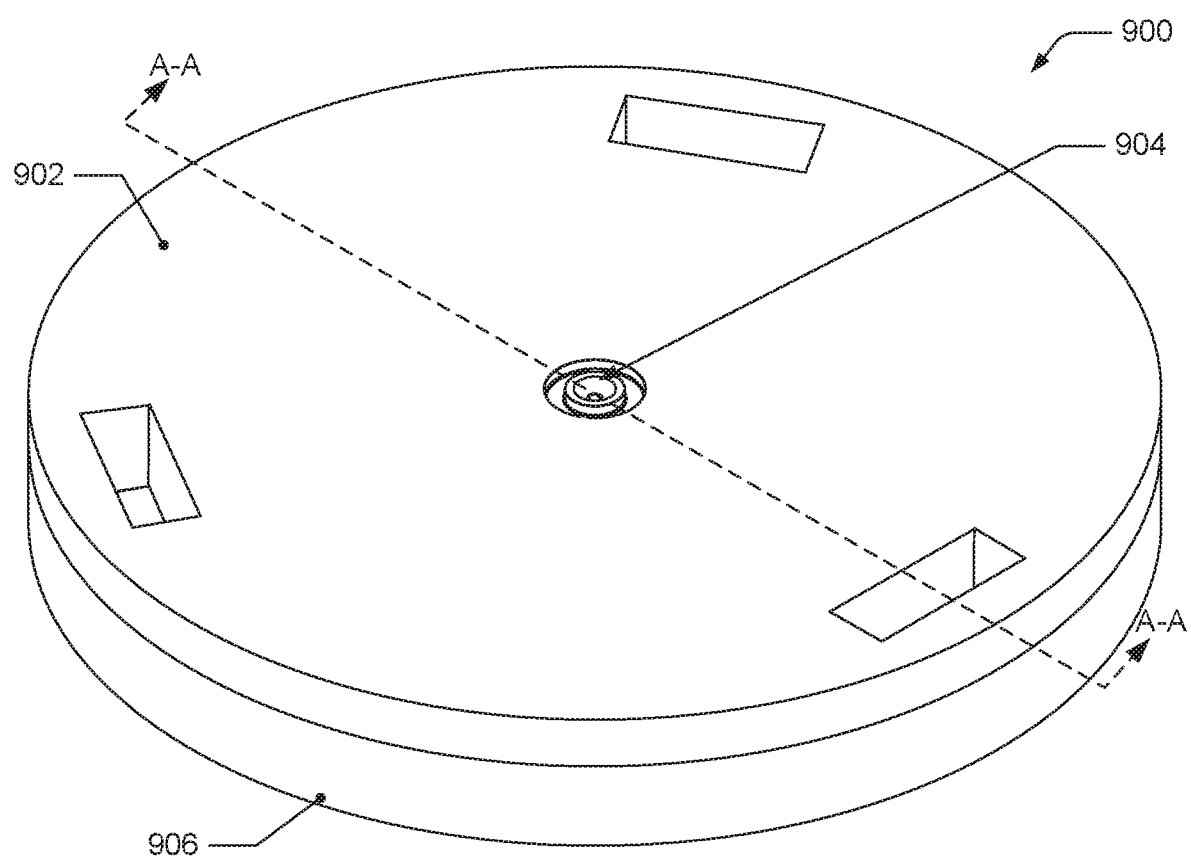
FIG. 9 depicts an isometric view of an example showerhead according to disclosed embodiments.

FIG. 9 depicts an isometric view of an example showerhead according to disclosed embodiments. In this Figure, the showerhead 900 includes a back plate 902 with a gas inlet 904, and a faceplate 906 connected to the back plate 902.

FIG. 10 depicts a cross-sectional side view of the showerhead of FIG. 9; this cross-sectional view is taken along section line A-A in FIG. 9. The back plate 902 and faceplate 906 together partially define a plenum volume 908 within the showerhead 900, and a baffle plate 910 is positioned within the plenum. The back plate 102 and the faceplate 104 may be positioned opposite one another within the showerhead such that they have surfaces that face each other. Generally, the first surface of the plenum volume 130 can have a diameter that is similar or substantially similar to a diameter of a substrate for which the showerhead is configured for use. The faceplate 906 includes a back surface 912 that partially defines the plenum volume 908 and faces the back plate 902, and a front surface 914 that is configured to face a substrate positioned within the processing chamber. The faceplate 906 also includes a plurality of through-holes 916 (one is identified in FIG. 10) that extend through the faceplate 906 from the back surface 912 to the front surface 914 and allow fluid to travel from the plenum volume 908 to outside of the showerhead 902 and onto a substrate.

As further seen in FIG. 10, the faceplate 906 is underneath and connected to the back plate 902, and one through-hole 916 passes through the faceplate 906 from the back surface 912 to the front surface 914. The arrangement and configuration of these through-holes 916 are described in more detail below. The plenum volume 908 is fluidically connected to the gas inlet 904 and the through-holes 916 such that fluid may flow through the gas inlet 904 into the plenum volume 908 and through the faceplate 906 via the through-holes 916. The plenum volume may be supplied with a gas, such as reactant gas or purge gas, via the gas inlet. The gas inlet may be connected to a gas supply or supplies for delivery of the gas. The gas inlet can include a stem (not shown).

Figure 11B:
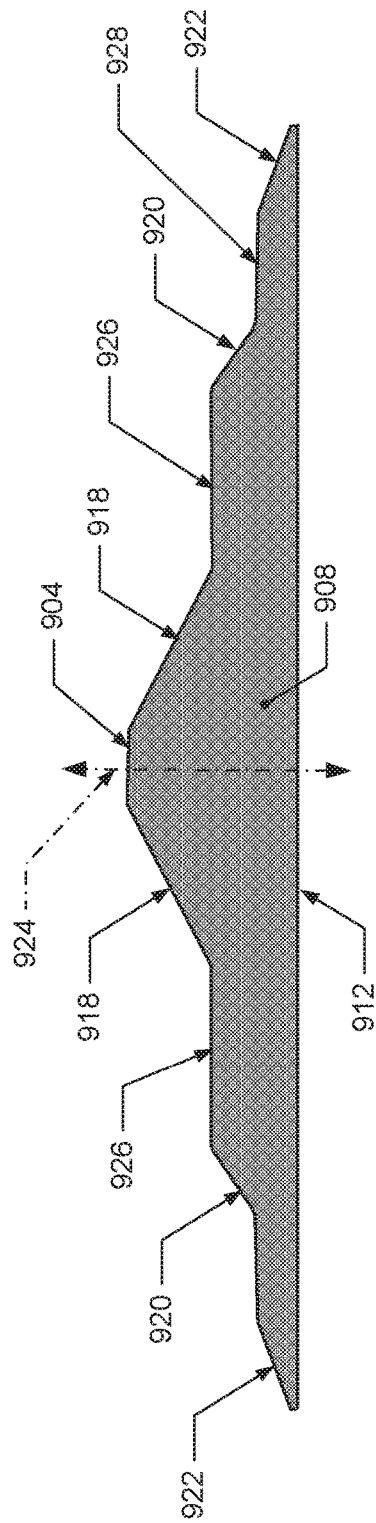
FIG. 11B depicts a cross-sectional slice through the center axis of the showerhead of only a plenum volume.
Figure 11C:
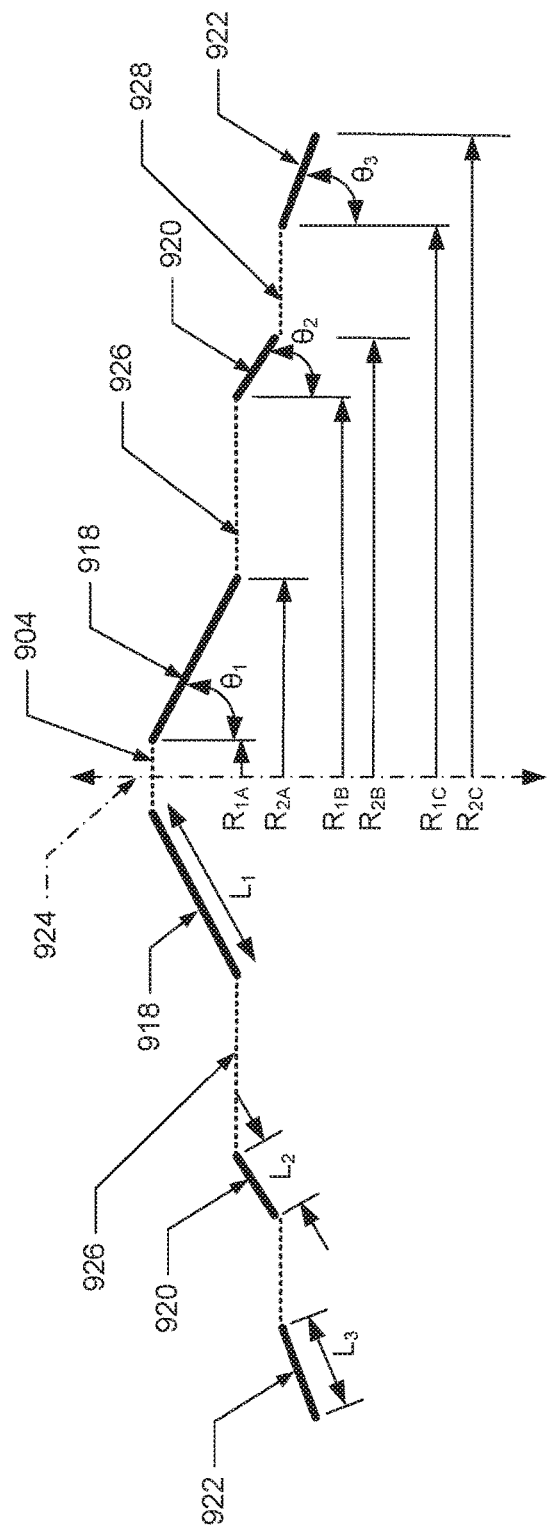
FIG. 11C depicts a cross-sectional side view of a partial profile of the back plate.
Figure 11D:
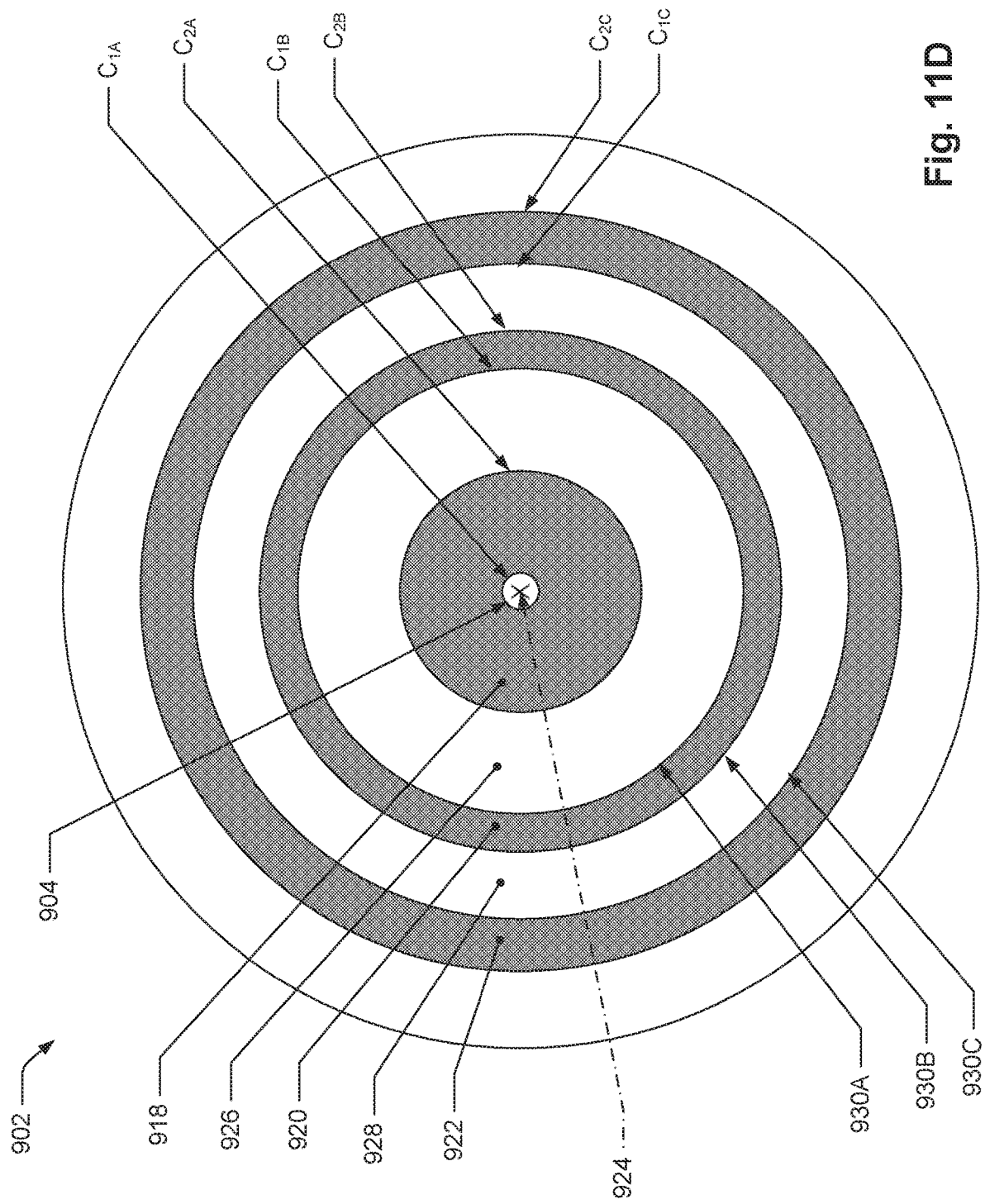
FIG. 11D depicts a plan view of the underside of the back plate.
Figure 11E:
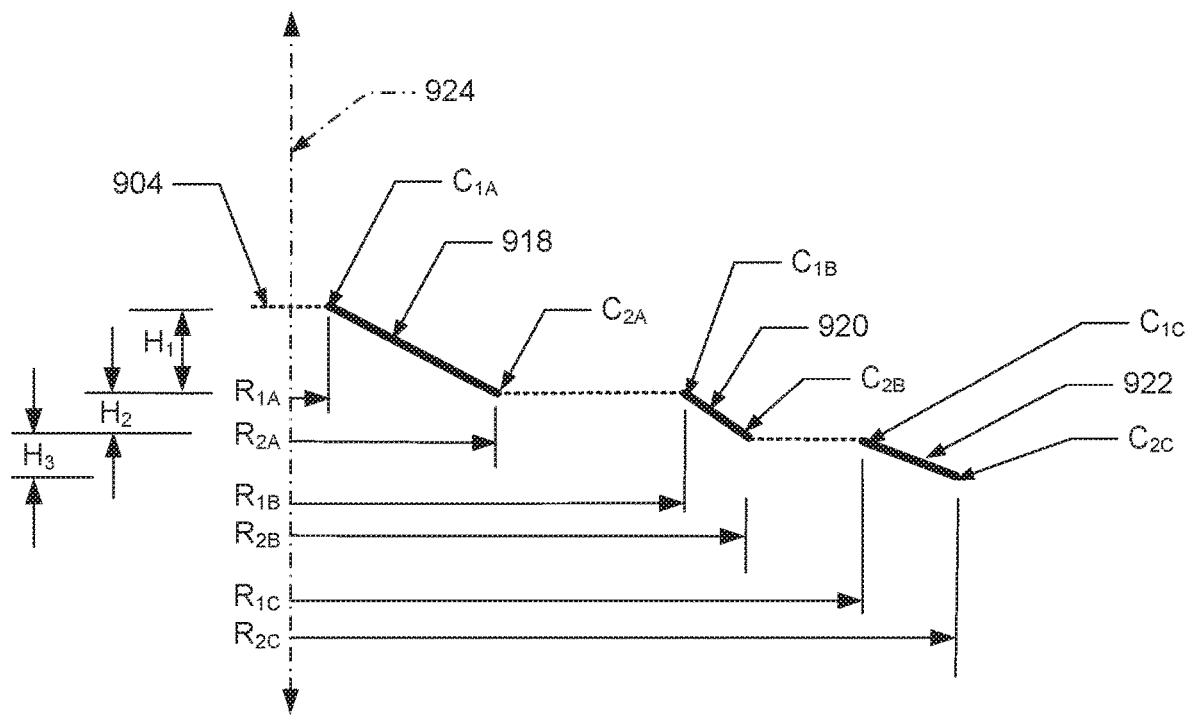
FIG. 11E depicts the surfaces of the right side of FIG. 11C.

The plenum volume is further described using FIGS. 11A-11E. In FIG. 11A, the cross-sectional view of FIG. 10 is depicted with the plenum volume 908 depicted in dark shading, but for illustration and clarity purposes, the baffle plate 906 has been removed along with the cross-hatching of the faceplate 906 and the back plate 902. In FIG. 11B, a cross-sectional slice through the center axis of the showerhead of only the plenum volume is depicted. The back surface 914 of the faceplate 906 partially defines the plenum volume 908, as seen in FIGS. 11A and 11B. In some embodiments, as illustrated in FIGS. 10 through 11E, the back plate 902 includes a plurality of surfaces that also partially define the plenum volume 908; this plurality of surfaces may include one or more conical frustum surfaces.

Figure 12:
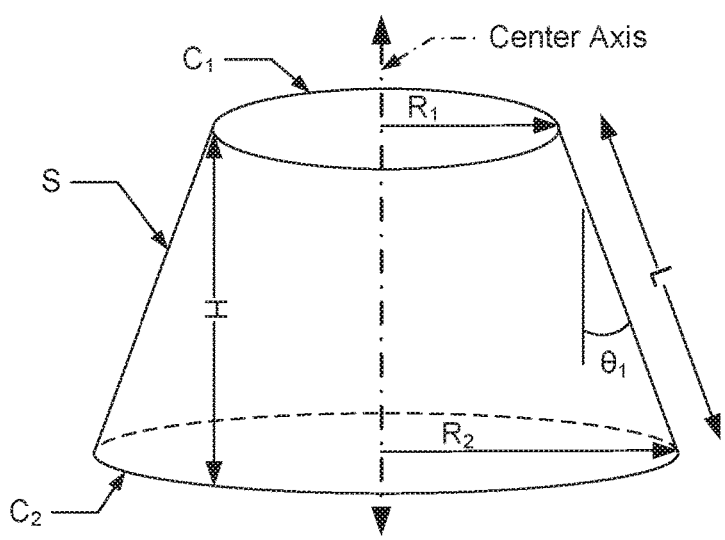
FIG. 12 depicts an illustrative conical frustum surface.

A conical frustum surface is a conical surface without the pointed end; a plane perpendicular to the base of the conical frustum slices or cuts off the point. FIG. 12 depicts an illustrative conical frustum surface. As can be seen, the conical frustum surface, S, is defined by a first circumference $C_1$ having a first radius, $R_1$ and a second circumference $C_2$ having a second radius $R_2$ that is larger than the first radius $R_1$; the two circumferences are offset from each other by a height H. The length, L, of the conical frustum surface spans between the first and second circumferences $C_1$ and $C_2$. The conical frustum surface also has a center axis and the conical frustum surface is offset from the center axis by a first angle $\theta_1$.

In some embodiments, as shown in FIGS. 9-11E, the back plate may include three conical frustum surfaces. The description herein is not limited to only three conical frustum surfaces; in some embodiments the back plate may have two conical frustum surfaces and in other embodiments may have more than three conical frustum surfaces. FIG. 11B identifies two slices of a first conical frustum surface 918, two slices of a second conical frustum surface 920, and two slices of a third conical frustum surface 922. FIG. 11C depicts a cross-sectional side view of a partial profile of the back plate. Here, the profile shows the two slices of each of the three conical frustum surface 918, 920, and 922, respectively, identified in FIG. 11B with heavy bolded lines, with other surfaces of the back plate depicted in dotted lines. Each of the three conical frustum surfaces 918, 920, and 922 have a length, $L_1$, $L_2$, and $L_3$, respectively, and are also offset by a first angle $\theta_1$, a second angle $\theta_2$, and a third angle $\theta_3$, respectively, from the center axis 924 of the showerhead as shown in FIG. 11C. The inner and outer radiuses of each conical frustum surface are also depicted in FIG. 11C; the first conical frustum surface 918 has inner radius $R_{1A}$ and outer radius $R_{2A}$, the second conical frustum surface 920 has inner radius $R_{1B}$, and outer radius $R_{2B}$, and the third conical frustum surface 922 has inner radius $R_{1C}$, and outer radius $R_{2C}$.

FIG. 11D depicts a plan view of the underside of the back plate 902. The three conical frustum surfaces 918, 920, and 922 are identified with shading. These three conical frustum surfaces extend fully around the center axis 924 (marked with an "X") of the back plate 902; the center axis of each of these conical frustum surfaces are collinear with each other and with the center axis 924 of the back plate 902. Each of these three conical frustum surfaces have a first circumference defined by that surface's inner radius, and a second circumference defined by that surface's larger outer radius, thereby making the second circumference larger than the first circumference. FIG. 11D includes identification of the first circumference $C_{1A}$ and the second circumference $C_{2A}$ of the first conical frustum surface 918, the first circumference $C_{1B}$ and the second circumference $C_{2B}$ of the second conical frustum surface 920, and the first circumference $C_{1C}$ and the second circumference $C_{2C}$ of the third conical frustum surface 922.

In some embodiments, as illustrated in FIGS. 11B-11E, the conical frustum surfaces of the back plate may be positioned radially outwards from, and around, the gas inlet 904; these surfaces may also be spaced at various radial positions and spacing from the center axis of the back plate. In FIGS. 11B-11E, the first conical frustum surface 918 is seen adjacent to the gas inlet 904 and in some instances, the inner radius of the first conical frustum surface may form a boundary of the gas inlet 904. The second conical frustum surface 920 is radially offset outwards from, with respect to the center axis 924 of the back plate 902, the first conical frustum surface 918 such that the first conical frustum surface 918 is interposed between the gas inlet 904 and the second conical frustum surface 920, such as when viewed along the center axis and viewed as a cross-sectional and perpendicular to the center axis as depicted in FIGS. 11B-11E. In some such embodiments, the outer radius $R_{1B}$ of the first conical frustum surface 918 is smaller than the inner radius $R_{2A}$ of the second conical frustum surface 920.

In some embodiments, another surface or surfaces may span between the first and second conical frustum surfaces 918 and 920. For example, as seen in FIG. 11B, a surface 926 (not shaded) spans between the outer radius $R_{2A}$ of the first conical frustum surface 918 and the inner radius $R_{1B}$ of the second conical frustum surface 920. In some instances, this surface may include one or more portions that are planar and perpendicular to the center axis 924 of the back plate 902. This perpendicularity may not be exact and may be considered substantially perpendicular because of manufacturing tolerances and imperfections, for example. This surface 926 may also include one or more curved portions in order to create a smooth transition between a planar surface and a conical frustum surface in order to enable smooth fluid flow along these surfaces. This surface is also seen in FIG. 11C.

In some other embodiments, although not depicted in FIGS. 9-11E, the first and second conical frustum surfaces 918 and 920 may be immediately adjacent to each other such that the outer radius $R_{2B}$ of the first conical frustum surface 918 is the same as the inner radius $R_{1B}$ of the second conical frustum surface 920. In some such instances, the second circumference $C_{2A}$ of the first conical frustum surface 918 may be the same as the first circumference $C_{1B}$ of the second conical frustum surface 920.

Referring back to FIGS. 11B-11E, the third conical frustum surface 922 may be positioned radially outwards from, with respect to the center axis 924 of the back plate 902, the second conical frustum surface 920 such that the second conical frustum surface 920 is interposed between the first conical frustum surface 918 and the third frustum surface 922 when viewed along the center axis 924, or viewed as a cross-sectional and perpendicular to the center axis as depicted in FIGS. 11C and 11E. In some such embodiments, as seen in FIG. 11D, the outer radius $R_{2B}$ of the second conical frustum surface 920 is smaller than the inner radius $R_{1C}$ of the third conical frustum surface 922. Similar to above, in some embodiments, another surface 928 may span between the second and third conical frustum surfaces 920, 922. This other surface may have one or more planar portions that are perpendicular to the center axis 924, as with surface 926, and it may also include one or more curved surfaces that connect with the conical frustum surfaces in order to enable smooth flow along these surfaces. Example curved surfaces 930A, 930B, and 930C are shown in FIGS. 11C and 11D.

In some embodiments, the conical frustum surfaces of the back plate may be vertically offset from each other along the center axis of the back plate. In some instances, the first conical frustum surface may be positioned along the center axis closest to, or adjacent to, the gas inlet as well as positioned along the center axis at the same position as the gas inlet. In FIG. 11E, which depicts the surfaces of right side of FIG. 11C, the vertical offsets of the surfaces are indicated. Here, the first circumference $C_{1A}$ of the first conical frustum surface 918 is positioned along the center axis 924 at the same position as the gas inlet 904. The second circumference $C_{2A}$ of the first conical frustum surface 918 is offset along the center axis 924 by the first height, $H_1$. The second conical frustum surface may be vertically offset along the center axis farther from the gas inlet than the first conical frustum surface. In some such instances, the second circumference of the first conical frustum surface may be at the same position along the center axis as the first circumference of the second conical frustum surface; in other embodiments, the first circumference of the second conical frustum surface may be offset away from the gas inlet along the center axis more than the second circumference of the first conical frustum surface. In FIG. 11E, the first circumference $C_{1B}$ of the second conical frustum surface 920 is positioned along the center axis 924 at the same position as the second circumference $C_{2A}$ of the first conical frustum surface 918. The second circumference $C_{2B}$ of the second conical frustum surface 920 is offset along the center axis 924 by the second height, $H_2$. In some such embodiments, the first conical frustum surface may be considered interposed along the center axis between the gas inlet and the second conical frustum surface.

Similarly, the third conical frustum surface may be vertically offset along the center axis farther from the gas inlet than the first and second conical frustum surfaces. In some such instances, the second circumference of the second conical frustum surface may be at the same position along the center axis as the first circumference of the third conical frustum surface; in other embodiments, the first circumference of the third conical frustum surface may be offset away from the gas inlet along the center axis more than the second circumference of the second conical frustum surface. In FIG. 11E, the first circumference $C_{1C}$ of the third conical frustum surface 922 is positioned along the center axis 924 at the same position as the second circumference $C_{2B}$ of the second conical frustum surface 920. The second circumference $C_{2C}$ of the third conical frustum surface 922 is offset along the center axis 924 by the third height, $H_3$. In some such embodiments, the second conical frustum surface may be considered interposed along the center axis between the first and third conical frustum surfaces.

In some embodiments, the inner radius $R_{1A}$ of the first conical frustum surface 918 may be between about 0.20 inches and 0.045 inches, including 0.3 inches, and the outer radius $R_{2A}$ of the first conical frustum surface 918 may be between about 1.25 inches and 3.0 inches, including 1.5 inches; the inner radius $R_{1B}$ of the second conical frustum surface 920 may be between about 2.00 inches and 3.75 inches, including 3.0 inches, and the outer radius $R_{2B}$ of the second conical frustum surface 920 may be between about 2.5 inches and 4.25 inches, including 3.5 inches; and the inner radius $R_{1C}$ of the third conical frustum surface 922 may be between about 4.25 inches and 5.75 inches, including about 5.00 inches, and the outer radius $R_{2C}$ of the third conical frustum surface 922 may be between about 4.75 inches and 6.25 inches, including 5.75 inches. In some embodiments, the length $L_1$ of the first conical frustum surface 918 may be between about 1.15 inches and 2.5 inches, including about 1.5 inches, the length $L_2$ of the second conical frustum surface 920 may between 0.25 inches and 1.5 inches, including 0.5 inches, and the length $L_3$ of the third conical frustum surface 922 may be between about 0.25 inches and 1.75 inches, including 0.75 inches. In some embodiments, the first angle $\theta_1$ of the first conical frustum surface 918 may between about 50° and 95°, the second angle $\theta_2$ of the second conical frustum surface 920 may be between about 45° and 85°, and the third angle $\theta_3$ of the third conical frustum surface 922 may be between 65° and 89°. In some embodiments, the first height $H_1$ of the first conical frustum surface 918 may be between about 0.1 inches and 0.5 inches, including 0.17 inches, the second height $H_2$ of the second conical frustum surface 920 may be between about 0.1 inches and 0.3 inches, and the third height $H_3$ of the third conical frustum surface 922 may be between about 0.005 inches and 0.25 inches, including 0.04 inches. The present inventors have determined that these dimensions may, in some embodiments, improve flow uniformity within the showerhead and out of the faceplate while advantageously reducing the plenum volume of the showerhead.

Figure 13A:
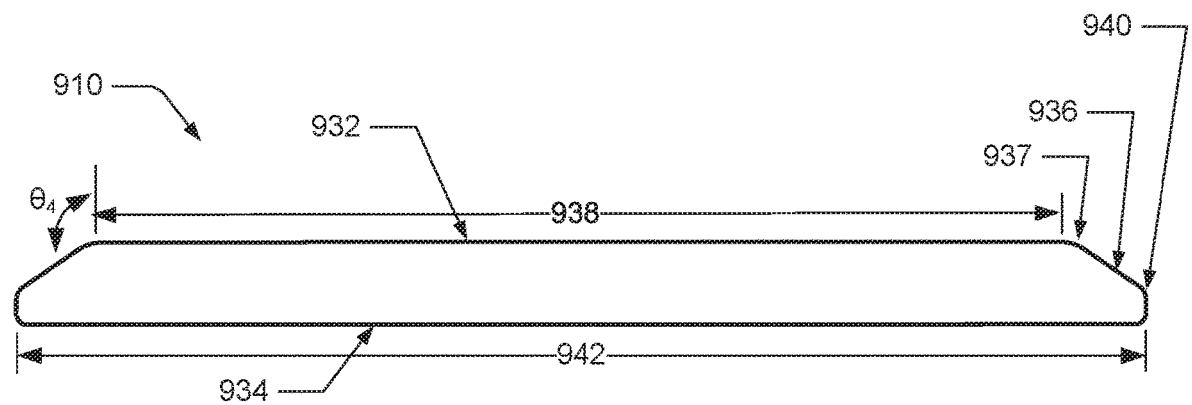
FIG. 13A depicts a side view of a baffle plate.
Figure 13B:
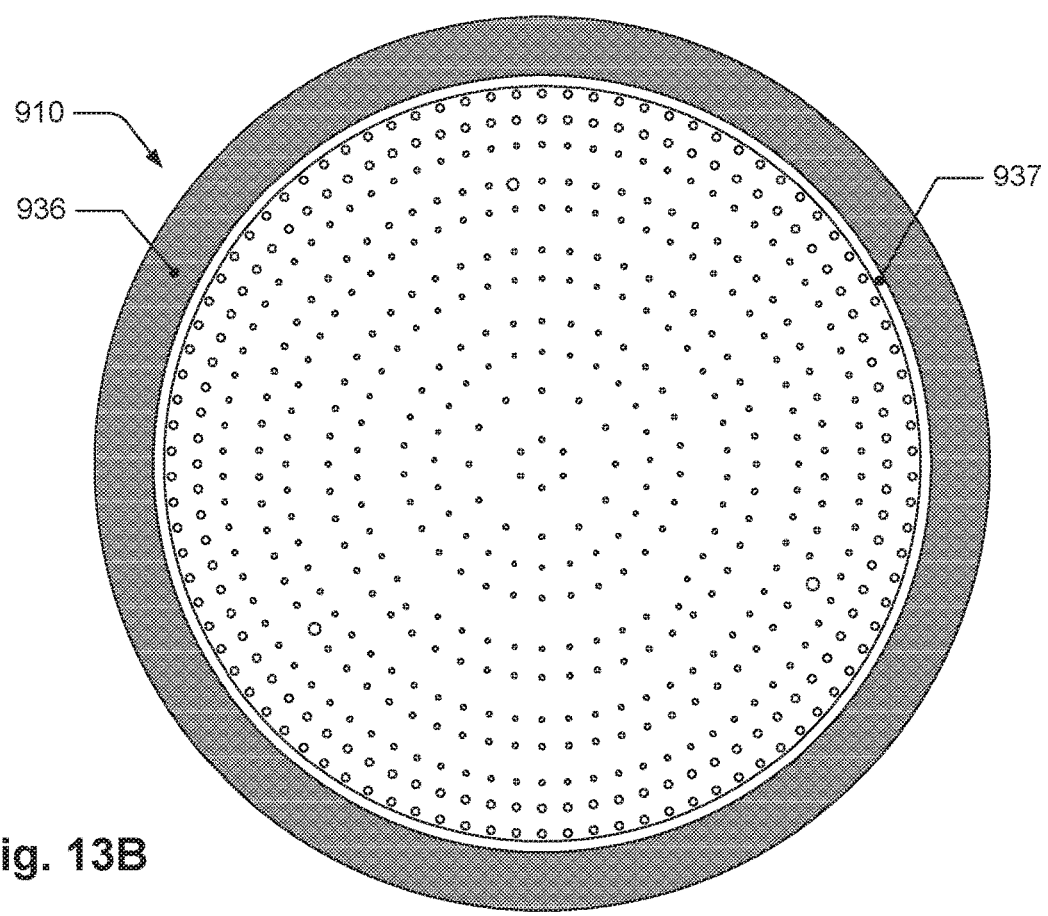
FIG. 13B depicts a top view of the baffle plate.

Aspects of the baffle plate will now be discussed. Referring back to FIG. 10, the baffle plate 910 is positioned within the plenum volume 908 of the showerhead 900. The baffle plate includes a top surface that faces the gas inlet 904 of the back plate 902, a bottom surface that faces the faceplate 906, and baffle plate through-holes that extend through the baffle plate 910 from the top surface to the bottom surface. The baffle plate 910 is positioned within the plenum volume 908 to direct the gas outwardly throughout the plenum volume 908 and downwards through the baffle plate 910 towards the faceplate 906. FIG. 13A depicts a side view of the baffle plate and FIG. 13B depicts a top view of the baffle plate. In FIG. 13A, the top surface 932 and bottom surface 934 of the baffle plate 910 are identified. In some embodiments, the top and bottom surfaces of the baffle plate may be planar and parallel to each other, including substantially parallel to each other given manufacturing and other tolerances. The baffle plate 910 may also be centered on the gas inlet 904 to provide for uniform gas flow within the showerhead.

In some embodiments, such as shown in FIG. 13A, the baffle plate 910 may have a conical frustum surface 936 around an outer region of the baffle plate. The conical frustum surface 936 may face the back plate 906, may have an angular component parallel to the center axis, and in some instances, may face the second conical frustum surface 920 of the back plate 908. The first circumference of this conical frustum surface 936 may be defined by an outer diameter 938 of the top surface 932. In some instances, the second circumference of the conical frustum surface 936 may intersect with another surface, such as a curved surface 940 that may form the outer diameter 942 of the baffle plate 910. Similarly, there may be a curved surface between the top surface 932 and the conical frustum surface 936 identified as 937 in FIGS. 13A and 13B. In some embodiments, the outer diameter 942 may be between about 140 mm and 200 mm. These surfaces and configurations enable uniform fluid flow around the periphery of the baffle plate which may reduce shear forces on the baffle plate and therefore reduce particulate generation.

Figure 14:
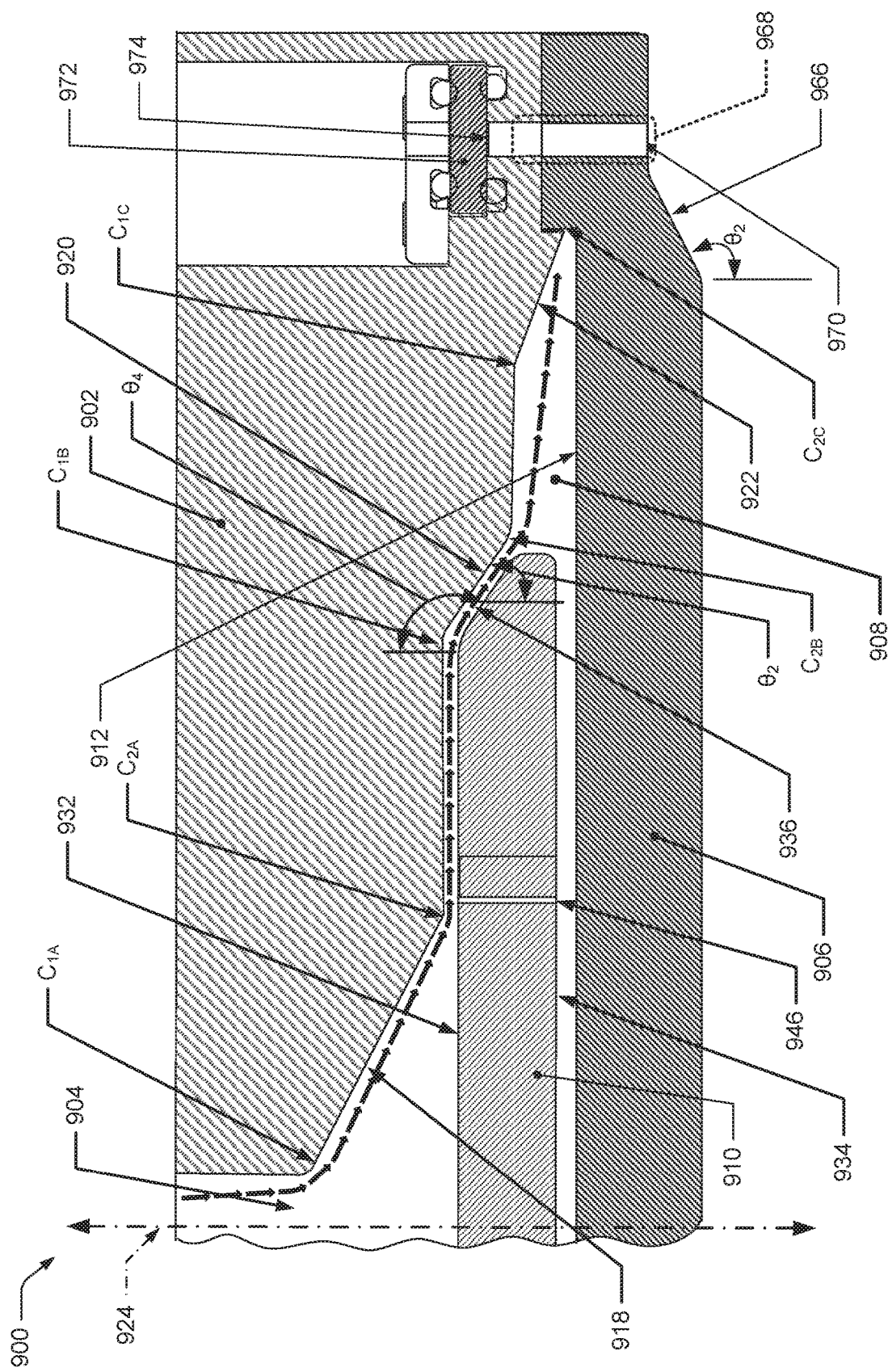
FIG. 14 depicts a magnified portion of the right half of the cross-sectional view of the showerhead of FIG. 10.

In some embodiments, the angle $\theta_4$ of the conical frustum surface 936 of the baffle plate, as measured from an axis parallel to the center axis of the baffle plate 910, may be complimentary to the angle of the second conical frustum surface 920 of the back plate 902. This may result in the second conical frustum surface 920 of the back plate 902 and the conical frustum surface of the baffle plate being parallel to each other. FIG. 14 depicts a magnified portion of the right half of the cross-sectional view of the showerhead of FIG. 10. The baffle plate 910 is positioned inside the plenum volume 908; the conical frustum surface 936 of the baffle plate, its angle $\theta_4$ from an axis center axis 924, the second conical frustum surface 920 of the back plate 902 and the second angle $\theta_2$ are identified. These surfaces and angles are configured such that angle $\theta_4$ and the second angle $\theta_2$ are complimentary to each other and total 180°. In some embodiments, give manufacturing inaccuracies and tolerances, these angles may not be exactly complimentary, but may instead be very close and substantially complimentary, such as within +/−5° of 180°. In some embodiments, the angle $\theta_4$ may be about 110° and the second angle $\theta_2$ may be about 70°. Referring back to the top view of the baffle plate in FIG. 13B, the conical frustum surface 936, highlighted with shading, is seen extending around all of the baffle plate 910.

The through-holes of the baffle plate may be configured to enable, at least in part, uniform flow throughout the plenum volume, including across the baffle plate and through the baffle plate. In some implementations, the number of through-holes in the baffle plate 910 may influence the uniformity of flow across and through the baffle plate 910. Generally, gas flows along a path of least resistance, so if the baffle plate 910 through-holes, for instance, cause a low pressure drop, then the flow of gas may jet through the through-holes in the center region of the baffle plate 910 and the through-holes in the center region of the faceplate; a higher pressure drop, however, would push the flow of gas more outwardly towards the edges of the baffle plate 910 and edge of the faceplate. These potential outcomes may result in non-uniform flow out of the faceplate which may result in increased nonuniformity on the substrate. To facilitate a higher pressure drop, the number of through-holes in the baffle plate 910, the diameter of the through-holes, or both, may be decreased to accompany a reduced internal volume from a conventional showerhead. Otherwise, if there is an excess number of through-holes in the baffle plate 910, if the through-hole diameters are too large, or both, then the pressure drop may be too low and flux would be not be uniform across the baffle plate 910 from center to the edge. Accordingly, the number of through-holes in the baffle plate and their diameters are configured to provide for uniform flow through and across the baffle plate. In FIG. 14, example flow vectors are shown as black arrows which illustrate the gas flow from the gas inlet 904, across some of the baffle plate 910, and towards the edge of the faceplate 906, as well as through the baffle plate through-hole 946.

Referring back to FIG. 13B, the plurality of baffle plate through-holes that extend through the baffle plate 910 from the top surface to the bottom surface are seen. In some embodiments, such as depicted in FIG. 13B, some through-holes may have outer diameters that are different than the outer diameter of the other through-holes. In some such instances, the outer diameters of the through-holes may increase in size as their radial distance from the center of the baffle plate increases. For example, a first section of the baffle plate may have a first number of through-holes that each have a first outer diameter, and a second section that is radially offset outwards from the first section with respect to the baffle plate center axis may have a second number of through-holes that each have a second outer diameter larger than the first outer diameter.

Figure 13C:
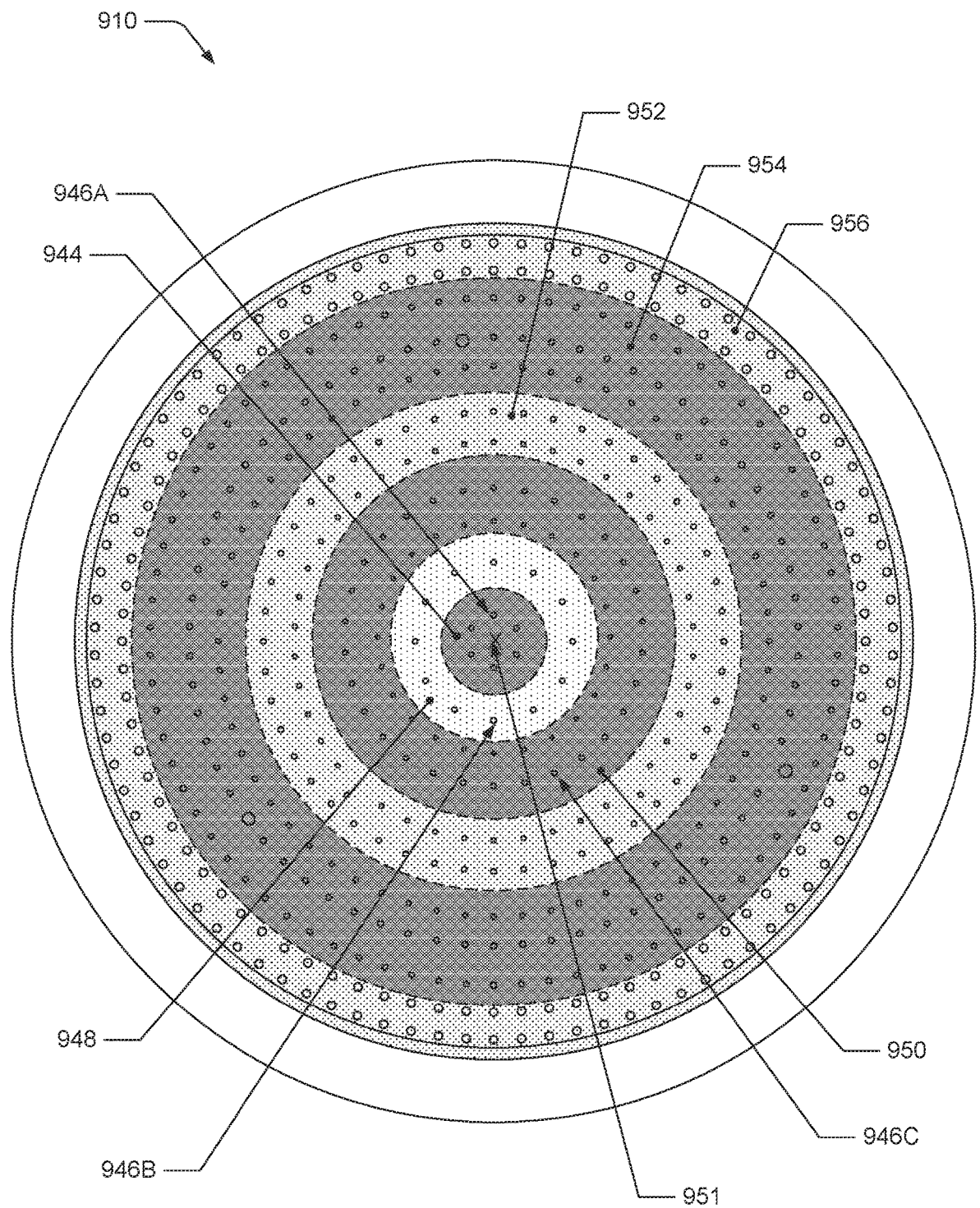
FIG. 13C depicts an enlarged view of FIG. 13B.

FIG. 13C depicts an enlarged view of FIG. 13B. Here, various sections of the baffle plate 910 are shaded and the center axis 951 of the baffle plate is depicted as an "X"; as stated above, the center axis 951 of the baffle plate may be collinear with the center axis 924 of the showerhead. A first section 944 of the baffle plate, shown with dark shading, is positioned closest to and encompasses the center axis 951 of the baffle; a first number of through-holes 946A are within this section and they all have a first outer diameter. These through-holes 946A are also arranged in a ring that extends around the center axis 951 of the baffle plate. A second section 948, shown with light shading, is radially offset outwards from the first section 944, with respect to the center axis 951, and adjacent to the first section; this second section 948 is farther from the center axis 951 than the first section 944. The second section 948 includes a second number of through-holes 946B and they have a second outer diameter that is greater than the first diameter of the first number through-holes 946A in the first section 944. A third section 950, shown with dark shading, is radially offset outwards from both the first section 944 and the second section 948 and adjacent to the second section 948; this third section 950 is farther from the center axis 951 than the first and second sections. The third section 950 includes a third number of through-holes 946C and they have a third outer diameter that is greater than both the first diameter of the first number of through-holes 946A in the first section 944 and the second diameter of the second number of through-holes 946B in the second section 946. The third number of through-holes 946C are also arranged along three rings around the center axis 951; the first and second sections have two rings of holes.

Three additional sections of the baffle plate are also highlighted with shading. The fourth section 952 is positioned radially outwards from the third section 950, includes a fourth number of through-holes (not labeled) that have a fourth outer diameter larger than the third outer diameter; this section also includes three rings of through-holes. Similarly, the fifth section 954 is positioned radially outwards from the fourth section 952, includes a fifth number of through-holes (not labeled) that have a fifth outer diameter larger than the fourth outer diameter; this section also includes three rings of through-holes. The sixth section 956 includes a sixth number of through-holes (not labeled) that have a sixth outer diameter larger than the fifth outer diameter; this section includes two rings of through-holes. In some embodiments, the first diameter may be between about 0.30 mm and 0.65 mm, the second diameter may be between about 0.50 mm and 0.75 mm, the third diameter may be between about 0.60 mm and 0.9 mm, the fourth diameter may be between about 0.7 mm and 1.1 mm, the fifth diameter may be between 0.8 mm and 1.25 mm, and the sixth diameter may be between about 0.9 mm and 1.4 mm. The configuration of the baffle plate provides for uniform flow through the plenum volume, including through, across, and around the baffle plate.

The baffle plate is also positioned within the plenum volume in order to provide for faster and more uniform fluid flow through the showerhead. In some embodiments, this includes positioning the center axis of the baffle plate so that it is collinear with the center axis of the gas inlet of the back plate. This may also include positioning the baffle plate along the center axis such that the baffle plate is farther away from the gas inlet along the center axis than the first conical frustum surface. This may also include positing the baffle plate such that the top surface of the baffle plate is farther along the center axis from the gas inlet than the first circumference of the second conical frustum surface; this may further include positioning the baffle plate top surface along the center axis between the first and second circumferences of the second conical frustum surface. In some instances, the bottom surface of the baffle plate may be positioned along the center axis farther from the gas inlet than the first circumference of the third conical frustum surface. The bottom surface of the baffle plate may also be offset along the center axis from the faceplate.

Referring back to FIG. 14, the baffle plate is positioned within the plenum volume such that the baffle plate 910 is farther away from the gas inlet 904 along the center axis 924 than the first conical frustum surface 918, the top surface 932 of the baffle plate 910 is farther along the center axis 924 from the gas inlet 904 than the first circumference $C_{1B}$ of the second conical frustum surface 920, the top surface 932 is also positioned along the center axis 924 between the first and second circumferences, $C_{1B}$ and $C_{2B}$, of the second conical frustum surface 920, and the bottom surface 934 of the baffle plate 910 is positioned along the center axis 924 farther from the gas inlet 904 than the first circumference $C_{1C}$ of the third conical frustum surface 922. As also seen in FIG. 14, the second circumference $C_{2C}$ of the third conical frustum surface 922 is offset along the center axis from the back surface 912 of the faceplate 906. This positioning of the baffle plate within the plenum volume enables uniform, quick, and efficient fluid flow through the showerhead while reducing the volume of the showerhead, which reduces fluid consumption, and reducing particle contamination. As discussed herein, the positioning and configuration of the baffle plate causes gas flow to be directed not only through the baffle plate through-holes, but also outwardly throughout the plenum volume towards the edges of the faceplate. By directing the flow of gas through the through-holes and outwardly throughout the plenum volume, a more spatially uniform flow of gas can be obtained despite lowering the overall internal volume of the showerhead compared to traditional showerheads.

As stated above, the faceplate also includes a plurality of through-holes that extend through the faceplate and enable gas to flow from the plenum volume to outside the showerhead and onto a substrate. Similar to described above with the baffle plate through-holes, the number of through-holes in the faceplate 906 may also influence the uniformity of flow across the faceplate 906. Here, to facilitate a higher pressure drop, a number of through-holes in the faceplate 906 may be decreased to accompany a reduced internal volume from a conventional showerhead. If there is an excess number of through-holes in the faceplate 906, then the pressure drop may be too low and flux may not be uniform across the faceplate 906 from center to the edge. In some implementations, the number of through-holes in the faceplate 906 may be between about 1000 through-holes and about 3,000 through-holes, or between about 2,500 and about 2,750 through-holes.

Figure 15A:
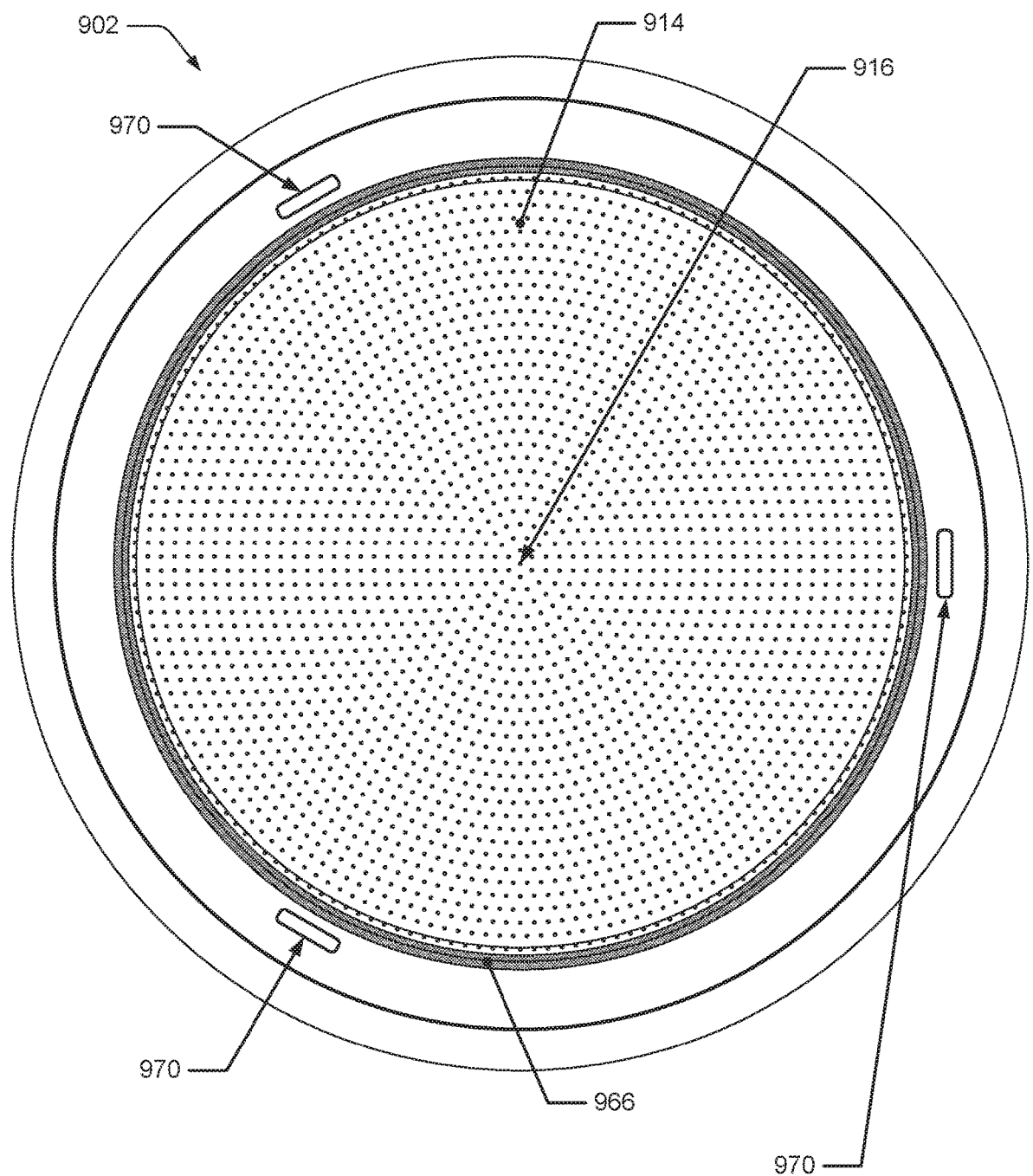
FIG. 15A depicts a plan view of the faceplate.

In some embodiments, these through-holes may all have the same outer diameter, such as between about 0.015 inches and 0.1 inches. These faceplate through-holes may also be arranged throughout the faceplate in order to create uniform flow out of the faceplate. FIG. 15A depicts a plan view of the faceplate with the front surface (the surface configured to face a substrate) and the through-holes visible. As can be seen, the faceplate 906 through-holes 916 extend through the faceplate and the front surface 914. These through-holes are also arranged along multiple circles that are centered around the center axis of the faceplate, and offsetting the holes from each other. For example, the faceplate may have a through-hole that is centered on the center axis of the faceplate, which is the through-hole 916 identified in FIG. 11A. Immediately adjacent to this center through-hole may be a plurality of holes arranged equally spaced along a first circle with a first diameter; immediately radially outwards from this circle may be another circle with a second plurality of holes having more holes than the plurality of holes, and this second plurality of holes may be equally spaced along this second circle. This equal spacing may not always be exact and may be considered substantially equally spaced, which may be due to manufacturing or other inconsistencies, such that the spacing may be within about +/−5% of equal.

FIG. 15B depicts a partial magnified section of the middle of the faceplate of FIG. 15A. The center through-hole 916 is identified and multiple other through-holes are seen. The center through hole may be centered on the center axis of the faceplate. A first referential circle 958 is seen extending around the center through-hole 916 and six holes are equally spaced along this first referential circle. Two through-holes are centered on a datum 961. A second referential circle 960 is radially offset from and extends around the first referential circle 958; 12 through-holes are equally spaced around this second referential circle 960, but these through-holes are offset from the datum 961 by a first angle, such as 15°. A third referential circle 962 is radially offset from and extends around the second referential circle 960; 18 through-holes are equally spaced around this third referential circle 962, and these through-holes are not offset from the datum 961. A fourth referential circle 964 is radially offset from and extends around the third referential circle 962; 24 through-holes are equally spaced around this fourth referential circle 964, but these through-holes are offset from the datum 961 by a second angle, such as 7.5°. This spacing may continue as set forth in the table shown in FIG. 15C, which depicts specifications for the faceplate through-holes, such that the faceplate 906 includes a total of 2,610 through-holes that are each about 0.04 in, +/−0.001 in, in diameter. In some embodiments, the through-holes may be between about 0.03 and 0.05 inches in diameter, including 0.04 inches. The angles provided may also not be exact, the may be within, for example, +/−1° or 0.5° due to variability and manufacturing inaccuracies.

The exterior of the faceplate may also be configured to be positioned closer to a substrate positioned on a pedestal than traditional showerheads; this in turn may assist in reducing fluid consumption and improving uniformity. As stated above, some substrate supports, such as pedestals and electrostatic chucks (ESCs), may position the substrate within a cavity that is partially defined by a substrate support surface (on which the substrate is positioned) and an outer wall that is above the substrate support surface. Many showerheads are designed to stay above and out of the cavity of the substrate support. The external geometry of the faceplate disclosed herein may enable a portion of it to be positioned within this pedestal cavity and therefore reduce the pedestal-showerhead gap.

Figure 16A:
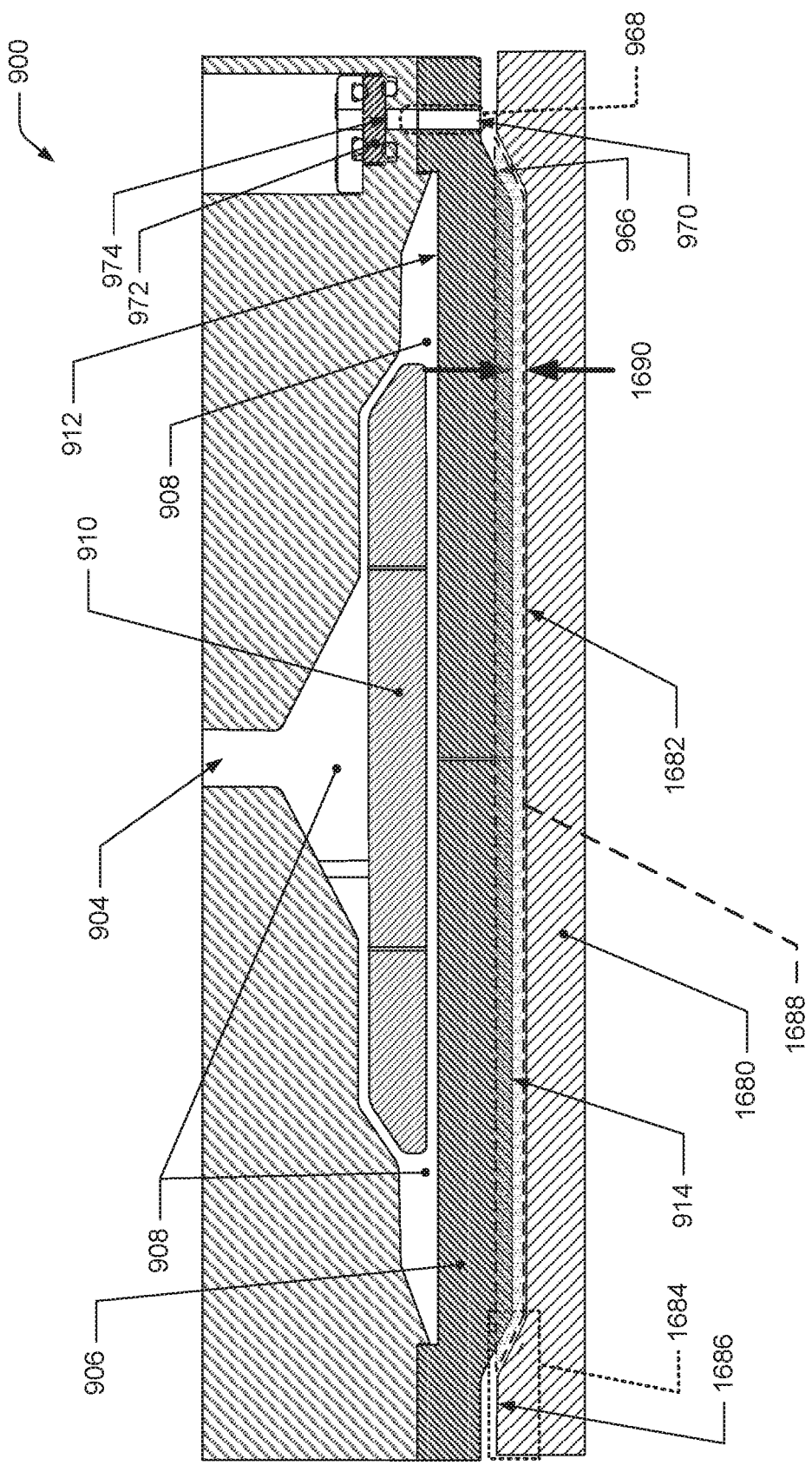
FIG. 16A depicts a cross-sectional side view of the showerhead and an example pedestal.

FIG. 16A depicts a cross-sectional side view of the showerhead and an example pedestal. The example pedestal 1680 includes a substrate support surface 1682 configured to hold and support a substrate, an outer wall 1684 (encompassed by a dotted shape) having a wall top surface 1686, and a cavity 1688 (shown with shading and dashed lines) at least partially defined by the substrate support surface 1682 and the outer wall 1684. The front surface 914 of the faceplate 906 faces the pedestal 1680 and the pedestal-showerhead gap 1690 is shown as measured between the front surface 914 of the faceplate 906 and the substrate support surface 1682. The front surface 914 of the faceplate 906, and part of the faceplate 906, is also seen positioned within the cavity 1688 of the pedestal such that the front surface 914 is closer to the substrate support surface 1682, i.e., the pedestal-showerhead gap 1690 is smaller, than the distance between the wall top surface 1686 and the substrate support surface 1682.

Figure 16B:
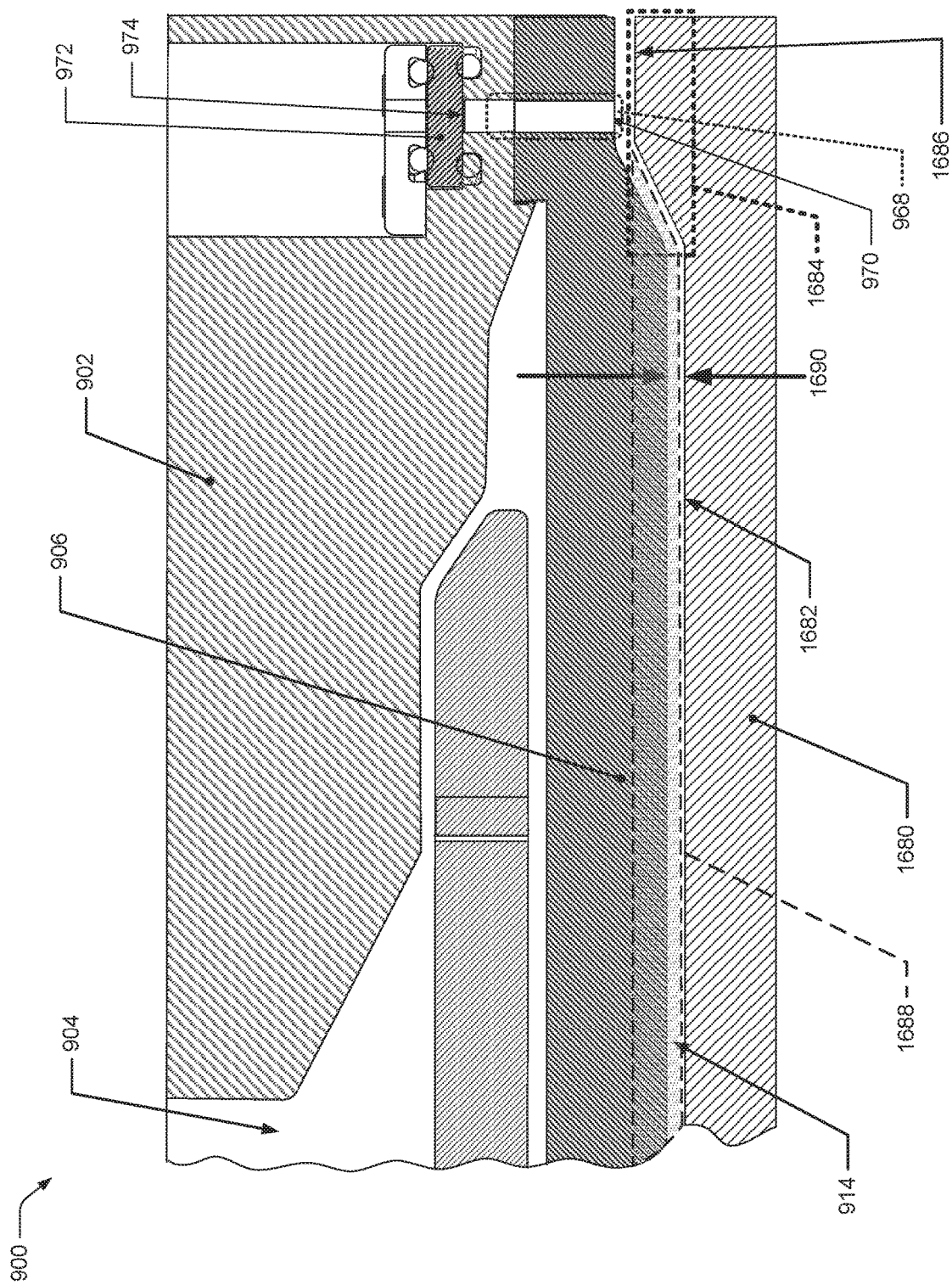
FIG. 16B depicts a magnified portion of FIG. 16A.

FIG. 16B depicts a magnified portion of FIG. 16A which is similar to FIG. 14 except that FIG. 16B includes a portion of the pedestal 1680. Here, the spacing between the showerhead 900 and the pedestal 1680 is illustrated. Again, the front surface 914 of the faceplate 906 faces the pedestal 1680 and the pedestal-showerhead gap 1690 and the front surface 914 of the faceplate 906 is able to be positioned closer to the substrate support surface 1682 than the distance between the wall top surface 1686 and the substrate support surface 1682. The faceplate 906 is further able to be positioned within the cavity 1688 of the pedestal 1680.

In some embodiments, the outer diameter of the faceplate 906 front surface 914 may be sized smaller than an inner diameter of the pedestal wall such that the faceplate can fit within the substrate support cavity. Additionally, the faceplate may have a conical frustum surface extending around the center axis of the showerhead which further enables the front surface of the faceplate to be positioned closer to the pedestal. In FIGS. 11A, 14, and 16, the faceplate conical frustum surface 966 is identified. In FIG. 15, the faceplate conical frustum surface 966 is also shown with shading; this surface 966 extends around the entirety of the faceplate 906 and is radially offset outwards from the front surface 914 with respect to the center axis 924. In some embodiments, this conical frustum surface may have a length of between about 0.05 inches and 0.4 inches, a height of between about 0.02 inches to 1.0 inches, and an angle that is greater than about 90° from the center axis 924, including between about 95° and 150°.

Some elements of the showerhead may be made of a metal or metal alloy. For instance, the back plate, baffle plate, and faceplate may all be comprised of a metal or metal alloy, such as an aluminum, aluminum 6061, quartz, and stainless steel. The material may be compatible with remote cleans and may be material that passivates or does not readily react with ammonia/fluorine radicals.

The showerhead may also have one or more ports that extend through portions of the showerhead to enable a sensor to obtain data from outside the showerhead. Each port may have an opening in the faceplate of the showerhead that is configured to face a substrate support. In some embodiments, a window may be positioned at an end or along the port to protect a sensor from an environment outside the showerhead while still enabling the sensor to gather data through the port. Referring to FIGS. 10 and 11A, the showerhead includes a port 968 (encircled by a dashed shape) that extends through the faceplate 906 and through the back plate 902, and has an opening 970 in the faceplate 902; a window 972 is also positioned at a back end 974 of the port 968; these features are also identified in the magnified portion of FIG. 14. The showerhead may also include two or more ports, such as three, as seen in FIG. 15A which identifies the openings 970 of each port 968 in the faceplate 906. The ports may be positioned radially outwards from the faceplate front surface 914 as seen in FIGS. 10, 11A, 14, and 15. The ports may be equally spaced along a circumference of the faceplate. In some instances, this equal spacing may not always be exact and may be considered substantially equally spaced, which may be due to manufacturing or other inconsistencies, such that the spacing may be within about +/−5% of equal. The window is also seen in these Figures and it may be made of a material that is able to withstand exposure to various processing gases, such as a sapphire and a quartz.

The showerhead may include various sensors that are positioned adjacent to the windows and that are configured to obtain data from outside the opening of the port in the showerhead. In some embodiments, the showerhead may include three lasers, each laser positioned adjacent to a port, so that the laser can emit laser light through the window, port, and opening. These lasers may be configured to detect the distance of the substrate support away from showerhead and these distance measurements may be used for various advantageous adjustments. For example, the distance measurements from the lasers may be able to more accurately and precisely detect the pedestal-showerhead gap so that this gap can be reduced which in turn can improve uniformity and reduce gas consumption. Traditional pedestal and showerhead configurations are unable to accurately measure the pedestal-showerhead gap to the degree that may be obtained using laser measurements. Additionally, these lasers enable measurements during processing when the pedestal and showerheads are at high heat (e.g., 450° C.) in a vacuum which may cause these elements to warp. Accurately and precisely measuring the pedestal-showerhead gap to obtain the in-situ distances and conditions enables the showerhead and pedestal to be positioned and adjusted to the correct, desired distances and positions.

In some instances, these measurements also assist in the determination of whether the showerhead is parallel with the pedestal. This may be considered parallelism between the showerhead and pedestal. The parallelism may be measured between the pedestal outer wall or pedestal substrate support surface, and the front surface of the showerhead. Deviations in the parallelism between the pedestal and showerhead may have a large percentage effect on the gas flow onto a wafer, including the gas consumption and wafer uniformity. The smaller the pedestal-showerhead gap becomes, which is enabled by this showerhead, the larger percentage effect of parallelism may have on the gas flows onto the wafer.

In some embodiments, a pedestal or ESC may be adjustable in various directions, including the vertical z-direction, which is parallel to the center axis of the showerhead, as well as an within an x-y plane perpendicular to the z-direction, and one or more tilt directions about one or more axes or points. When a substrate support is at high operating temperatures, such as 450° C., the substrate support may warp and cause it to become misaligned from the showerhead, including the center axes becoming non-parallel, offset, and non-collinear. The measurements by the sensors on the showerhead may be used to determine the position of the substrate support with respect to the showerhead and to determine adjustments for the substrate support so that the showerhead and pedestal can be more aligned. This may include, for instance, measuring the substrate support, determining a plane of the substrate support, and determining whether the plane of the substrate is within a particular threshold of alignment with the showerhead, and causing the showerhead to move, rotate, or both in one or more directions. For example, if the three measurements of the distance between the substrate support and the showerhead are not equal or within a particular threshold from each other, then it may be determined that the substrate support is not parallel with the showerhead. These measurements may be used to determine how the substrate support should move to become more aligned, such as rotating the substrate support about an axis which may cause the substrate support to be more parallel with the showerhead, e.g., the distances at the three points becoming more equal to each other.

The controller described herein may contain instructions for controlling the substrate support to perform such movements, the sensors, and making the determinations described herein above.

The showerhead described herein may provide one or more advantages. The configuration of the plenum volume's surfaces (e.g., the conical frustum surfaces), the baffle plate, and the baffle plate's positioning within the plenum volume reduce the plenum volume of the showerhead, which reduces the amount of fluid consumption to flow through the showerhead and onto a substrate during precursor dosing, as well as purging. This reduced volume also decreases the time to flow through the showerhead which decreases the purge time and may also decrease the dose (and if performed, plasma activation times); these decreased times increase throughput. The present inventors discovered that in some experiments using the same process recipe (gases, flowrates, times, etc.), using a conventional showerhead resulted in the use of 10 L of precursor per substrate to produce a film having a thickness while using the showerhead described herein resulted in the use of 6.5 L of precursor per substrate to produce the film with the same thickness.

The configuration of the showerhead described herein also improves the flow uniformity which in turn improves fill performance and film uniformity. One measure of deposition performance is a fill void of the deposited film, with lower fill voids indicating better fill and deposition. Using the showerhead described herein improves the fill void of deposited films as compared to conventional showerheads. As seen below in Table 1, the present inventors preformed four experiments in which the same gas recipe was flowed for a particular time through a showerhead as disclosed herein and a traditional showerhead. As can be seen, using the disclosed showerhead resulted in a lower fill void, and thus better deposition performance, than a traditional showerhead for the same process recipe.

TABLE 1

| | Center Fill Void | |
|---|---|---|
| Recipe | Disclosed Showerhead | Traditional Showerhead |
| Experiment 1 t1, gas1 | 5.3% | 6.1% |
| Experiment 2 t2, gas2 | 7.6% | 13.8% |
| Experiment 3 t1, gas3 | 2.7% | 8.4% |
| Experiment 4 t2, gas4 | 5.6% | 12.1% |

Figures 17A, 17B, 17C, 17D:
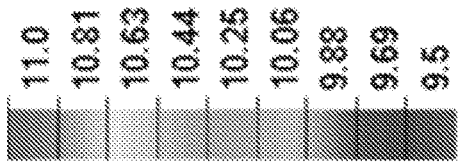
FIGS. 17A and 17B depict resistance nonuniformity measurements of two deposited films.
FIGS. 17C and 17D depict resistance nonuniformity measurements of two other deposited films.

Using the showerhead described herein also improves uniformity of the deposited films. One measurement indicator of uniformity is the resistance of the deposited film, Rs NU, which is the inverse of film uniformity. FIGS. 17A and 17B depict resistance nonuniformity measurements of two deposited films; these films were deposited using the same process recipe except that the measurements shown in FIG. 17A are for a conventional showerhead and the measurements shown in FIG. 17B are for a showerhead as disclosed herein. As can be seen from these two Figures, FIG. 17B shows that the disclosed showerhead resulted in a more uniform resistance throughout the film which indicates that it has a more uniform film. Similarly, FIGS. 17C and 17D depict resistance nonuniformity measurements of two other deposited films that were deposited using the same process recipe, but different from FIGS. 17A and 17B, except that the measurements shown in FIG. 17C are for the conventional showerhead and the measurements shown in FIG. 17D are for a showerhead as disclosed herein. Again, FIG. 17D shows that the disclosed showerhead resulted in a more uniform resistance, and thus more uniform film, throughout the film.

A low volume showerhead of the present disclosure may be installed in a semiconductor process chamber. A process chamber can include a low volume showerhead that is mounted to the top of a chamber housing. A substrate support may support a semiconductor substrate within the process chamber and beneath the low volume showerhead. A microvolume may be formed between the substrate support and the low volume showerhead. The microvolume may serve as a substrate reaction area and may help concentrate and retain process gases in the vicinity of the semiconductor substrate during processing. The substrate support may be configured to move up and down to facilitate loading and unloading operations. In some implementations, the low volume showerhead may be suspended from a lid of the process chamber by a stem and may not itself form part of the "lid" of the process chamber. In such implementations, the low volume showerhead may be configured to move up and down to facilitate substrate loading and unloading operations.

In some implementations, one or more process chambers may be provided as process stations in a multi-station semiconductor processing tool. An example of multi-station chamber is given above with respect to FIG. 6. In some implementations, a single process chamber may include multiple processing stations, some or all of which may have their own showerhead assemblies as described herein.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A showerhead comprising:
a faceplate partially defined by a front surface and a back surface, and having a plurality of faceplate through-holes extending through the faceplate from the front surface to the back surface;
a back plate having a gas inlet, a first conical frustum surface, and a second conical frustum surface;
a plenum volume fluidically connected to the gas inlet and at least partially defined by the gas inlet, the back surface of the faceplate, the first conical frustum surface, and the second conical frustum surface; and
a baffle plate positioned within the plenum volume, partially defined by a top surface and a bottom surface, and having a plurality of baffle plate through-holes extending through the baffle plate from the top surface to the bottom surface, wherein:
the second conical frustum surface is positioned radially outwards from the first conical frustum surface with respect to a center axis of the showerhead,
the second conical frustum surface is positioned along the center axis farther from the gas inlet than the first conical frustum surface,
the first conical frustum surface is at a first angle with respect to the center axis,
the second conical frustum surface is at a second angle with respect to the center axis.

2. The showerhead of claim 1, wherein an inner circumference of the second conical frustum surface is positioned radially outwards from an outer circumference of the first conical frustum surface with respect to the center axis.

3. The showerhead of claim 1, wherein the first angle is larger than the second angle.

4. The showerhead of claim 1, wherein the back plate further includes a third surface that spans between the first conical frustum surface and the second conical frustum surface.

5. The showerhead of claim 4, wherein the third surface includes a planar portion that is perpendicular to the center axis.

6. The showerhead of claim 1, wherein:
the back plate further includes a third conical frustum surface that is positioned radially outwards from the second conical frustum surface with respect to the center axis such that the second conical frustum surface is radially interposed between the first conical frustum surface and the third conical frustum surface, and
the third conical frustum surface is positioned at a third angle with respect to the center axis.

7. The showerhead of claim 6, wherein the third angle is greater than the first angle and the second angle.

8. The showerhead of claim 1, wherein an outer edge of the baffle plate is positioned radially outwards from the first conical frustum surface with respect to the center axis.

9. The showerhead of claim 8, wherein the outer edge of the baffle plate is positioned radially interposed, with respect to the center axis, between an inner circumference of the second conical frustum surface and an outer circumference of the second conical frustum surface.

10. The showerhead of claim 1, wherein the baffle plate is positioned along the center axis such that the first conical frustum surface is closer to the gas inlet than the baffle plate.

11. The showerhead of claim 10, wherein:
the top surface of the baffle plate faces the gas inlet and the bottom surface of the baffle plate faces the faceplate, and
the baffle plate is further positioned along the center axis such that the top surface of the baffle plate is interposed along the center axis between an inner circumference of the second conical frustum surface and an outer circumference of the second conical frustum surface.

12. The showerhead of claim 11, wherein the baffle plate is further positioned along the center axis such that the bottom surface of the baffle plate is farther from the gas inlet than the outer circumference of the second conical frustum surface.

13. The showerhead of claim 1, wherein the baffle plate further includes a baffle plate conical frustum surface that faces the back plate.

14. The showerhead of claim 13, wherein the baffle plate conical frustum surface is offset from the center axis by a fourth angle that is complimentary to the second angle.

15. The showerhead of claim 1, wherein the plurality of baffle plate through-holes have outer diameters that increase as the radial positioning increases with respect to the center axis.

16. The showerhead of claim 15, wherein:
a first number of baffle plate through-holes are positioned in a first section of the baffle plate and have a first outer diameter,
a second number of baffle plate through-holes are positioned in a second section of the baffle plate and have a second outer diameter that is greater than the first outer diameter, and
the second section is radially offset outwards from the first section with respect to the center axis.

17. The showerhead of claim 16, wherein:
a third number of baffle plate through-holes are positioned in a third section of the baffle plate and have a third outer diameter that is greater than the second outer diameter, and
the third section is radially offset outwards from the second section with respect to the center axis.

18. The showerhead of claim 1, wherein an inner circumference of first conical frustum surface partially defines the gas inlet.

19. The showerhead of claim 1, wherein the faceplate further includes a faceplate conical frustum surface that is positioned radially outwards with respect to the center axis from the front surface of the faceplate and is offset from the center axis by a fifth angle that is greater than 90°.

20. The showerhead of claim 1, further comprising:
a port that includes a first end and an opening at a second end, and that extends through the faceplate, wherein the opening is in the faceplate and radially outwards from front surface, and
a window positioned adjacent to the first end of the port.

* * * * *